United States Patent
Moon et al.

(10) Patent No.: US 9,923,747 B2
(45) Date of Patent: Mar. 20, 2018

(54) APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

(71) Applicant: LG Electronics Inc., Seoul (KR)

(72) Inventors: Sangchul Moon, Seoul (KR); Woosuk Ko, Seoul (KR); Sungryong Hong, Seoul (KR); Jinwoo Kim, Seoul (KR); Jongwoong Shin, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/498,248

(22) Filed: Apr. 26, 2017

(65) Prior Publication Data
US 2017/0353341 A1 Dec. 7, 2017

Related U.S. Application Data

(63) Continuation of application No. 14/908,433, filed as application No. PCT/KR2014/007125 on Aug. 1, 2014, now Pat. No. 9,680,680.
(Continued)

(51) Int. Cl.
*H04L 27/26* (2006.01)
*H04N 21/434* (2011.01)
(Continued)

(52) U.S. Cl.
CPC ..... *H04L 27/2627* (2013.01); *H03M 13/1165* (2013.01); *H04H 20/72* (2013.01);
(Continued)

(58) Field of Classification Search
CPC ... H03M 13/1165; H04H 20/72; H04H 60/73; H04L 1/0071; H04L 27/2605;
(Continued)

(56) References Cited

U.S. PATENT DOCUMENTS

2011/0280327 A1* 11/2011 Ko .................. H04L 1/0044
375/260
2011/0299381 A1 12/2011 Ge et al.
(Continued)

FOREIGN PATENT DOCUMENTS

| EP | 2541926 A2 | 2/2011 |
|---|---|---|
| EP | 2541920 A2 | 2/2013 |
| WO | 2011/104142 A1 | 9/2011 |

*Primary Examiner* — Freshteh N Aghdam
(74) *Attorney, Agent, or Firm* — Dentons US LLP

(57) ABSTRACT

The present invention provides a method of transmitting broadcast signals. The method includes, encoding Data Pipe, DP, data according to a code rate, wherein the encoding further includes Low-Density Parity-Check, LDPC, encoding the DP data, Bit interleaving the LDPC encoded DP data, and mapping the bit interleaved DP data onto constellations; building at least one signal frame by mapping the encoded DP data; and modulating data in the built signal frame by an Orthogonal Frequency Division Multiplexing, OFDM, method and transmitting the broadcast signals having the modulated data.

6 Claims, 46 Drawing Sheets

Related U.S. Application Data

(60) Provisional application No. 61/861,375, filed on Aug. 1, 2013, provisional application No. 61/861,382, filed on Aug. 1, 2013, provisional application No. 61/861,386, filed on Aug. 1, 2013, provisional application No. 61/861,389, filed on Aug. 1, 2013, provisional application No. 61/876,713, filed on Sep. 11, 2013, provisional application No. 61/881,418, filed on Sep. 23, 2013, provisional application No. 61/882,011, filed on Sep. 25, 2013, provisional application No. 61/882,014, filed on Sep. 25, 2013, provisional application No. 61/882,017, filed on Sep. 25, 2013, provisional application No. 61/883,957, filed on Sep. 27, 2013.

(51) Int. Cl.
| | |
|---|---|
| *H04N 21/236* | (2011.01) |
| *H04H 20/72* | (2008.01) |
| *H03M 13/11* | (2006.01) |
| *H04L 1/00* | (2006.01) |
| *H04N 21/2383* | (2011.01) |
| *H04H 60/73* | (2008.01) |

(52) U.S. Cl.
CPC .......... *H04L 1/0041* (2013.01); *H04L 1/0057* (2013.01); *H04L 1/0071* (2013.01); *H04L 27/2605* (2013.01); *H04L 27/2649* (2013.01); *H04N 21/2383* (2013.01); *H04N 21/23605* (2013.01); *H04N 21/4343* (2013.01); *H04H 60/73* (2013.01)

(58) Field of Classification Search
CPC ............ H04L 27/2627; H04L 27/2649; H04N 21/23605; H04N 21/2383; H04N 21/4343
See application file for complete search history.

(56) References Cited

U.S. PATENT DOCUMENTS

| | | |
|---|---|---|
| 2012/0324513 A1 | 12/2012 | Hwang et al. |
| 2012/0327879 A1 | 12/2012 | Stadelmeier et al. |
| 2013/0028336 A1 | 1/2013 | Limberg |
| 2014/0133592 A1* | 5/2014 | Ko ........................ H04L 1/0057 375/261 |
| 2015/0333770 A1* | 11/2015 | Ko ........................ H04L 1/0041 714/776 |
| 2016/0173181 A1* | 6/2016 | Moon ..................... H04N 7/08 375/267 |
| 2017/0026141 A1* | 1/2017 | Choi ..................... H04H 20/44 |

* cited by examiner

【Figure 1】
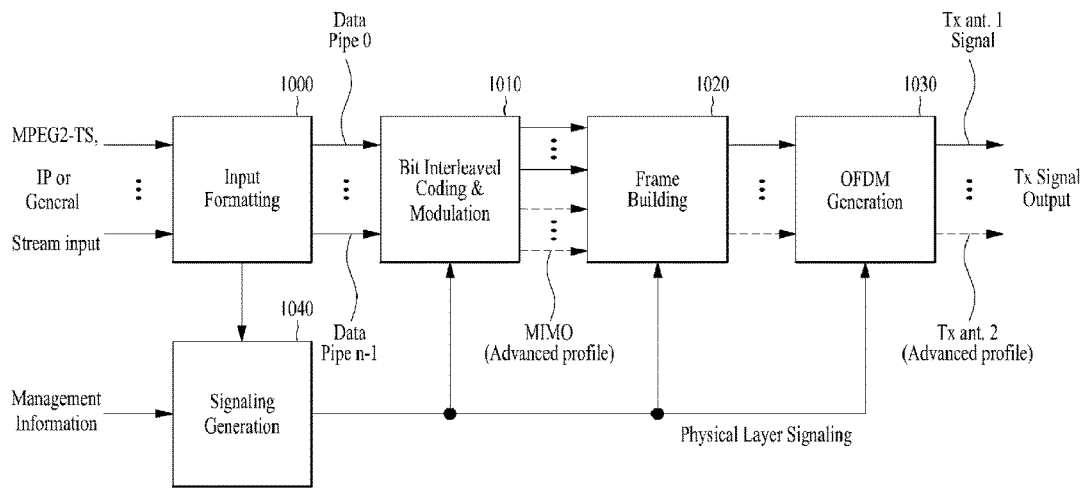
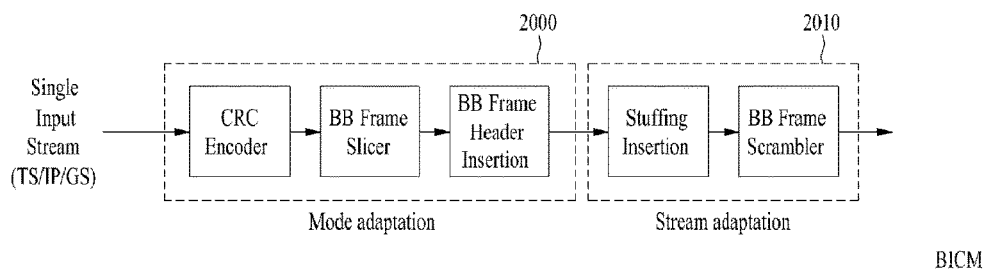
FIG. 2A
FIG. 2B
【Figure 3】
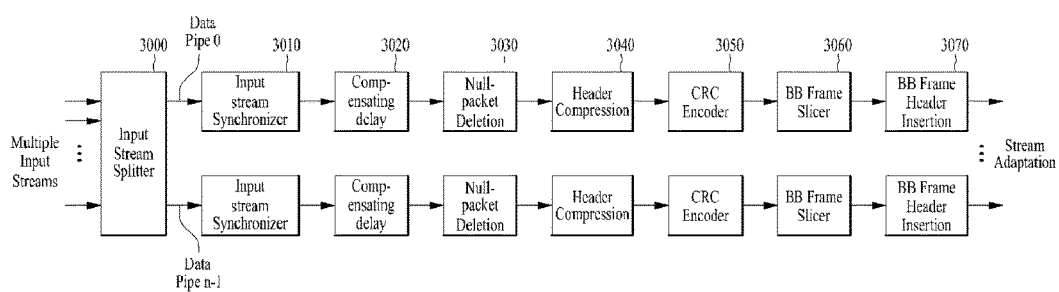

[Figure 4]
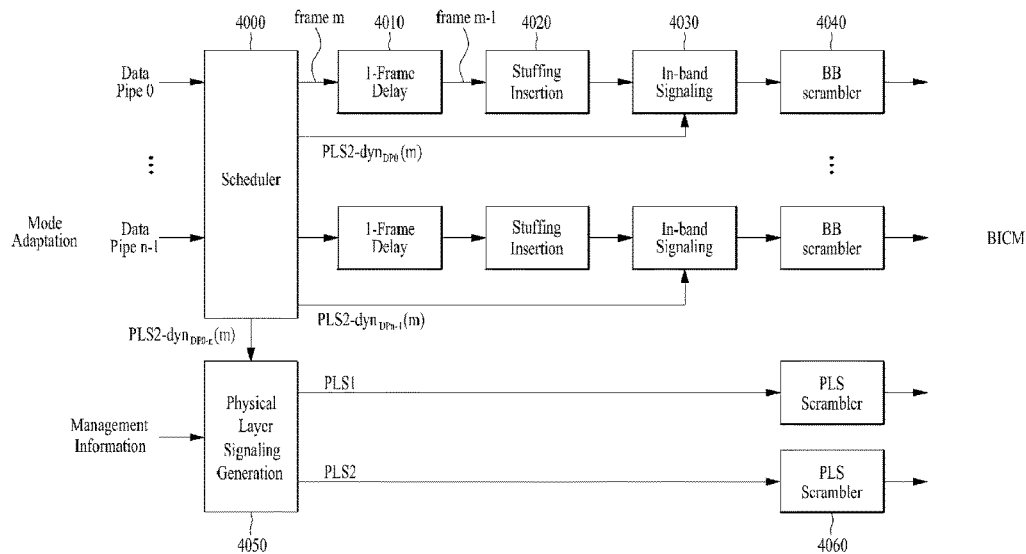
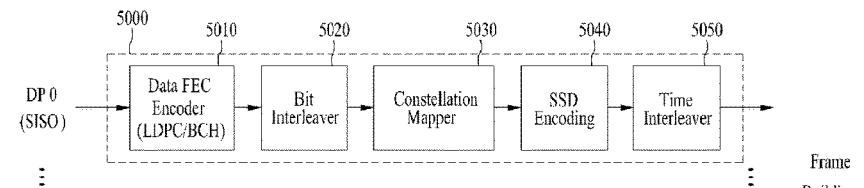
FIG. 5A
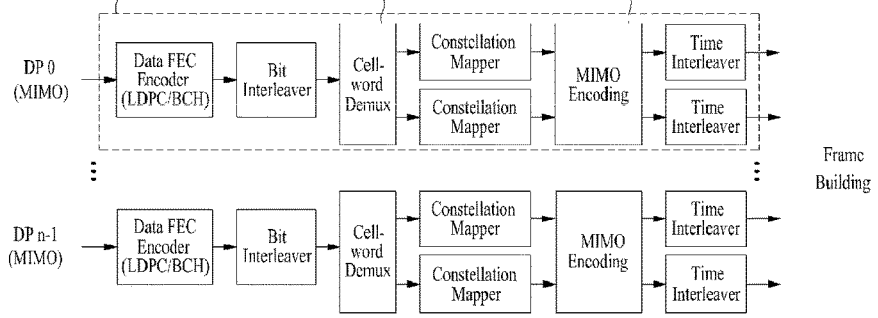
FIG. 5B

[Figure 6]
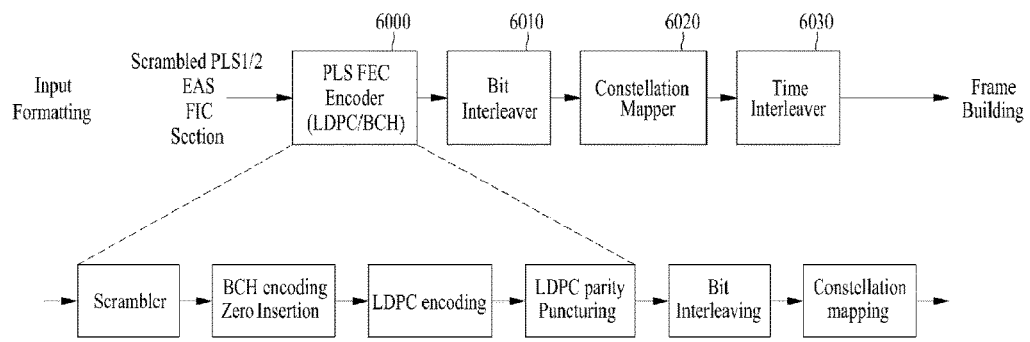
[Figure 7]
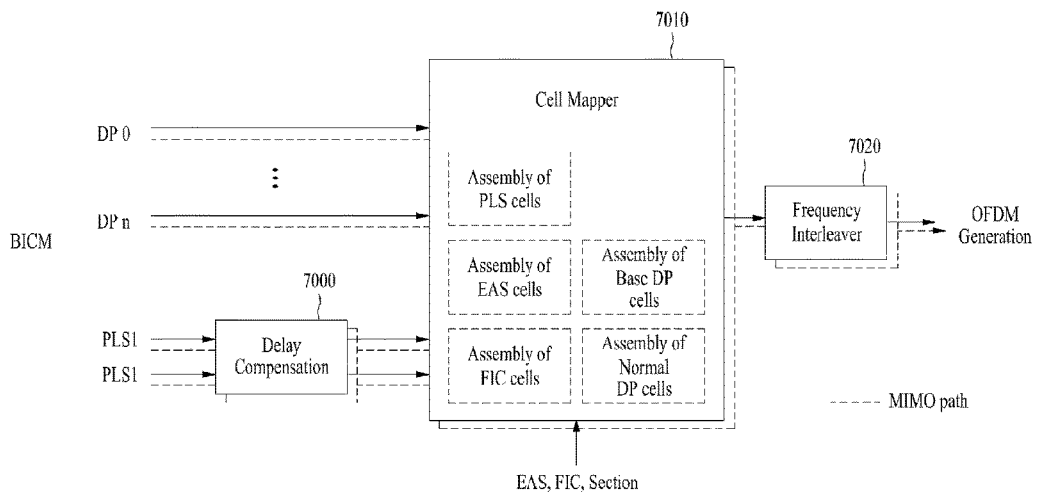
[Figure 8]
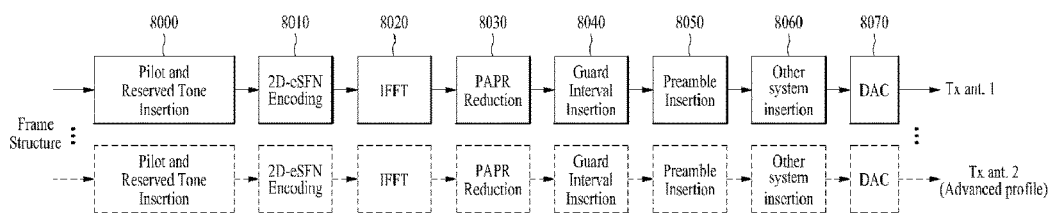

[Figure 9]
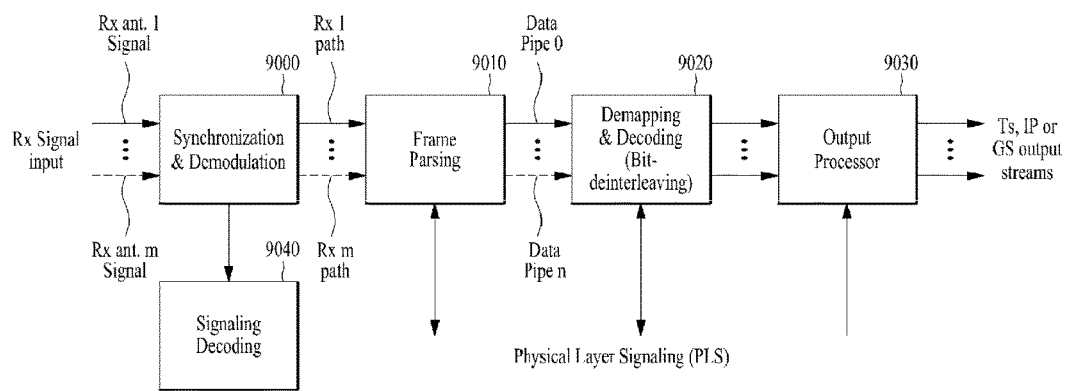

【Figure 11】
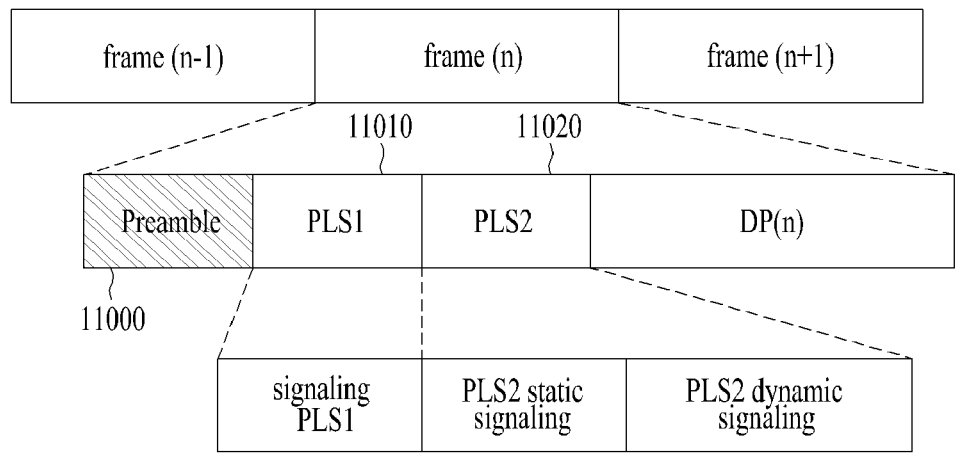
【Figure 12】
| Content | Bits |
|---|---|
| PHY_PROFILE | 3 |
| FFT_SIZE | 2 |
| GI_FRACTION | 3 |
| EAC_FLAG | 1 |
| PILOT_MODE | 1 |
| PAPR_FLAG | 1 |
| FRU_CONFIGURE | 3 |
| RESERVED | 7 |

[Figure 13]

| Content | Bits |
|---|---|
| PREAMBLE_DATA<br>NUM_FRAME_FRU<br>PAYLOAD_TYPE<br>NUM_FSS<br>SYSTEM_VERSION | 20<br>2<br>3<br>2<br>8 |
| CELL_ID<br>NETWORK_ID<br>SYSTEM_ID | 16<br>16<br>16 |
| for i = 0:3<br>    FRU_PHY_PROFILE<br>    FRU_FRAME_LENGTH<br>    FRU_GI_FRACTION<br>    RESERVED<br>end | <br>3<br>2<br>3<br>4 |
| PLS2_FEC_TYPE<br>PLS2_MOD<br>PLS2_SIZE_CELL<br>PLS2_STAT_SIZE_BIT<br>PLS2_SYN_SIZE_BIT<br>PLS2_REP_FLAG<br>PLS2_REP_SIZE_CELL<br>PLS2_NEXT_FEC_TYPE<br>PLS2_NEXT_MODE<br>PLS2_NEXT_REP_FLAG<br>PLS2_NEXT_REP_SIZE_CELL<br>PLS2_NEXT_REP_STAT_SIZE_BIT<br>PLS2_NEXT_REP_DYN_SIZE_BIT<br>PLS2_AP_MODE<br>PLS2_AP_SIZE_CELL<br>PLS2_NEXT_AP_MODE<br>PLS2_NEXT_AP_SIZE_CELL | 2<br>3<br>15<br>14<br>14<br>1<br>15<br>2<br>3<br>1<br>15<br>14<br>14<br>2<br>15<br>2<br>15 |
| RESERVED<br>CRC 32 | 32<br>32 |

[Figure 14]

| Content | Bits |
|---|---|
| FIC_FLAG | 1 |
| AUX_FLAG | 1 |
| NUM_DP | 6 |
| for i = 1 : NUM_DP | |
|     DP_ID | 6 |
|     DP_TYPE | 3 |
|     DP_GROUP_ID | 8 |
|     BASE_DP_ID | 6 |
|     DP_FEC_TYPE | 2 |
|     DP_COD | 4 |
|     DP_MOD | 4 |
|     DP_SSD_FLAG | 1 |
|     if PHY_PROFILE = '010' | |
|         DP_MIMO | 3 |
|     end | |
|     DP_TI_TYPE | 1 |
|     DP_TI_LENGTH | 2 |
|     DP_TI_BYPASS | 1 |
|     DP_FRAME_INTERVAL | 2 |
|     DP_FIRST_FRAME_IDX | 5 |
|     DP_NUM_BLOCK_MAX | 10 |
|     DP_PAYLOAD_TYPE | 2 |
|     DP_INBAND_MODE | 2 |
|     DP_PROTOCOL_TYPE | 2 |
|     DP_CRC_MODE | 2 |
| | |
|     if DP_PAYLOAD_TYPE = = TS('00') | |
|         DNP_MODE | 2 |
|         ISSY_MODE | 2 |
|         HC_MODE_TS | 2 |
|         if HC_MODE_TS = = '01' or '10' | |
|             PID | 13 |
|         end | |
|     if DP_PAYLOAD_TYPE == IP('01') | |
|         HC_MODE_IP | 2 |
|     end | |
|     RESERVED | 8 |
| end | |
| if FIC_FLAG = = 1 | |
|     FIC_VERSION | 8 |
|     FIC_LENGTH_BYTE | 13 |
|     RESERVED | 8 |
| end | |
| if AUX_FLAG = = 1 | |
|     NUM_AUX | 4 |
|     AUX_CONFIG_RFU | 8 |
|     for - 1 : NUM_AUX | |
|         AUX_STREAM_TYPE | 4 |
|         AUX_PRIVATE_CONF | 28 |
|     end | |
| end | |

[Figure 15]
| Content | | Bit |
|---|---|---|
| FRAME_INDEX | | 5 |
| PLS_CHANGE_COUNTER | | 4 |
| FIC_CHANGE_COUNTER | | 4 |
| RESERVED | | 16 |
| for i = 1: NUM_DP | | |
| | DP_ID | 6 |
| | DP_START | 15 (or 13) |
| | DP_NUM_BLOCK | 10 |
| end | RESERVED | 8 |
| EAC_FLAG | | 1 |
| EAS_WAKE_UP_VERSION_NUM | | 8 |
| if EAC_FLAG == 1 | | |
| | EAC_LENGTH_BYTE | 12 |
| else | | |
| | EAC_COUNTER | 12 |
| end | | |
| for i=1:NUM_AUX | | |
| | AUX_PRIVATE_DYN | 48 |
| end | | |
| CRC 32 | | 32 |
[Figure 16]
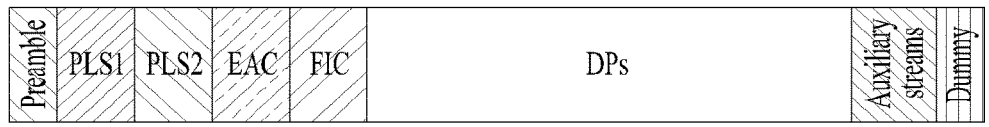

[Figure 17]
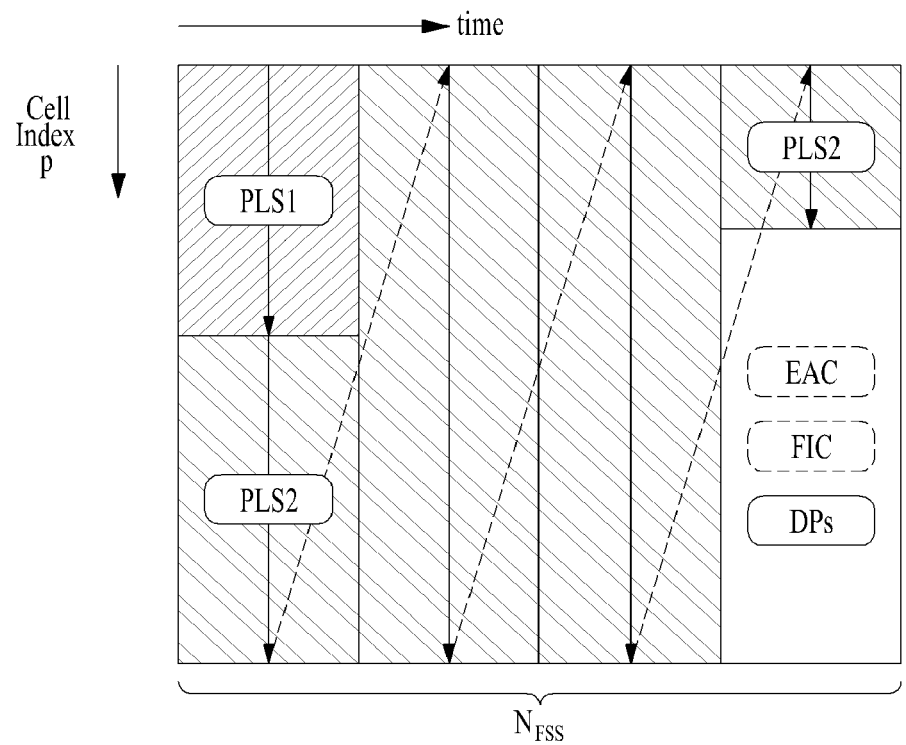
[Figure 18]
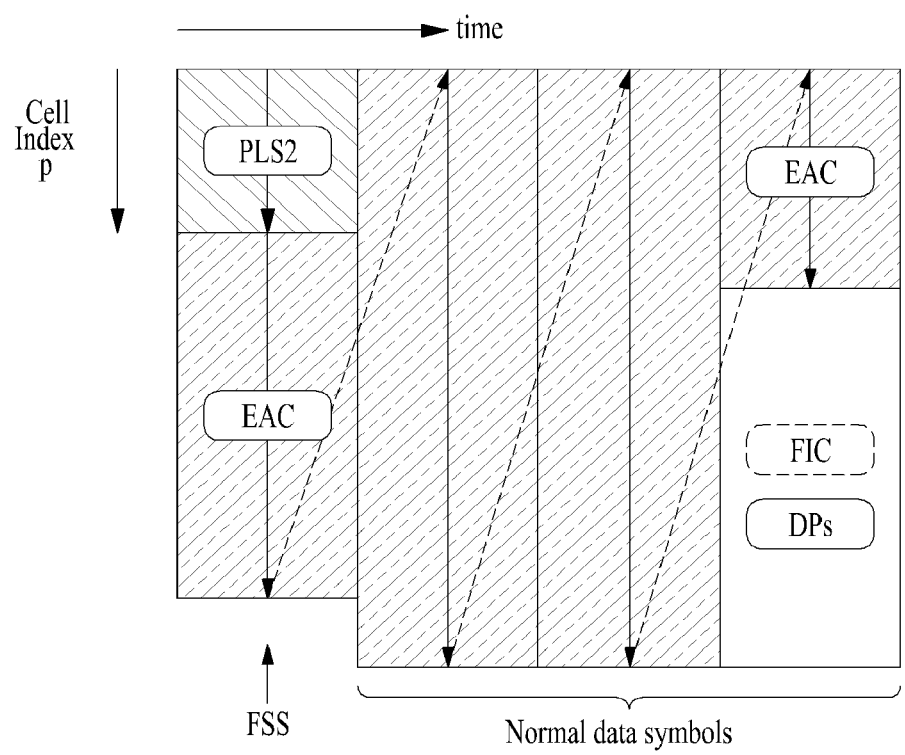

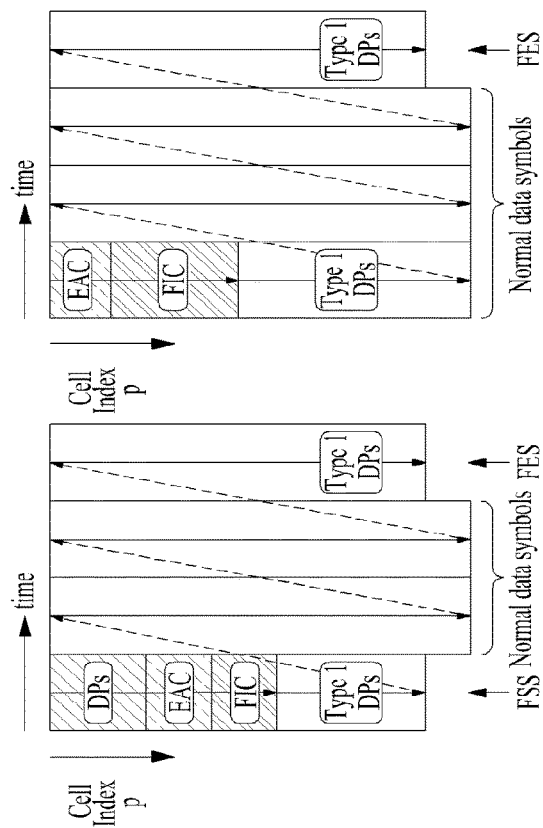
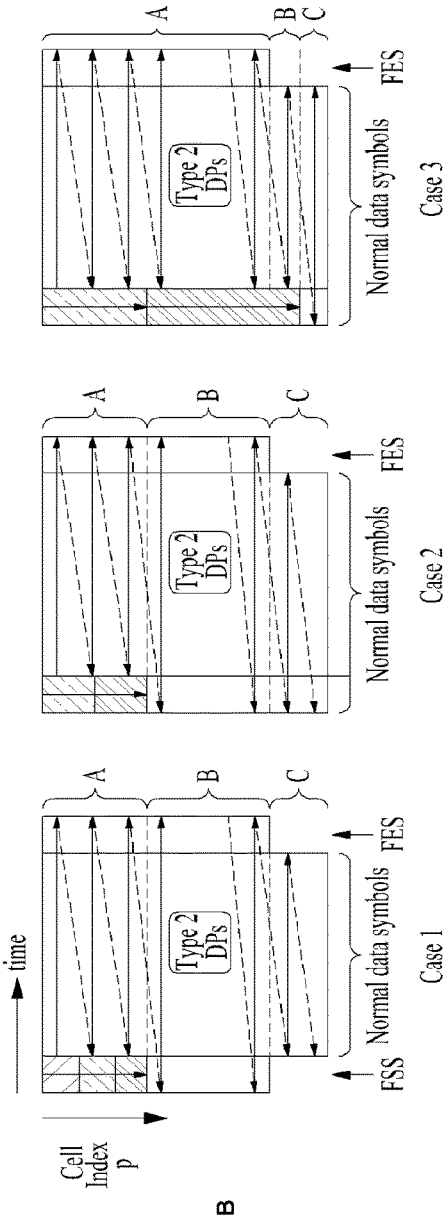
FIG. 21A
FIG. 21B

[Figure 22]
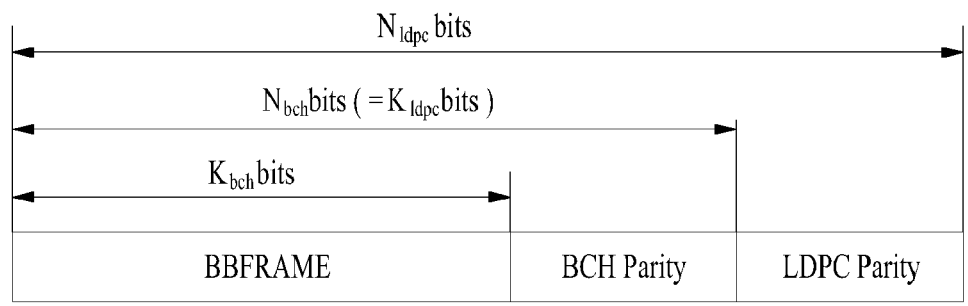

FIG. 29A

| | | |
|---|---|---|
| I...0, | 116 381 739 1436 1514 1911 2226 2879 3156 3550 3743 4040 4389 5001 5387 5413 5855 6328 6771 6922 7359 7593 8010 8602 8901 9356 9383 9807 10084 10739 | |
| I...1, | 266 618 880 1327 1447 1976 2435 2852 3097 3444 3739 4064 4566 4902 5237 5535 5932 6209 6645 7182 7463 7572 8082 8508 8935 9077 9456 9778 10297 10674 | |
| I...2, | 203 610 983 1169 1486 1844 2197 2586 3230 3550 3855 4163 4569 4901 5058 5456 5939 6175 6606 7059 7461 7882 8230 8425 8842 9121 9611 10062 10283 10505 | |
| I...3, | 5148 4813 6045 8723 | |
| I...4, | 773 3290 6373 8265 | |
| I...5, | 2496 5465 7291 9637 | |
| I...6, | 1959 3944 6027 10363 | |
| I...7, | 250 1519 2921 8048 | |
| I...8, | 4146 7279 8760 10482 | |
| I...9, | 393 4365 6607 9463 | |
| I...10, | 79 5260 7042 10060 | |
| I...11, | 974 5696 8519 | |
| I...12, | 2109 4782 7891 | |
| I...13, | 2755 6569 10553 | |
| I...14, | 1364 4008 9117 | |
| I...15, | 0 360 | |
| I...16, | 360 720 | |
| I...17, | 720 1080 | |
| I...18, | 1080 1440 | |
| I...19, | 1440 1800 | |
| I...20, | 1800 2160 | |
| I...21, | 2160 2520 | |
| I...22, | 2520 2880 | |
| I...23, | 2880 3240 | |
| I...24, | 3240 3600 | |
| I...25, | 3600 3960 | |
| I...26, | 3960 4320 | |
| I...27, | 4320 4680 | |
| I...28, | 4680 5040 | |
| I...29, | 5040 5400 | |
| I...30, | 5400 5760 | |
| I...31, | 5760 6120 | |
| I...32, | 6120 6480 | |
| I...33, | 6480 6840 | |
| I...34, | 6840 7200 | |
| I...35, | 7200 7560 | |
| I...36, | 7560 7920 | |
| I...37, | 7920 8280 | |
| I...38, | 8280 8640 | |
| I...39, | 8640 9000 | |
| I...40, | 9000 9360 | |
| I...41, | 9360 9720 | |
| I...42, | 9720 10080 | |
| I...43, | 10080 10440 | |
| I...44, | 10440 | |

[Figure 31]
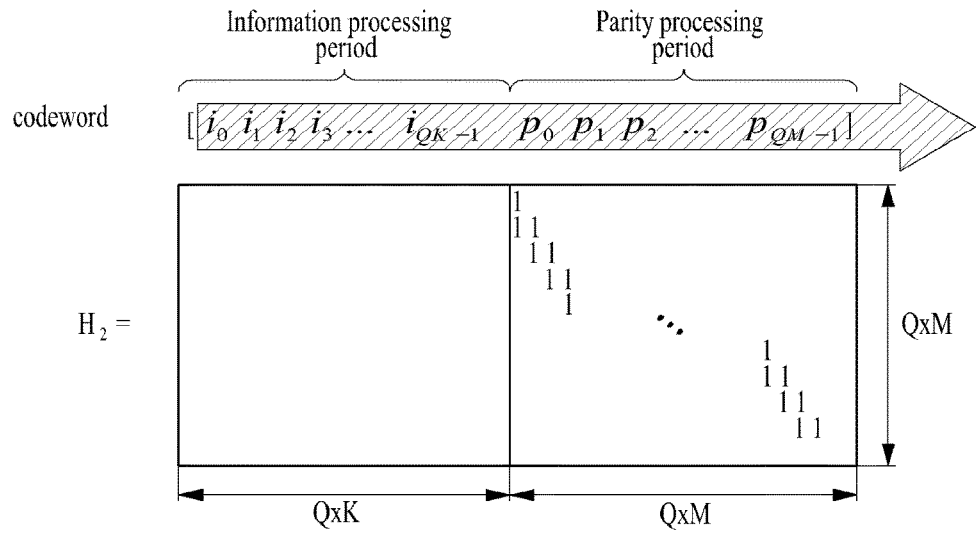
[Figure 32]
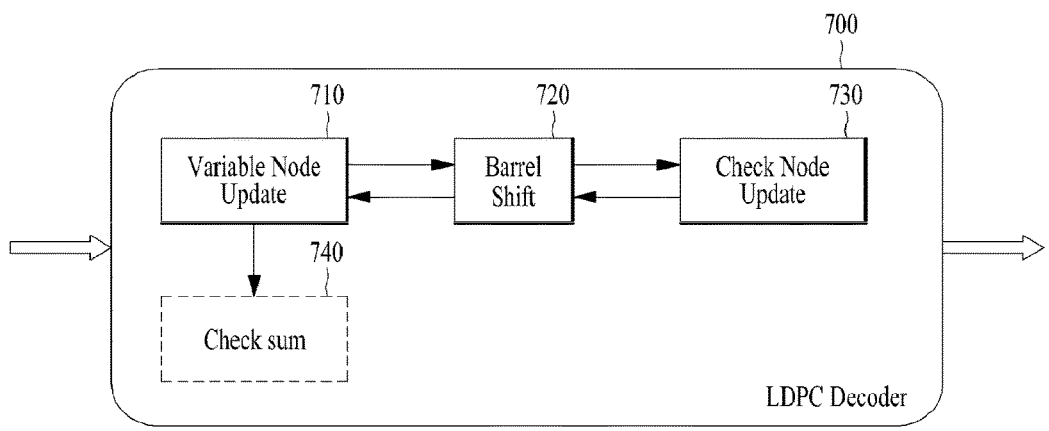
[Figure 33]
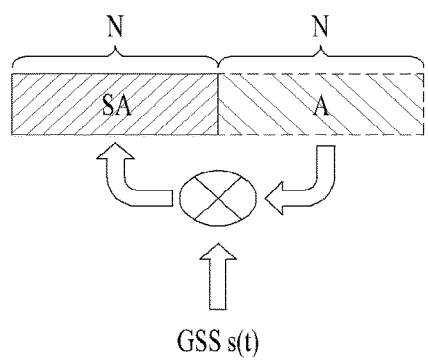

FIG. 35

[Figure 36]
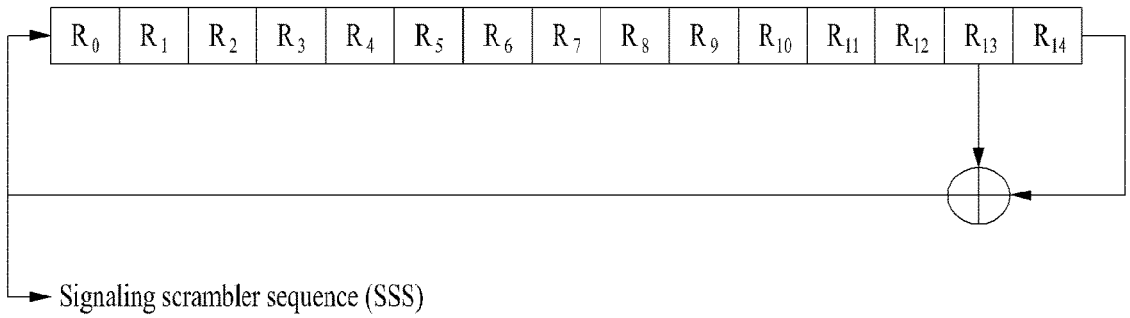
→ Signaling scrambler sequence (SSS)
[Figure 37]
```
139 143 145 146 148 149 150 151 153 154 156 157 158 160 164 165 166
167 169 170 172 173 174 176 179 184 188 189 190 192 196 197 198 199
201 202 203 207 209 210 212 213 214 215 217 218 220 221 222 224 228
229 230 231 233 234 235 239 241 242 244 245 246 247 267 268 270 271
272 273 275 276 278 282 285 290 291 292 294 298 299 300 302 303 304
305 307 308 310 314 315 316 318 319 320 321 325 327 328 329 333 338
341 343 344 345 347 348 350 351 352 353 357 359 360 361 363 364 366
367 368 369 371 372 374 378 379 380 382 383 384 385 389 391 392 393
397 402 405 407 408 409 411 412 414 415 416 417 421 423 424 425 429
434 437 439 440 441 445 450 451 452 454 458 461 466 469 471 472 473
475 476 478 479 480 481 485 487 488 489 491 492 494 495 496 497 499
500 502 506 507 508 510 511 512 513 517 519 520 521 523 524 526 527
528 529 531 532 534 538 541 546 547 548 550 554 555 556 558 559 560
561 563 564 566 570 571 572 574 575 576 577 581 583 584 585 589 594
597 599 600 601 603 604 606 607 608 609 613 615 616 617 619 620 622
623 624 625 627 628 630 634 635 636 638 639 640 641 645 647 648 649
651 652 654 655 656 657 659 660 662 666 669 674 675 676 678 682 683
684 686 687 688 689 691 692 694 698 699 700 702 703 704 705 709 711
712 713 715 716 718 719 720 721 723 724 726 730 733 738 779 781 782
784 785 786 787 789 790 791 795 797 798 800 801 802 804 808 809 810
812 815 820 824 825 826 827 829 830 832 833 834 836 840 841 842 843
845 846 848 849 850 851 853 854 855 859 861 862 864 865 866 868 872
873 874 875 877 878 880 881 882 883 885
```

[Figure 39]

[Figure 41]
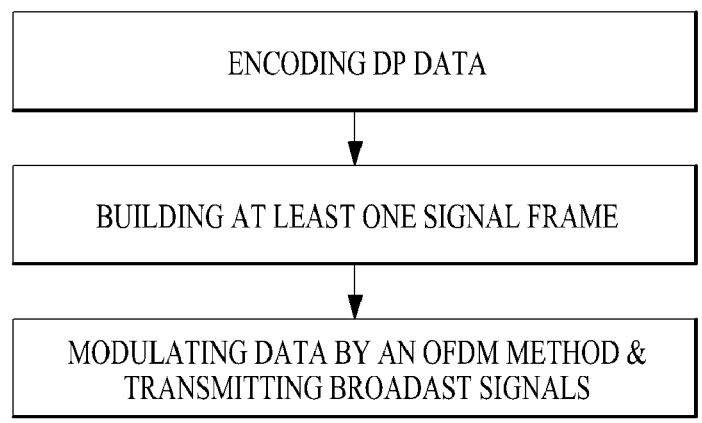

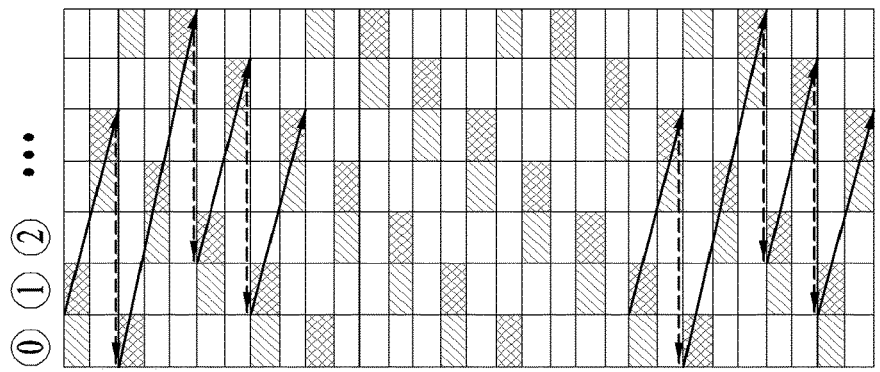
FIG. 42B
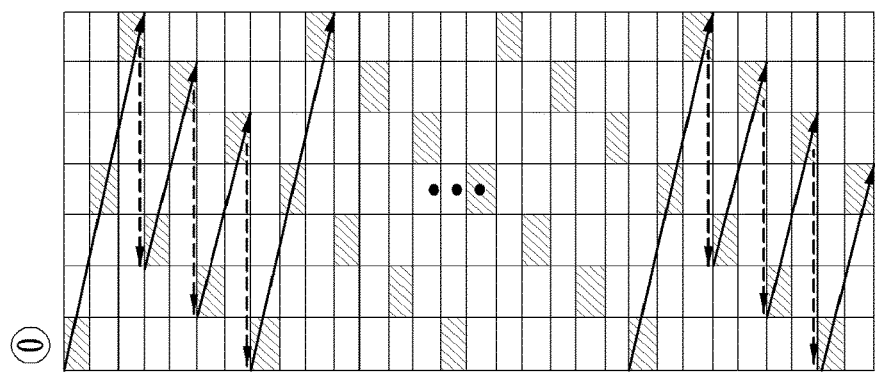
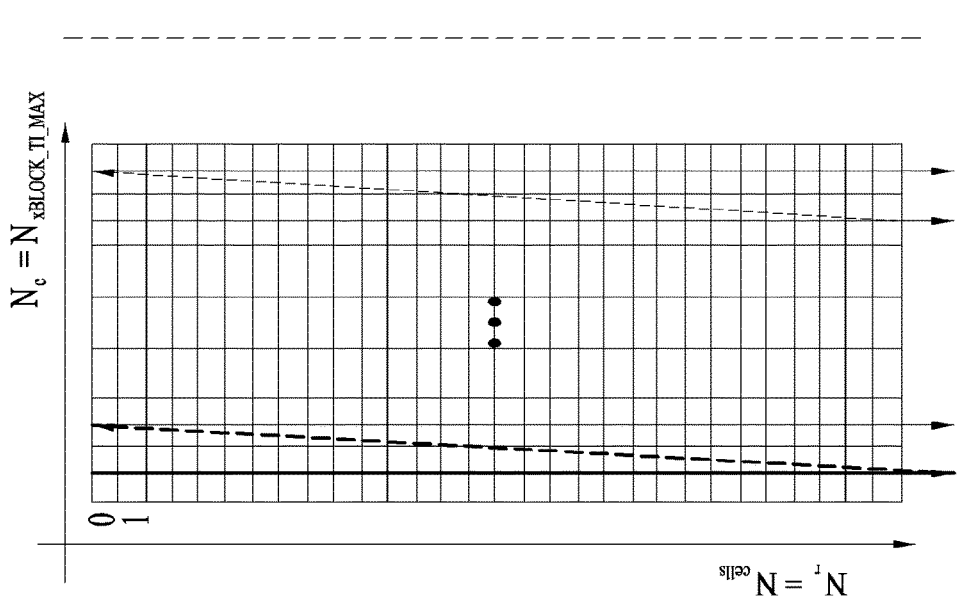
FIG. 42A

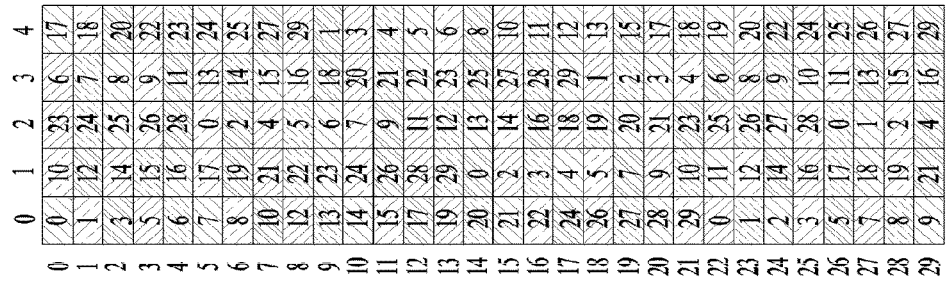
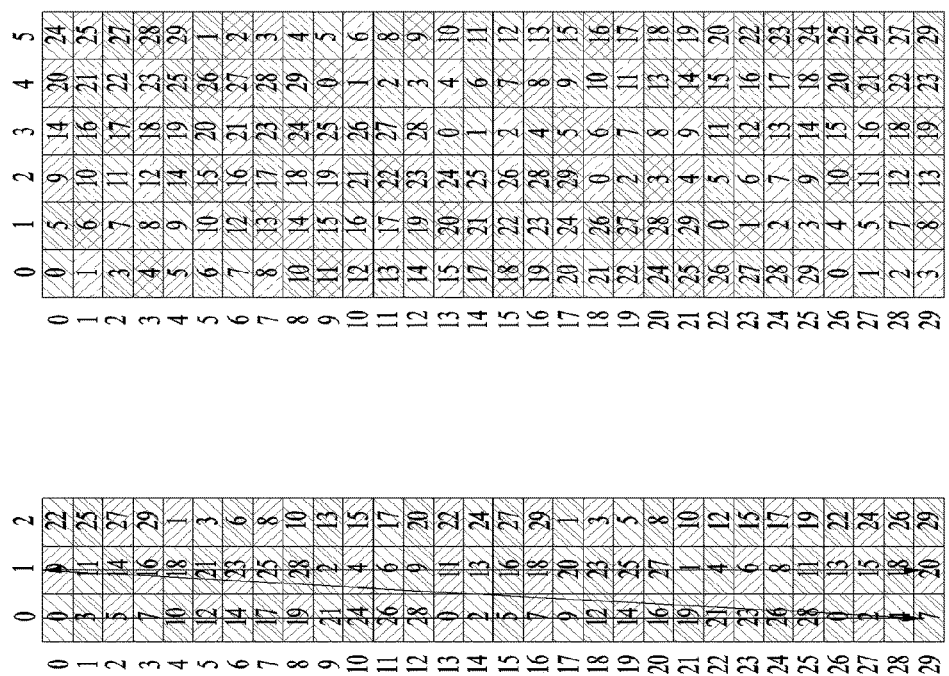
FIG. 45

FIG. 46

| i_F, 0, | 171 580 908 1404 1794 2026 2279 2606 3131 3583 3667 4132 4320 4716 5104 5419 5774 6337 6642 7161 7324 7892 8177 8325 8941 9111 9546 9859 10222 10553 |
|---|---|
| i_F, 1, | 308 370 825 1362 1740 1991 2246 2744 2965 3338 3618 4029 4555 5013 5051 5433 6096 6203 6796 6942 7558 7851 8186 8611 8904 9246 9533 9957 10345 10712 |
| i_F, 2, | 35 470 878 1392 1452 1902 2329 2597 3170 3559 3727 4280 4450 4829 5106 5639 5958 6427 6546 6866 7370 7832 8255 8352 8743 9269 9635 9795 10339 10763 |
| i_F, 3, | 322 5039 6014 8811 |
| i_F, 4, | 897 3484 6313 8104 |
| i_F, 5, | 2428 5733 7336 9468 |
| i_F, 6, | 1881 3917 5926 10172 |
| i_F, 7, | 316 1794 3176 7928 |
| i_F, 8, | 4151 7328 8886 10599 |
| i_F, 9, | 553 4526 6801 9556 |
| i_F, 10, | 224 5240 6905 9825 |
| i_F, 11, | 735 5714 8346 |
| i_F, 12, | 2127 4851 7777 |
| i_F, 13, | 2624 6802 10616 |
| i_F, 14, | 1163 4209 9318 |
| i_F, 15, | 0 360 |
| i_F, 16, | 360 720 |
| i_F, 17, | 720 1080 |
| i_F, 18, | 1080 1440 |
| i_F, 19, | 1440 1800 |
| i_F, 20, | 1800 2160 |
| i_F, 21, | 2160 2520 |
| i_F, 22, | 2520 2880 |
| i_F, 23, | 2880 3240 |
| i_F, 24, | 3240 3600 |
| i_F, 25, | 3600 3960 |
| i_F, 26, | 3960 4320 |
| i_F, 27, | 4320 4680 |
| i_F, 28, | 4680 5040 |
| i_F, 29, | 5040 5400 |
| i_F, 30, | 5400 5760 |
| i_F, 31, | 5760 6120 |
| i_F, 32, | 6120 6480 |
| i_F, 33, | 6480 6840 |
| i_F, 34, | 6840 7200 |
| i_F, 35, | 7200 7560 |
| i_F, 36, | 7560 7920 |
| i_F, 37, | 7920 8280 |
| i_F, 38, | 8280 8640 |
| i_F, 39, | 8640 9000 |
| i_F, 40, | 9000 9360 |
| i_F, 41, | 9360 9720 |
| i_F, 42, | 9720 10080 |
| i_F, 43, | 10080 10440 |
| i_F, 44, | 110440 |

| Variable node degree | 30 | 4 | 3 | 2 |
|---|---|---|---|---|
| (# of variable node) / Q | 3 | 8 | 4 | 30 |

| Variable node degree | 21 | 9 | 8 | 3 | 2 |
|---|---|---|---|---|---|
| (# of variable node) / Q | 3 | 3 | 2 | 16 | 21 |

| Variable node degree | 18 | 4 | 3 | 2 |
|---|---|---|---|---|
| (# of variable node) / Q | 5 | 6 | 19 | 15 |

| Variable node degree | 14 | 4 | 3 | 2 |
|---|---|---|---|---|
| (# of variable node) / Q | 6 | 7 | 23 | 9 |

| Variable node degree | 18 | 4 | 3 | 2 |
|---|---|---|---|---|
| (# of variable node) / Q | 5 | 8 | 17 | 15 |

| Variable node degree | 15 | 4 | 3 | 2 |
|---|---|---|---|---|
| (# of variable node) / Q | 6 | 7 | 23 | 9 |

APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

TECHNICAL FIELD

The present invention relates to an apparatus for transmitting broadcast signals, an apparatus for receiving broadcast signals and methods for transmitting and receiving broadcast signals.

BACKGROUND ART

As analog broadcast signal transmission comes to an end, various technologies for transmitting/receiving digital broadcast signals are being developed. A digital broadcast signal may include a larger amount of video/audio data than an analog broadcast signal and further include various types of additional data in addition to the video/audio data.

That is, a digital broadcast system can provide HD (high definition) images, multi-channel audio and various additional services. However, data transmission efficiency for transmission of large amounts of data, robustness of transmission/reception networks and network flexibility in consideration of mobile reception equipment need to be improved for digital broadcast.

DISCLOSURE

Technical Problem

An object of the present invention is to provide an apparatus and method for transmitting broadcast signals to multiplex data of a broadcast transmission/reception system providing two or more different broadcast services in a time domain and transmit the multiplexed data through the same RF signal bandwidth and an apparatus and method for receiving broadcast signals corresponding thereto.

Another object of the present invention is to provide an apparatus for transmitting broadcast signals, an apparatus for receiving broadcast signals and methods for transmitting and receiving broadcast signals to classify data corresponding to services by components, transmit data corresponding to each component as a data pipe, receive and process the data Still another object of the present invention is to provide an apparatus for transmitting broadcast signals, an apparatus for receiving broadcast signals and methods for transmitting and receiving broadcast signals to signal signaling information necessary to provide broadcast signals.

Technical Solution

To achieve the object and other advantages and in accordance with the purpose of the invention, as embodied and broadly described herein, the present invention provides a method of transmitting broadcast signals. The method of transmitting broadcast signals includes encoding Data Pipe, DP, data according to a code rate, wherein the encoding further includes Low-Density Parity-Check, LDPC, encoding the DP data using addresses of a parity check matrix and length of a LDPC codeword, wherein the addresses of the parity check matrix indicates addresses of parity bits to be calculated, wherein the addresses of the parity check matrix is defined according to the code rate, Bit interleaving the LDPC encoded DP data, and mapping the bit interleaved DP data onto constellations; building at least one signal frame by mapping the encoded DP data; and modulating data in the built signal frame by an Orthogonal Frequency Division Multiplexing, OFDM, method and transmitting the broadcast signals having the modulated data, wherein the signal frame includes a preamble, wherein the preamble includes guard interval.

Preferably, the code rate is 5/15, wherein the length of the LDPC codeword is 16200 bits.

Preferably, the parity check matrix includes an information part corresponding to information bits of the LDPC codeword and a parity part corresponding to the parity bits of the LDPC codeword, wherein the addresses of the parity check matrix is expressed as

TABLE 37

148 405 572 631 716 1011 1986 2082 2224 2411 2479 2637 2722 3335 3480 3766
4300 4790 6257 7854 8288 8748 8999 9309 9643 9683 10105 10424 10683 10777
214 235 381 1767 2687 2906 3131 4065 4180 4802 4882 4968 5176 5285 5924 6129
6518 6538 6673 6863 7049 7392 7413 7741 7910 7980 8256 8874 9967 10279
554 1116 1325 1384 1667 1695 1979 1987 2673 3655 3798 4373 5386 6084 6090 6101
6118 6589 6643 7482 7501 7556 7660 7850 7892 9309 9322 9681 10287 10508
2514 4003 8048 8566
1509 1592 7607 10372
1965 2750 8336 10086
4775 8026 8518 10330
1238 2374 3862 7500
1289 2390 3624 5591
991 1362 3116 3828
2370 6079 6614 10227
7193 7622 8895
3073 9275 9951
2688 3419 7057
1451 3535 8523, wherein each row represents a first information bit in each group of 360 information bits, wherein each value corresponding to the each row represents the addresses of the parity bits to be calculated.

Preferably, each of first to third rows has 30 addresses of the parity bits, each of fourth to eleventh rows has 4 addresses of the parity bits, and each of twelfth to fifteenth rows has 3 addresses of the parity bits.

Preferably, the method further includes: generating a preamble symbol by repeating at least one signaling information, wherein the preamble includes the preamble symbol.

Preferably, the method further includes: generating the guard interval using at least one sequence and the preamble symbol; and generating the preamble by combining the guard interval and the preamble symbol.

In other aspect, the present invention provides a method of receiving broadcast signals. The method of receiving broadcast signals includes receiving broadcast signals having modulated data in signal frames and de-modulating the modulated data by an Orthogonal Frequency Division Multiplexing, OFDM, method; parsing at least one signal frame by de-mapping Data Pipe, DP, data; decoding the DP data according to a code rate, wherein the decoding further includes de-mapping the DP data from constellations, Bit de-interleaving the de-mapped DP data, and Low-Density Parity-Check, LDPC, decoding the bit de-interleaved DP data using addresses of a parity check matrix and length of a LDPC codeword, wherein the addresses of the parity check matrix indicates addresses of parity bits to be calculated, wherein the addresses of the parity check matrix is defined according to the code rate; wherein the signal frame includes a preamble, wherein the preamble includes guard interval.

Preferably, the code rate is 5/15, wherein the length of the LDPC codeword is 16200 bits.

Preferably, the parity check matrix includes an information part corresponding to information bits of the LDPC codeword and a parity part corresponding to the parity bits of the LDPC codeword, wherein the addresses of the parity check matrix is expressed as Preferably, the preamble includes a preamble symbol generated by repeating at least one signaling information.

Preferably, the guard interval is generated by using at least one sequence and the preamble symbol, and wherein the preamble is generated by combining the guard interval and the preamble symbol. In another aspect, the present invention provides an apparatus for transmitting broadcast signals. The apparatus for transmitting broadcast signals includes an encoding module configured to encode Data Pipe, DP, data according to a code rate, wherein the encoding module includes a Low-Density Parity-Check, LDPC, encoding module configured to LDPC encode the DP data using addresses of a parity check matrix and length of a LDPC codeword, wherein the addresses of the parity check matrix indicates addresses of parity bits to be calculated, wherein the addresses of the parity check matrix is defined according to the code rate, a Bit interleaving module configured to bit interleave the LDPC encoded DP data, and a mapping module configured to map the bit interleaved DP data onto constellations; a frame building module configured to build at least one signal frame by mapping the encoded DP data; a modulating module configured to modulate data in the built signal frame by an Orthogonal Frequency Division Multiplexing, OFDM, method; and a transmitting module configured to transmit the broadcast signals having the modulated data, wherein the signal frame includes a preamble, wherein the preamble includes guard interval.

TABLE 38

148 405 572 631 716 1011 1986 2082 2224 2411 2479 2637 2722 3335 3480 3766
4300 4790 6257 7854 8288 8748 8999 9309 9643 9683 10105 10424 10683 10777
214 235 381 1767 2687 2906 3131 4065 4180 4802 4882 4968 5176 5285 5924 6129
6518 6538 6673 6863 7049 7392 7413 7741 7910 7980 8256 8874 9967 10279
554 1116 1325 1384 1667 1695 1979 1987 2673 3655 3798 4373 5386 6084 6090 6101
6118 6589 6643 7482 7501 7556 7660 7850 7892 9309 9322 9681 10287 10508
2514 4003 8048 8566
1509 1592 7607 10372
1965 2750 8336 10086
4775 8026 8518 10330
1238 2374 3862 7500
1289 2390 3624 5591
991 1362 3116 3828
2370 6079 6614 10227
7193 7622 8895
3073 9275 9951
2688 3419 7057
1451 3535 8523, wherein each row represents a first information bit in each group of 360 information bits, wherein each value corresponding to the each row represents the addresses of the parity bits to be calculated.

Preferably, each of first to third rows has 30 addresses of the parity bits, each of fourth to eleventh rows has 4 addresses of the parity bits, and each of twelfth to fifteenth rows has 3 addresses of the parity bits.

Preferably, the code rate is 5/15, wherein the length of the LDPC codeword is 16200 bits.

Preferably, the parity check matrix includes an information part corresponding to information bits of the LDPC codeword and a parity part corresponding to the parity bits of the LDPC codeword, wherein the addresses of the parity check matrix is expressed as

TABLE 39

148 405 572 631 716 1011 1986 2082 2224 2411 2479 2637 2722 3335 3480 3766
4300 4790 6257 7854 8288 8748 8999 9309 9643 9683 10105 10424 10683 10777
214 235 381 1767 2687 2906 3131 4065 4180 4802 4882 4968 5176 5285 5924 6129
6518 6538 6673 6863 7049 7392 7413 7741 7910 7980 8256 8874 9967 10279
554 1116 1325 1384 1667 1695 1979 1987 2673 3655 3798 4373 5386 6084 6090 6101
6118 6589 6643 7482 7501 7556 7660 7850 7892 9309 9322 9681 10287 10508
2514 4003 8048 8566
1509 1592 7607 10372
1965 2750 8336 10086
4775 8026 8518 10330

TABLE 39-continued 1238 2374 3862 7500
1289 2390 3624 5591
991 1362 3116 3828
2370 6079 6614 10227
7193 7622 8895
3073 9275 9951
2688 3419 7057
1451 3535 8523, wherein each row represents a first information bit in each group of 360 information bits, wherein each value corresponding to the each row represents the addresses of the parity bits to be calculated.

Preferably, each of first to third rows has 30 addresses of the parity bits, each of fourth to eleventh rows has 4 addresses of the parity bits, and each of twelfth to fifteenth rows has 3 addresses of the parity bits.

Preferably, the apparatus further includes: a preamble generating module configured to repeat at least one signaling information to generate a preamble symbol, wherein the preamble includes the preamble symbol.

Preferably, the preamble generating module further configured to generate the guard interval using at least one sequence and the preamble symbol, and to generate the preamble by combining the guard interval and the preamble symbol.

In another aspect, the present invention provides an apparatus for receiving broadcast signals. The apparatus for receiving broadcast signals includes a receiving module configured to receive broadcast signals having modulated data in signal frames; a de-modulating module configured to de-modulate the modulated data by an Orthogonal Frequency Division Multiplexing, OFDM, method; a parsing module configured to parse at least one signal frame by de-mapping Data Pipe, DP, data; a decoding module configured to decode the DP data according to a code rate, wherein the decoding module includes a de-mapping module configured to de-map the DP data from constellations, a Bit de-interleaving module configured to bit de-interleave the de-mapped DP data, and a Low-Density Parity-Check, LDPC, decoding module configured to LDPC decode the bit de-interleaved DP data using addresses of a parity check matrix and length of a LDPC codeword, wherein the addresses of the parity check matrix indicates addresses of parity bits to be calculated, wherein the addresses of the parity check matrix is defined according to the code rate; wherein the signal frame includes a preamble, wherein the preamble includes guard interval.

Preferably, the code rate is 5/15, wherein the length of the LDPC codeword is 16200 bits.

Preferably, the parity check matrix includes an information part corresponding to information bits of the LDPC codeword and a parity part corresponding to the parity bits of the LDPC codeword, wherein the addresses of the parity check matrix is expressed as

TABLE 40

148 405 572 631 716 1011 1986 2082 2224 2411 2479 2637 2722 3335 3480 3766
4300 4790 6257 7854 8288 8748 8999 9309 9643 9683 10105 10424 10683 10777
214 235 381 1767 2687 2906 3131 4065 4180 4802 4882 4968 5176 5285 5924 6129
6518 6538 6673 6863 7049 7392 7413 7741 7910 7980 8256 8874 9967 10279
554 1116 1325 1384 1667 1695 1979 1987 2673 3655 3798 4373 5386 6084 6090 6101
6118 6589 6643 7482 7501 7556 7660 7850 7892 9309 9322 9681 10287 10508
2514 4003 8048 8566
1509 1592 7607 10372
1965 2750 8336 10086
4775 8026 8518 10330
1238 2374 3862 7500
1289 2390 3624 5591
991 1362 3116 3828
2370 6079 6614 10227
7193 7622 8895
3073 9275 9951
2688 3419 7057
1451 3535 8523, wherein each row represents a first information bit in each group of 360 information bits, wherein each value corresponding to the each row represents the addresses of the parity bits to be calculated.

Preferably, each of first to third rows has 30 addresses of the parity bits, each of fourth to eleventh rows has 4 addresses of the parity bits, and each of twelfth to fifteenth rows has 3 addresses of the parity bits.

Preferably, the preamble includes a preamble symbol generated by repeating at least one signaling information.

Preferably, the guard interval is generated by using at least one sequence and the preamble symbol, and wherein the preamble is generated by combining the guard interval and the preamble symbol.

Advantageous Effects

The present invention can process data according to service characteristics to control QoS (Quality of Services) for each service or service component, thereby providing various broadcast services.

The present invention can achieve transmission flexibility by transmitting various broadcast services through the same RF signal bandwidth.

The present invention can improve data transmission efficiency and increase robustness of transmission/reception of broadcast signals using a MIMO system.

According to the present invention, it is possible to provide broadcast signal transmission and reception methods and apparatus capable of receiving digital broadcast signals without error even with mobile reception equipment or in an indoor environment.

DESCRIPTION OF DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 1 illustrates a structure of an apparatus for transmitting broadcast signals for future broadcast services according to an embodiment of the present invention.

FIG. 2 illustrates an input formatting block according to one embodiment of the present invention.

FIG. 3 illustrates an input formatting block according to another embodiment of the present invention.

FIG. 4 illustrates an input formatting block according to another embodiment of the present invention.

FIG. 5 illustrates a BICM block according to an embodiment of the present invention.

FIG. 6 illustrates a BICM block according to another embodiment of the present invention.

FIG. 7 illustrates a frame building block according to one embodiment of the present invention.

FIG. 8 illustrates an OFMD generation block according to an embodiment of the present invention.

FIG. 9 illustrates a structure of an apparatus for receiving broadcast signals for future broadcast services according to an embodiment of the present invention.

FIG. 11 illustrates a signaling hierarchy structure of the frame according to an embodiment of the present invention.

FIG. 12 illustrates preamble signaling data according to an embodiment of the present invention.

FIG. 13 illustrates PLS1 data according to an embodiment of the present invention.

FIG. 14 illustrates PLS2 data according to an embodiment of the present invention.

FIG. 15 illustrates PLS2 data according to another embodiment of the present invention.

FIG. 16 illustrates a logical structure of a frame according to an embodiment of the present invention.

FIG. 17 illustrates PLS mapping according to an embodiment of the present invention.

FIG. 18 illustrates EAC mapping according to an embodiment of the present invention.

FIG. 21 illustrates DP mapping according to an embodiment of the present invention.

FIG. 22 illustrates an FEC structure according to an embodiment of the present invention.

FIG. 29 is a table showing addresses of parity check matrix according to an embodiment of the present invention.

FIG. 30 is a table showing addresses of parity check matrix according to another embodiment of the present invention.

FIG. 31 illustrates a method for sequentially encoding the QC-IRA LDPC code according to an embodiment of the present invention.

FIG. 32 illustrates an LDPC decoder according to an embodiment of the present invention.

FIG. 33 illustrates time-domain structure of the normal preamble according to an embodiment of the present invention.

FIG. 35 illustrates sub-matrixes of Reed Muller generator matrix G according to an embodiment of the present invention.

FIG. 36 illustrates a Signaling Scrambler Sequence (SSS) generator according to an embodiment of the present invention.

FIG. 37 illustrates distribution of the active carriers according to an embodiment of the present invention.

FIG. 41 illustrates a method of transmitting broadcast signal according to an embodiment of the present invention.

FIG. 42 illustrates the basic operation of a twisted row-column block interleaver according to an embodiment of the present invention.

FIG. 45 illustrates interleaved XFECBLOCKs from each interleaving array according to an embodiment of the present invention.

FIG. 46 illustrates one of the embodiments of the H1 matrix according to a code rate of 5/15.

FIG. 47 illustrates one of the embodiments of the H2 matrix according to a code rate of 5/15.

FIG. 48 illustrates one of the embodiments of the degree distribution table according to a code rate of 5/15.

FIG. 49 illustrates one of the embodiments of the H1 matrix according to a code rate of 8/15.

FIG. 50 illustrates one of the embodiments of the H2 matrix according to a code rate of 8/15.

FIG. 51 illustrates one of the embodiments of the degree distribution table according to a code rate of 8/15.

FIG. 52 illustrates one of the embodiments of the H1 matrix according to a code rate of 10/15.

FIG. 53 illustrates one of the embodiments of the H2 matrix according to a code rate of 10/15.

FIG. 54 illustrates one of the embodiments of the degree distribution table according to a code rate of 10/15.

FIG. 55 illustrates one of the embodiments of the H1 matrix according to a code rate of 12/15.

FIG. 56 illustrates one of the embodiments of the H2 matrix according to a code rate of 12/15.

FIG. 57 illustrates one of the embodiments of the degree distribution table according to a code rate of 12/15.

FIG. 58 illustrates one of the embodiments of the H1 matrix according to a code rate of 10/15.

FIG. 59 illustrates one of the embodiments of the H2 matrix according to a code rate of 10/15.

FIG. 60 illustrates one of the embodiments of the degree distribution table according to a code rate of 10/15.

FIG. 61 illustrates one of the embodiments of the H1 matrix according to a code rate of 12/15.

FIG. 62 illustrates one of the embodiments of the H2 matrix according to a code rate of 12/15.

FIG. 63 illustrates one of the embodiments of the degree distribution table according to a code rate of 12/15.

BEST MODE

Figure 10A:
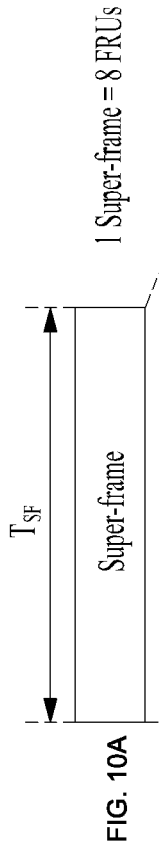
FIG. 10 illustrates a frame structure according to an embodiment of the present invention.
Figure 10B:
Figure 10C:
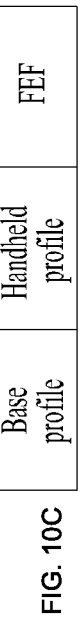
Figure 10D:
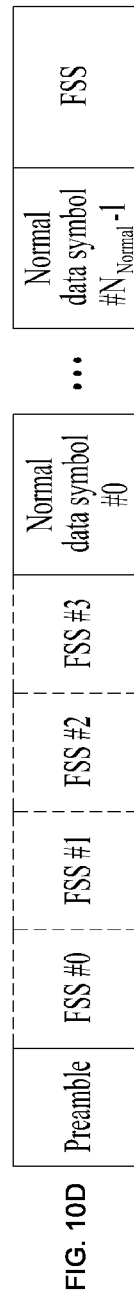

Reference will now be made in detail to the preferred embodiments of the present invention, examples of which are illustrated in the accompanying drawings. The detailed description, which will be given below with reference to the accompanying drawings, is intended to explain exemplary embodiments of the present invention, rather than to show the only embodiments that can be implemented according to the present invention. The following detailed description includes specific details in order to provide a thorough understanding of the present invention. However, it will be apparent to those skilled in the art that the present invention may be practiced without such specific details.

Although most terms used in the present invention have been selected from general ones widely used in the art, some terms have been arbitrarily selected by the applicant and their meanings are explained in detail in the following description as needed. Thus, the present invention should be understood based upon the intended meanings of the terms rather than their simple names or meanings.

The present invention provides apparatuses and methods for transmitting and receiving broadcast signals for future broadcast services. Future broadcast services according to an embodiment of the present invention include a terrestrial broadcast service, a mobile broadcast service, a UHDTV service, etc. The present invention may process broadcast signals for the future broadcast services through non-MIMO (Multiple Input Multiple Output) or MIMO according to one embodiment. A non-MIMO scheme according to an embodiment of the present invention may include a MISO (Multiple Input Single Output) scheme, a SISO (Single Input Single Output) scheme, etc.

While MISO or MIMO uses two antennas in the following for convenience of description, the present invention is applicable to systems using two or more antennas.

The present invention may defines three physical layer (PL) profiles—base, handheld and advanced profiles—each optimized to minimize receiver complexity while attaining the performance required for a particular use case. The physical layer (PHY) profiles are subsets of all configurations that a corresponding receiver should implement.

The three PHY profiles share most of the functional blocks but differ slightly in specific blocks and/or parameters. Additional PHY profiles can be defined in the future. For the system evolution, future profiles can also be multiplexed with the existing profiles in a single RF channel through a future extension frame (FEF). The details of each PHY profile are described below.

1. Base Profile

The base profile represents a main use case for fixed receiving devices that are usually connected to a roof-top antenna. The base profile also includes portable devices that could be transported to a place but belong to a relatively stationary reception category. Use of the base profile could be extended to handheld devices or even vehicular by some improved implementations, but those use cases are not expected for the base profile receiver operation.

Target SNR range of reception is from approximately 10 to 20 dB, which includes the 15 dB SNR reception capability of the existing broadcast system (e.g. ATSC A/53). The receiver complexity and power consumption is not as critical as in the battery-operated handheld devices, which will use the handheld profile. Key system parameters for the base profile are listed in below table 1.

TABLE 1

| | |
|---|---|
| LDPC codeword length | 16K, 64K bits |
| Constellation size | 4~10 bpcu (bits per channel use) |
| Time de-interleaving memory size | $\leq 2^{19}$ data cells |
| Pilot patterns | Pilot pattern for fixed reception |
| FFT size | 16K, 32K points |

2. Handheld Profile

The handheld profile is designed for use in handheld and vehicular devices that operate with battery power. The devices can be moving with pedestrian or vehicle speed. The power consumption as well as the receiver complexity is very important for the implementation of the devices of the handheld profile. The target SNR range of the handheld profile is approximately 0 to 10 dB, but can be configured to reach below 0 dB when intended for deeper indoor reception.

In addition to low SNR capability, resilience to the Doppler Effect caused by receiver mobility is the most important performance attribute of the handheld profile. Key system parameters for the handheld profile are listed in the below table 2.

TABLE 2

| | |
|---|---|
| LDPC codeword length | 16K bits |
| Constellation size | 2~8 bpcu |
| Time de-interleaving memory size | $\leq 2^{18}$ data cells |
| Pilot patterns | Pilot patterns for mobile and indoor reception |
| FFT size | 8K, 16K points |

3. Advanced Profile

The advanced profile provides highest channel capacity at the cost of more implementation complexity. This profile requires using MIMO transmission and reception, and UHDTV service is a target use case for which this profile is specifically designed. The increased capacity can also be used to allow an Increased number of services in a given bandwidth, e.g., multiple SDTV or HDTV services. The target SNR range of the advanced profile is approximately 20 to 30 dB. MIMO transmission may initially use existing elliptically-polarized transmission equipment, with extension to full-power cross-polarized transmission in the future. Key system parameters for the advanced profile are listed in below table 3.

TABLE 3

| | |
|---|---|
| LDPC codeword length | 16K, 64K bits |
| Constellation size | 8~12 bpcu |
| Time de-interleaving memory size | ≤$2^{19}$ data cells |
| Pilot patterns | Pilot pattern for fixed reception |
| FFT size | 16K, 32K points |

In this case, the base profile can be used as a profile for both the terrestrial broadcast service and the mobile broadcast service. That is, the base profile can be used to define a concept of a profile which includes the mobile profile. Also, the advanced profile can be divided advanced profile for a base profile with MIMO and advanced profile for a handheld profile with MIMO. Moreover, the three profiles can be changed according to intention of the designer.

The following terms and definitions may apply to the present invention. The following terms and definitions can be changed according to design.

auxiliary stream: sequence of cells carrying data of as yet undefined modulation and coding, which may be used for future extensions or as required by broadcasters or network operators base data pipe: data pipe that carries service signaling data baseband frame (or BBFRAME): set of $K_{bch}$ bits which form the input to one FEC encoding process (BCH and LDPC encoding)

cell: modulation value that is carried by one carrier of the OFDM transmission coded block: LDPC-encoded block of PLS1 data or one of the LDPC-encoded blocks of PLS2 data data pipe: logical channel in the physical layer that carries service data or related metadata, which may carry one or multiple service(s) or service component(s).

data pipe unit: a basic unit for allocating data cells to a DP in a frame.

data symbol: OFDM symbol in a frame which is not a preamble symbol (the frame signaling symbol and frame edge symbol is included in the data symbol)

DP_ID: this 8-bit field identifies uniquely a DP within the system identified by the SYSTEM_ID dummy cell: cell carrying a pseudo-random value used to fill the remaining capacity not used for PLS signaling, DPs or auxiliary streams emergency alert channel: part of a frame that carries EAS information data frame: physical layer time slot that starts with a preamble and ends with a frame edge symbol frame repetition unit: a set of frames belonging to same or different physical layer profile including a FEF, which is repeated eight times in a super-frame fast information channel: a logical channel in a frame that carries the mapping information between a service and the corresponding base DP FECBLOCK: set of LDPC-encoded bits of a DP data FFT size: nominal FFT size used for a particular mode, equal to the active symbol period $T_S$ expressed in cycles of the elementary period T frame signaling symbol: OFDM symbol with higher pilot density used at the start of a frame in certain combinations of FFT size, guard interval and scattered pilot pattern, which carries a part of the PLS data frame edge symbol: OFDM symbol with higher pilot density used at the end of a frame in certain combinations of FFT size, guard interval and scattered pilot pattern frame-group: the set of all the frames having the same PHY profile type in a super-frame.

future extension frame: physical layer time slot within the super-frame that could be used for future extension, which starts with a preamble Futurecast UTB system: proposed physical layer broadcasting system, of which the input is one or more MPEG2-TS or IP or general stream(s) and of which the output is an RF signal input stream: A stream of data for an ensemble of services delivered to the end users by the system.

normal data symbol: data symbol excluding the frame signaling symbol and the frame edge symbol PHY profile: subset of all configurations that a corresponding receiver should implement PLS: physical layer signaling data consisting of PLS1 and PLS2

PLS1: a first set of PLS data carried in the FSS symbols having a fixed size, coding and modulation, which carries basic information about the system as well as the parameters needed to decode the PLS2

NOTE: PLS1 data remains constant for the duration of a frame-group.

PLS2: a second set of PLS data transmitted in the FSS symbol, which carries more detailed PLS data about the system and the DPs PLS2 dynamic data: PLS2 data that may dynamically change frame-by-frame PLS2 static data: PLS2 data that remains static for the duration of a frame-group preamble signaling data: signaling data carried by the preamble symbol and used to identify the basic mode of the system preamble symbol: fixed-length pilot symbol that carries basic PLS data and is located in the beginning of a frame NOTE: The preamble symbol is mainly used for fast initial band scan to detect the system signal, its timing, frequency offset, and FFT-size.

reserved for future use: not defined by the present document but may be defined in future super-frame: set of eight frame repetition units time interleaving block (TI block): set of cells within which time interleaving is carried out, corresponding to one use of the time interleaver memory TI group: unit over which dynamic capacity allocation for a particular DP is carried out, made up of an integer, dynamically varying number of XFECBLOCKs.

NOTE: The TI group may be mapped directly to one frame or may be mapped to multiple frames. It may contain one or more TI blocks.

Type 1 DP: DP of a frame where all DPs are mapped into the frame in TDM fashion

Type 2 DP: DP of a frame where all DPs are mapped into the frame in FDM fashion

XFECBLOCK: set of $N_{cells}$ cells carrying all the bits of one LDPC FECBLOCK

FIG. 1 illustrates a structure of an apparatus for transmitting broadcast signals for future broadcast services according to an embodiment of the present invention.

The apparatus for transmitting broadcast signals for future broadcast services according to an embodiment of the present invention can include an input formatting block 1000, a BICM (Bit interleaved coding & modulation) block 1010, a frame structure block 1020, an OFDM (Orthogonal Frequency Division Multiplexing) generation block 1030 and a signaling generation block 1040. A description will be given of the operation of each module of the apparatus for transmitting broadcast signals.

IP stream/packets and MPEG2-TS are the main input formats, other stream types are handled as General Streams. In addition to these data inputs, Management Information is input to control the scheduling and allocation of the corresponding bandwidth for each input stream. One or multiple TS stream(s), IP stream(s) and/or General Stream(s) inputs are simultaneously allowed.

The input formatting block 1000 can demultiplex each input stream into one or multiple data pipe(s), to each of which an independent coding and modulation is applied. The data pipe (DP) is the basic unit for robustness control, thereby affecting quality-of-service (QoS). One or multiple service(s) or service component(s) can be carried by a single DP. Details of operations of the input formatting block 1000 will be described later.

The data pipe is a logical channel in the physical layer that carries service data or related metadata, which may carry one or multiple service(s) or service component(s).

Also, the data pipe unit a basic unit for allocating data cells to a DP in a frame.

In the BICM block 1010, parity data is added for error correction and the encoded bit streams are mapped to complex-value constellation symbols. The symbols are interleaved across a specific interleaving depth that is used for the corresponding DP. For the advanced profile, MIMO encoding is performed in the BICM block 1010 and the additional data path is added at the output for MIMO transmission. Details of operations of the BICM block 1010 will be described later.

The Frame Building block 1020 can map the data cells of the input DPs into the OFDM symbols within a frame. After mapping, the frequency interleaving is used for frequency-domain diversity, especially to combat frequency-selective fading channels. Details of operations of the Frame Building block 1020 will be described later.

After inserting a preamble at the beginning of each frame, the OFDM Generation block 1030 can apply conventional OFDM modulation having a cyclic prefix as guard interval. For antenna space diversity, a distributed MISO scheme is applied across the transmitters. In addition, a Peak-to-Average Power Reduction (PAPR) scheme is performed in the time domain. For flexible network planning, this proposal provides a set of various FFT sizes, guard interval lengths and corresponding pilot patterns. Details of operations of the OFDM Generation block 1030 will be described later.

The Signaling Generation block 1040 can create physical layer signaling information used for the operation of each functional block. This signaling information is also transmitted so that the services of interest are properly recovered at the receiver side. Details of operations of the Signaling Generation block 1040 will be described later.

FIGS. 2, 3 and 4 illustrate the input formatting block 1000 according to embodiments of the present invention. A description will be given of each figure.

FIG. 2 illustrates an input formatting block according to one embodiment of the present invention. FIG. 2 shows an input formatting module when the input signal is a single input stream.

The input formatting block illustrated in FIG. 2 corresponds to an embodiment of the input formatting block 1000 described with reference to FIG. 1.

The input to the physical layer may be composed of one or multiple input streams. Each data stream is carried by one DP. The mode adaptation modules slice the incoming data stream into data fields of the baseband frame (BBF). The system supports three types of input data streams: MPEG2-TS, Internet protocol (IP) and Generic stream (GS). MPEG2-TS is characterized by fixed length (188 byte) packets with the first byte being a sync-byte (0x47). An IP stream is composed of variable length IP datagram packets, as signaled within IP packet headers. The system supports both IPv4 and IPv6 for the IP stream. GS may be composed of variable length packets or constant length packets, signaled within encapsulation packet headers.

(a) shows a mode adaptation block 2000 and a stream adaptation 2010 for signal DP and (b) shows a PLS generation block 2020 and a PLS scrambler 2030 for generating and processing PLS data. A description will be given of the operation of each block.

The Input Stream Splitter splits the input TS, IP, GS streams into multiple service or service component (audio, video, etc.) streams. The mode adaptation module 2010 is comprised of a CRC Encoder, BB (baseband) Frame Slicer, and BB Frame Header Insertion block.

The CRC Encoder provides three kinds of CRC encoding for error detection at the user packet (UP) level, i.e., CRC-8, CRC-16, and CRC-32. The computed CRC bytes are appended after the UR CRC-8 is used for TS stream and CRC-32 for IP stream. If the GS stream doesn't provide the CRC encoding, the proposed CRC encoding should be applied.

BB Frame Slicer maps the input into an internal logical-bit format. The first received bit is defined to be the MSB. The BB Frame Slicer allocates a number of input bits equal to the available data field capacity. To allocate a number of input bits equal to the BBF payload, the UP packet stream is sliced to fit the data field of BBF.

BB Frame Header Insertion block can insert fixed length BBF header of 2 bytes is inserted in front of the BB Frame. The BBF header is composed of STUFFI (1 bit), SYNCD (13 bits), and RFU (2 bits). In addition to the fixed 2-Byte BBF header, BBF can have an extension field (1 or 3 bytes) at the end of the 2-byte BBF header.

The stream adaptation 2010 is comprised of stuffing insertion block and BB scrambler.

The stuffing insertion block can insert stuffing field into a payload of a BB frame. If the input data to the stream adaptation is sufficient to fill a BB-Frame, STUFFI is set to '0' and the BBF has no stuffing field. Otherwise STUFFI is set to '1' and the stuffing field is inserted immediately after the BBF header. The stuffing field comprises two bytes of the stuffing field header and a variable size of stuffing data. The BB scrambler scrambles complete BBF for energy dispersal. The scrambling sequence is synchronous with the BBF. The scrambling sequence s generated by the feed-back shift register.

The PLS generation block 2020 can generate physical layer signaling (PLS) data. The PLS provides the receiver with a means to access physical layer DPs. The PLS data consists of PLS1 data and PLS2 data. The PLS1 data is a first set of PLS data carried in the FSS symbols in the frame having a fixed size, coding and modulation, which carries basic information about the system as well as the parameters needed to decode the PLS2 data. The PLS1 data provides basic transmission parameters including parameters required to enable the reception and decoding of the PLS2 data. Also, the PLS1 data remains constant for the duration of a frame-group.

The PLS2 data is a second set of PLS data transmitted in the FSS symbol, which carries more detailed PLS data about the system and the DPs. The PLS2 contains parameters that provide sufficient information for the receiver to decode the desired DP. The PLS2 signaling further consists of two types of parameters, PLS2 Static data (PLS2-STAT data) and PLS2 dynamic data (PLS2-DYN data). The PLS2 Static data is PLS2 data that remains static for the duration of a frame-group and the PLS2 dynamic data is PLS2 data that may dynamically change frame-by-frame.

Details of the PLS data will be described later.

The PLS scrambler 2030 can scramble the generated PLS data for energy dispersal.

The above-described blocks may be omitted or replaced by blocks having similar or identical functions.

FIG. 3 illustrates an input formatting block according to another embodiment of the present invention.

The input formatting block illustrated in FIG. 3 corresponds to an embodiment of the input formatting block 1000 described with reference to FIG. 1.

FIG. 3 shows a mode adaptation block of the input formatting block when the input signal corresponds to multiple input streams.

The mode adaptation block of the input formatting block for processing the multiple input streams can independently process the multiple input streams.

Referring to FIG. 3, the mode adaptation block for respectively processing the multiple input streams can include an Input stream splitter 3000, an input stream synchronizer 3010, a compensating delay block 3020, a null packet deletion block 3030, a head compression block 3040, a CRC encoder 3050, a BB frame slicer 3060 and a BB header insertion block 3070. Description will be given of each block of the mode adaptation block.

Operations of the CRC encoder 3050, BB frame slicer 3060 and BB header insertion block 3070 correspond to those of the CRC encoder, BB frame slicer and BB header insertion block described with reference to FIG. 2 and thus description thereof is omitted.

The input stream splitter 3000 can split the input TS, IP, GS streams into multiple service or service component (audio, video, etc.) streams.

The input stream synchronizer 3010 may be referred as ISSY. The ISSY can provide suitable means to guarantee Constant Bit Rate (CBR) and constant end-to-end transmission delay for any input data format. The ISSY is always used for the case of multiple DPs carrying TS, and optionally used for multiple DPs carrying GS streams.

The compensating delay block 3020 can delay the split TS packet stream following the Insertion of ISSY information to allow a TS packet recombining mechanism without requiring additional memory in the receiver.

The null packet deletion block 3030, is used only for the TS input stream case. Some TS input streams or split TS streams may have a large number of null-packets present in order to accommodate VBR (variable bit-rate) services in a CBR TS stream. In this case, in order to avoid unnecessary transmission overhead, null-packets can be identified and not transmitted. In the receiver, removed null-packets can be re-inserted in the exact place where they were originally by reference to a deleted null-packet (DNP) counter that is inserted in the transmission, thus guaranteeing constant bit-rate and avoiding the need for time-stamp (PCR) updating.

The head compression block 3040 can provide packet header compression to increase transmission efficiency for TS or IP input streams. Because the receiver can have a priori information on certain parts of the header, this known information can be deleted in the transmitter.

For Transport Stream, the receiver has a-priori information about the sync-byte configuration (0x47) and the packet length (188 Byte). If the input TS stream carries content that has only one PID, i.e., for only one service component (video, audio, etc.) or service sub-component (SVC base layer, SVC enhancement layer, MVC base view or MVC dependent views), TS packet header compression can be applied (optionally) to the Transport Stream. IP packet header compression is used optionally if the input steam is an IP stream.

The above-described blocks may be omitted or replaced by blocks having similar or identical functions.

FIG. 4 illustrates an input formatting block according to another embodiment of the present invention. The input formatting block illustrated in FIG. 4 corresponds to an embodiment of the input formatting block 1000 described with reference to FIG. 1.

FIG. 4 illustrates a stream adaptation block of the input formatting module when the input signal corresponds to multiple input streams.

Referring to FIG. 4, the mode adaptation block for respectively processing the multiple input streams can include a scheduler 4000, an 1-Frame delay block 4010, a stuffing insertion block 4020, an in-band signaling 4030, a BB Frame scrambler 4040, a PLS generation block 4050 and a PLS scrambler 4060. Description will be given of each block of the stream adaptation block.

Operations of the stuffing insertion block 4020, the BB Frame scrambler 4040, the PLS generation block 4050 and the PLS scrambler 4060 correspond to those of the stuffing insertion block, BB scrambler, PLS generation block and the PLS scrambler described with reference to FIG. 2 and thus description thereof is omitted.

The scheduler 4000 can determine the overall cell allocation across the entire frame from the amount of FEC-BLOCKs of each DP. Including the allocation for PLS, EAC and FIC, the scheduler generate the values of PLS2-DYN data, which is transmitted as in-band signaling or PLS cell in FSS of the frame.

Details of FECBLOCK, EAC and FIC will be described later.

The 1-Frame delay block 4010 can delay the input data by one transmission frame such that scheduling information about the next frame can be transmitted through the current frame for in-band signaling information to be inserted into the DPs.

The in-band signaling 4030 can insert un-delayed part of the PLS2 data into a DP of a frame.

The above-described blocks may be omitted or replaced by blocks having similar or identical functions.

FIG. 5 illustrates a BICM block according to an embodiment of the present invention.

The BICM block illustrated in FIG. 5 corresponds to an embodiment of the BICM block 1010 described with reference to FIG. 1.

As described above, the apparatus for transmitting broadcast signals for future broadcast services according to an embodiment of the present invention can provide a terrestrial broadcast service, mobile broadcast service, UHDTV service, etc.

Since QoS (quality of service) depends on characteristics of a service provided by the apparatus for transmitting broadcast signals for future broadcast services according to an embodiment of the present invention, data corresponding to respective services needs to be processed through different schemes. Accordingly, the a BICM block according to an embodiment of the present invention can independently process DPs input thereto by independently applying SISO, MISO and MIMO schemes to the data pipes respectively corresponding to data paths. Consequently, the apparatus for transmitting broadcast signals for future broadcast services according to an embodiment of the present invention can control QoS for each service or service component transmitted through each DP.

(a) shows the BICM block shared by the base profile and the handheld profile and (b) shows the BICM block of the advanced profile.

The BICM block shared by the base profile and the handheld profile and the BICM block of the advanced profile can include plural processing blocks for processing each DP.

A description will be given of each processing block of the BICM block for the base profile and the handheld profile and the BICM block for the advanced profile.

A processing block 5000 of the BICM block for the base profile and the handheld profile can include a Data FEC encoder 5010, a bit interleaver 5020, a constellation mapper 5030, an SSD (Signal Space Diversity) encoding block 5040 and a time interleaver 5050.

The Data FEC encoder 5010 can perform the FEC encoding on the input BBF to generate FECBLOCK procedure using outer coding (BCH), and inner coding (LDPC). The outer coding (BCH) is optional coding method. Details of operations of the Data FEC encoder 5010 will be described later.

The bit interleaver 5020 can interleave outputs of the Data FEC encoder 5010 to achieve optimized performance with combination of the LDPC codes and modulation scheme while providing an efficiently implementable structure. Details of operations of the bit interleaver 5020 will be described later.

The constellation mapper 5030 can modulate each cell word from the bit interleaver 5020 in the base and the handheld profiles, or cell word from the Cell-word demultiplexer 5010-1 in the advanced profile using either QPSK, QAM-16, non-uniform QAM (NUQ-64, NUQ-256, NUQ-1024) or non-uniform constellation (NUC-16, NUC-64, NUC-256, NUC-1024) to give a power-normalized constellation point, $e_j$. This constellation mapping is applied only for DPs. Observe that QAM-16 and NUQs are square shaped, while NUCs have arbitrary shape. When each constellation is rotated by any multiple of 90 degrees, the rotated constellation exactly overlaps with its original one. This "rotation-sense" symmetric property makes the capacities and the average powers of the real and imaginary components equal to each other. Both NUQs and NUCs are defined specifically for each code rate and the particular one used is signaled by the parameter DP_MOD filed in PLS2 data.

The SSD encoding block 5040 can precode cells in two (2D), three (3D), and four (4D) dimensions to increase the reception robustness under difficult fading conditions.

The time interleaver 5050 can operates at the DP level. The parameters of time interleaving (TI) may be set differently for each DP. Details of operations of the time interleaver 5050 will be described later.

A processing block 5000-1 of the BICM block for the advanced profile can include the Data FEC encoder, bit Interleaver, constellation mapper, and time interleaver. However, the processing block 5000-1 is distinguished from the processing block 5000 further includes a cell-word demultiplexer 5010-1 and a MIMO encoding block 5020-1.

Also, the operations of the Data FEC encoder, bit interleaver, constellation mapper, and time interleaver in the processing block 5000-1 correspond to those of the Data FEC encoder 5010, bit interleaver 5020, constellation mapper 5030, and time interleaver 5050 described and thus description thereof is omitted.

The cell-word demultiplexer 5010-1 is used for the DP of the advanced profile to divide the single cell-word stream into dual cell-word streams for MIMO processing. Details of operations of the cell-word demultiplexer 5010-1 will be described later.

The MIMO encoding block 5020-1 can processing the output of the cell-word demultiplexer 5010-1 using MIMO encoding scheme. The MIMO encoding scheme was optimized for broadcasting signal transmission. The MIMO technology is a promising way to get a capacity increase but it depends on channel characteristics. Especially for broadcasting, the strong LOS component of the channel or a difference in the received signal power between two antennas caused by different signal propagation characteristics makes it difficult to get capacity gain from MIMO. The proposed MIMO encoding scheme overcomes this problem using a rotation-based pre-coding and phase randomization of one of the MIMO output signals.

MIMO encoding is intended for a 2×2 MIMO system requiring at least two antennas at both the transmitter and the receiver. Two MIMO encoding modes are defined in this proposal; full-rate spatial multiplexing (FR-SM) and full-rate full-diversity spatial multiplexing (FRFD-SM). The FR-SM encoding provides capacity increase with relatively small complexity increase at the receiver side while the FRFD-SM encoding provides capacity increase and additional diversity gain with a great complexity increase at the receiver side. The proposed MIMO encoding scheme has no restriction on the antenna polarity configuration.

MIMO processing is required for the advanced profile frame, which means all DPs in the advanced profile frame are processed by the MIMO encoder. MIMO processing is applied at DP level. Pairs of the Constellation Mapper outputs NUQ ($e_{1,i}$ and $e_{2,i}$) are fed to the input of the MIMO Encoder. Paired MIMO Encoder output (g1,i and g2,i) is transmitted by the same carrier k and OFDM symbol l of their respective TX antennas.

The above-described blocks may be omitted or replaced by blocks having similar or identical functions.

FIG. 6 illustrates a BICM block according to another embodiment of the present invention.

The BICM block illustrated in FIG. 6 corresponds to an embodiment of the BICM block 1010 described with reference to FIG. 1.

FIG. 6 illustrates a BICM block for protection of physical layer signaling (PLS), emergency alert channel (EAC) and fast information channel (FIC). EAC is a part of a frame that carries EAS information data and FIC is a logical channel in a frame that carries the mapping information between a service and the corresponding base DP. Details of the EAC and FIC will be described later.

Referring to FIG. 6, the BICM block for protection of PLS, EAC and FIC can include a PLS FEC encoder 6000, a bit interleaver 6010, a constellation mapper 6020 and time interleaver 6030.

Also, the PLS FEC encoder 6000 can include a scrambler, BCH encoding/zero insertion block, LDPC encoding block and LDPC parity puncturing block. Description will be given of each block of the BICM block.

The PLS FEC encoder 6000 can encode the scrambled PLS 1/2 data, EAC and FIC section.

The scrambler can scramble PLS1 data and PLS2 data before BCH encoding and shortened and punctured LDPC encoding.

The BCH encoding/zero insertion block can perform outer encoding on the scrambled PLS 1/2 data using the shortened BCH code for PLS protection and insert zero bits after the BCH encoding. For PLS1 data only, the output bits of the zero insertion may be permutted before LDPC encoding.

The LDPC encoding block can encode the output of the BCH encoding/zero insertion block using LDPC code. To generate a complete coded block, $C_{ldpc}$, parity bits, $P_{ldpc}$ are encoded systematically from each zero-inserted PLS information block, $I_{ldpc}$ and appended after it.

$$C_{ldpc} = [I_{ldpc} P_{ldpc}] = [i_0, i_1, \ldots, i_{K_{ldpc}-1}, p_0, p_1, \ldots, p_{N_{ldpc}-K_{ldpc}-1}]$$  [Math Figure 1]

TABLE 4

| Signaling Type | $K_{sig}$ | $K_{bch}$ | $N_{bch\_parity}$ | $K_{ldpc}$ $(=N_{bch})$ | $N_{ldpc}$ | $N_{ldpc\_parity}$ | code rate | $Q_{ldpc}$ |
|---|---|---|---|---|---|---|---|---|
| PLS1 | 342 | 1020 | 60 | 1080 | 4320 | 3240 | 1/4 | 36 |
| PLS2 | <1021 | | | | | | | |
| | >1020 | 2100 | | 2160 | 7200 | 5040 | 3/10 | 56 |

The LDPC code parameters for PLS1 and PLS2 are as following table 4.

The LDPC parity puncturing block can perform puncturing on the PLS1 data and PLS 2 data.

When shortening is applied to the PLS1 data protection, some LDPC parity bits are punctured after LDPC encoding. Also, for the PLS2 data protection, the LDPC parity bits of PLS2 are punctured after LDPC encoding. These punctured bits are not transmitted.

The bit interleaver 6010 can interleave the each shortened and punctured PLS1 data and PLS2 data.

The constellation mapper 6020 can map the bit interleaved PLS1 data and PLS2 data onto constellations.

The time interleaver 6030 can interleave the mapped PLS1 data and PLS2 data.

The above-described blocks may be omitted or replaced by blocks having similar or identical functions.

FIG. 7 illustrates a frame building block according to one embodiment of the present invention.

The frame building block illustrated in FIG. 7 corresponds to an embodiment of the frame building block 1020 described with reference to FIG. 1.

Referring to FIG. 7, the frame building block can include a delay compensation block 7000, a cell mapper 7010 and a frequency interleaver 7020. Description will be given of each block of the frame building block.

The delay compensation block 7000 can adjust the timing between the data pipes and the corresponding PLS data to ensure that they are co-timed at the transmitter end. The PLS data is delayed by the same amount as data pipes are by addressing the delays of data pipes caused by the Input Formatting block and BICM block. The delay of the BICM block is mainly due to the time interleaver. In-band signaling data carries information of the next TI group so that they are carried one frame ahead of the DPs to be signaled. The Delay Compensating block delays in-band signaling data accordingly.

The cell mapper 7010 can map PLS, EAC, FIC, DPs, auxiliary streams and dummy cells into the active carriers of the OFDM symbols in the frame. The basic function of the cell mapper 7010 is to map data cells produced by the TIs for each of the DPs, PLS cells, and EAC/FIC cells, if any, into arrays of active OFDM cells corresponding to each of the OFDM symbols within a frame. Service signaling data (such as PSI (program specific information)/SI) can be separately gathered and sent by a data pipe. The Cell Mapper operates according to the dynamic information produced by the scheduler and the configuration of the frame structure. Details of the frame will be described later.

The frequency interleaver 7020 can randomly interleave data cells received from the cell mapper 7010 to provide frequency diversity. Also, the frequency interleaver 7020 can operate on very OFDM symbol pair comprised of two sequential OFDM symbols using a different interleaving-seed order to get maximum interleaving gain in a single frame. Details of operations of the frequency interleaver 7020 will be described later.

The above-described blocks may be omitted or replaced by blocks having similar or identical functions.

FIG. 8 illustrates an OFMD generation block according to an embodiment of the present invention.

The OFMD generation block illustrated in FIG. 8 corresponds to an embodiment of the OFMD generation block 1030 described with reference to FIG. 1.

The OFDM generation block modulates the OFDM carriers by the cells produced by the Frame Building block, inserts the pilots, and produces the time domain signal for transmission. Also, this block subsequently inserts guard intervals, and applies PAPR (Peak-to-Average Power Radio) reduction processing to produce the final RF signal Referring to FIG. 8, the frame building block can include a pilot and reserved tone insertion block 8000, a 2D-eSFN encoding block 8010, an IFFT (Inverse Fast Fourier Transform) block 8020, a PAPR reduction block 8030, a guard interval insertion block 8040, a preamble insertion block 8050, other system insertion block 8060 and a DAC block 8070. Description will be given of each block of the frame building block.

The pilot and reserved tone insertion block 8000 can insert pilots and the reserved tone.

Various cells within the OFDM symbol are modulated with reference information, known as pilots, which have transmitted values known a priori in the receiver. The information of pilot cells is made up of scattered pilots, continual pilots, edge pilots, FSS (frame signaling symbol) pilots and FES (frame edge symbol) pilots. Each pilot is transmitted at a particular boosted power level according to pilot type and pilot pattern. The value of the pilot information is derived from a reference sequence, which is a series of values, one for each transmitted carrier on any given symbol. The pilots can be used for frame synchronization, frequency synchronization, time synchronization, channel estimation, and transmission mode identification, and also can be used to follow the phase noise.

Reference information, taken from the reference sequence, is transmitted in scattered pilot cells in every symbol except the preamble, FSS and FES of the frame. Continual pilots are inserted in every symbol of the frame. The number and location of continual pilots depends on both the FFT size and the scattered pilot pattern. The edge carriers are edge pilots in every symbol except for the preamble symbol. They are inserted in order to allow frequency interpolation up to the edge of the spectrum. FSS pilots are inserted in FSS(s) and FES pilots are inserted in FES. They are inserted in order to allow time interpolation up to the edge of the frame.

The system according to an embodiment of the present invention supports the SFN network, where distributed MISO scheme is optionally used to support very robust transmission mode. The 2D-eSFN is a distributed MISO scheme that uses multiple TX antennas, each of which is located in the different transmitter site in the SFN network.

The 2D-eSFN encoding block 8010 can process a 2D-eSFN processing to distorts the phase of the signals transmitted from multiple transmitters, in order to create both time and frequency diversity in the SFN configuration. Hence, burst errors due to low flat fading or deep-fading for a long time can be mitigated.

The IFFT block 8020 can modulate the output from the 2D-eSFN encoding block 8010 using OFDM modulation scheme. Any cell in the data symbols which has not been designated as a pilot (or as a reserved tone) carries one of the data cells from the frequency interleaver. The cells are mapped to OFDM carriers.

The PAPR reduction block 8030 can perform a PAPR reduction on input signal using various PAPR reduction algorithm in the time domain.

The guard interval insertion block 8040 can insert guard intervals and the preamble insertion block 8050 can insert preamble in front of the signal. Details of a structure of the preamble will be described later. The other system insertion block 8060 can multiplex signals of a plurality of broadcast transmission/reception systems in the time domain such that data of two or more different broadcast transmission/reception systems providing broadcast services can be simultaneously transmitted in the same RF signal bandwidth. In this case, the two or more different broadcast transmission/reception systems refer to systems providing different broadcast services. The different broadcast services may refer to a terrestrial broadcast service, mobile broadcast service, etc. Data related to respective broadcast services can be transmitted through different frames.

The DAC block 8070 can convert an input digital signal into an analog signal and output the analog signal. The signal output from the DAC block 7800 can be transmitted through multiple output antennas according to the physical layer profiles. A Tx antenna according to an embodiment of the present invention can have vertical or horizontal polarity.

Each bit interleaved group is de-multiplexed at bit level in a group before constellation mapping. There are 2 mapping rules depending on modulation order. In case BPSK and QPSK, the bit reliability in a symbol has same quality. Therefore, the bit group read out from bit interleaving block is mapped to QAM symbol without any operation. In case of QAM-16 and NUQ-64 when they are mapped to QAM symbol, their bits are cyclic shifted in a group. The cyclic value is increased by 1 at every bit group. The operation rule follow such that:

$$S_{demux\_in}(i) = \{b_i(0), b_i(1), b_i(2), \ldots, b_i(\eta_{MOD}-1)\},$$

$$S_{demux\_out}(i) = \{c_i(0), c_i(1), c_i(2), \ldots, c_i(\eta_{MOD}-1)\},$$

$$c_i(1) = b_i(i \% \eta_{MOD}), c_i(2) = b_i((i+1) \% \eta_{MOD}), \ldots,$$
$$c_i(\eta_{MOD}-1) = b_i((i+1) \% \eta_{MOD})$$

Where i is bit group index corresponding to column index in bit interleaving.

The above-described blocks may be omitted or replaced by blocks having similar or identical functions according to design.

FIG. 9 illustrates a structure of an apparatus for receiving broadcast signals for future broadcast services according to an embodiment of the present invention.

The apparatus for receiving broadcast signals for future broadcast services according to an embodiment of the present invention can correspond to the apparatus for transmitting broadcast signals for future broadcast services, described with reference to FIG. 1.

The apparatus for receiving broadcast signals for future broadcast services according to an embodiment of the present invention can include a synchronization & demodulation module 9000, a frame parsing module 9010, a demapping & decoding module 9020, an output processor 9030 and a signaling decoding module 9040. A description will be given of operation of each module of the apparatus for receiving broadcast signals.

The synchronization & demodulation module 9000 can receive input signals through m Rx antennas, perform signal detection and synchronization with respect to a system corresponding to the apparatus for receiving broadcast signals and carry out demodulation corresponding to a reverse procedure of the procedure performed by the apparatus for transmitting broadcast signals.

The frame parsing module 9100 can parse input signal frames and extract data through which a service selected by a user is transmitted. If the apparatus for transmitting broadcast signals performs interleaving, the frame parsing module 9100 can carry out deinterleaving corresponding to a reverse procedure of interleaving. In this case, the positions of a signal and data that need to be extracted can be obtained by decoding data output from the signaling decoding module 9400 to restore scheduling information generated by the apparatus for transmitting broadcast signals.

The demapping & decoding module 9200 can convert the input signals into bit domain data and then deinterleave the same as necessary. The demapping & decoding module 9200 can perform demapping for mapping applied for transmission efficiency and correct an error generated on a transmission channel through decoding. In this case, the demapping & decoding module 9200 can obtain transmission parameters necessary for demapping and decoding by decoding the data output from the signaling decoding module 9400.

The output processor 9300 can perform reverse procedures of various compression/signal processing procedures which are applied by the apparatus for transmitting broadcast signals to improve transmission efficiency. In this case, the output processor 9300 can acquire necessary control information from data output from the signaling decoding module 9400. The output of the output processor 8300 corresponds to a signal input to the apparatus for transmitting broadcast signals and may be MPEG-TSs, IP streams (v4 or v6) and generic streams.

The signaling decoding module 9400 can obtain PLS information from the signal demodulated by the synchronization & demodulation module 9000. As described above, the frame parsing module 9100, demapping & decoding module 9200 and output processor 9300 can execute functions thereof using the data output from the signaling decoding module 9400.

FIG. 10 illustrates a frame structure according to an embodiment of the present invention.

FIG. 10 shows an example configuration of the frame types and FRUs in a super-frame. (a) shows a super frame according to an embodiment of the present invention, (b) shows FRU (Frame Repetition Unit) according to an embodiment of the present invention, (c) shows frames of variable PHY profiles in the FRU and (d) shows a structure of a frame.

A super-frame may be composed of eight FRUs. The FRU is a basic multiplexing unit for TDM of the frames, and is repeated eight times in a super-frame.

Each frame in the FRU belongs to one of the PHY profiles, (base, handheld, advanced) or FEF. The maximum allowed number of the frames in the FRU is four and a given PHY profile can appear any number of times from zero times to four times in the FRU (e.g., base, base, handheld, advanced). PHY profile definitions can be extended using reserved values of the PHY_PROFILE in the preamble, if required.

The FEF part is inserted at the end of the FRU, if included. When the FEF is included in the FRU, the minimum number of FEFs is 8 in a super-frame. It is not recommended that FEF parts be adjacent to each other.

One frame is further divided into a number of OFDM symbols and a preamble. As shown in (d), the frame comprises a preamble, one or more frame signaling symbols (FSS), normal data symbols and a frame edge symbol (FES).

The preamble is a special symbol that enables fast Futurecast UTB system signal detection and provides a set of basic transmission parameters for efficient transmission and reception of the signal. The detailed description of the preamble will be will be described later.

The main purpose of the FSS(s) is to carry the PLS data. For fast synchronization and channel estimation, and hence fast decoding of PLS data, the FSS has more dense pilot pattern than the normal data symbol. The FES has exactly the same pilots as the FSS, which enables frequency-only interpolation within the FES and temporal interpolation, without extrapolation, for symbols immediately preceding the FES.

FIG. 11 illustrates a signaling hierarchy structure of the frame according to an embodiment of the present invention.

FIG. 11 illustrates the signaling hierarchy structure, which is split into three main parts: the preamble signaling data 11000, the PLS1 data 11010 and the PLS2 data 11020. The purpose of the preamble, which is carried by the preamble symbol in every frame, is to indicate the transmission type and basic transmission parameters of that frame. The PLS1 enables the receiver to access and decode the PLS2 data, which contains the parameters to access the DP of interest. The PLS2 is carried in every frame and split into two main parts: PLS2-STAT data and PLS2-DYN data. The static and dynamic portion of PLS2 data is followed by padding, if necessary.

FIG. 12 illustrates preamble signaling data according to an embodiment of the present invention.

Preamble signaling data carries 21 bits of information that are needed to enable the receiver to access PLS data and trace DPs within the frame structure. Details of the preamble signaling data are as follows:

PHY_PROFILE: This 3-bit field indicates the PHY profile type of the current frame. The mapping of different PHY profile types is given in below table 5.

TABLE 5

| Value | PHY Profile |
| --- | --- |
| 000 | Base profile |
| 001 | Handheld profile |
| 010 | Advanced profiled |

TABLE 5-continued

| Value | PHY Profile |
| --- | --- |
| 011~110 | Reserved |
| 111 | FEF |

FFT_SIZE: This 2 bit field indicates the FFT size of the current frame within a frame-group, as described in below table 6.

TABLE 6

| Value | FFT size |
| --- | --- |
| 00 | 8K FFT |
| 01 | 16K FFT |
| 10 | 32K FFT |
| 11 | Reserved |

GI_FRACTION: This 3 bit field indicates the guard interval fraction value in the current super-frame, as described in below table 7.

TABLE 7

| Value | GI_FRACTION |
| --- | --- |
| 000 | 1/5 |
| 001 | 1/10 |
| 010 | 1/20 |
| 011 | 1/40 |
| 100 | 1/80 |
| 101 | 1/160 |
| 110~111 | Reserved |

EAC_FLAG: This 1 bit field indicates whether the EAC is provided in the current frame. If this field is set to '1', emergency alert service (EAS) is provided in the current frame. If this field set to '0', EAS is not carried in the current frame. This field can be switched dynamically within a super-frame.

PILOT_MODE: This 1-bit field indicates whether the pilot mode is mobile mode or fixed mode for the current frame in the current frame-group. If this field is set to '0', mobile pilot mode is used. If the field is set to '1', the fixed pilot mode is used.

PAPR_FLAG: This 1-bit field indicates whether PAPR reduction is used for the current frame in the current frame-group. If this field is set to value '1', tone reservation is used for PAPR reduction. If this field is set to '0', PAPR reduction is not used.

FRU_CONFIGURE: This 3-bit field indicates the PHY profile type configurations of the frame repetition units (FRU) that are present in the current super-frame. All profile types conveyed in the current super-frame are identified in this field in all preambles in the current super-frame. The 3-bit field has a different definition for each profile, as show in below table 8.

TABLE 8

| | Current PHY_PROFILE = '000' (base) | Current PHY_PROFILE = '001' (handheld) | Current PHY_PROFILE = '010' (advanced) | Current PHY_PROFILE = '111' (FEF) |
|---|---|---|---|---|
| FRU_CONFIGURE = 000 | Only base profile present | Only handheld profile present | Only advanced profile present | Only FEF present |
| FRU_CONFIGURE = 1XX | Handheld profile present | Base profile present | Base profile present | Base profile present |
| FRU_CONFIGURE = X1X | Advanced profile present | Advanced profile present | Handheld profile present | Handheld profile present |
| FRU_CONFIGURE = XX1 | FEF present | FEF present | FEF present | Advanced profile present |

RESERVED: This 7-bit field is reserved for future use.

FIG. 13 illustrates PLS1 data according to an embodiment of the present invention.

PLS1 data provides basic transmission parameters including parameters required to enable the reception and decoding of the PLS2. As above mentioned, the PLS1 data remain unchanged for the entire duration of one frame-group. The detailed definition of the signaling fields of the PLS1 data are as follows:

PREAMBLE_DATA: This 20-bit field is a copy of the preamble signaling data excluding the EAC_FLAG.

NUM_FRAME_FRU: This 2-bit field indicates the number of the frames per FRU.

PAYLOAD_TYPE: This 3-bit field indicates the format of the payload data carried in the frame-group.

PAYLOAD_TYPE is signaled as shown in table 9.

TABLE 9

| value | Payload type |
|---|---|
| 1XX | TS stream is transmitted |
| X1X | IP stream is transmitted |
| XX1 | GS stream is transmitted |

NUM_FSS: This 2-bit field indicates the number of FSS symbols in the current frame.

SYSTEM_VERSION: This 8-bit field indicates the version of the transmitted signal format. The SYSTEM_VERSION is divided into two 4-bit fields, which are a major version and a minor version.

Major version: The MSB four bits of SYSTEM_VERSION field indicate major version information. A change in the major version field indicates a non-backward-compatible change. The default value is '0000'. For the version described in this standard, the value is set to '0000'.

Minor version: The LSB four bits of SYSTEM_VERSION field indicate minor version information. A change in the minor version field is backward-compatible.

CELL_ID: This is a 16-bit field which uniquely identifies a geographic cell in an ATSC network. An ATSC cell coverage area may consist of one or more frequencies, depending on the number of frequencies used per Futurecast UTB system. If the value of the CELL_ID is not known or unspecified, this field is set to '0'.

NETWORK_ID: This is a 16-bit field which uniquely identifies the current ATSC network.

SYSTEM_ID: This 16-bit field uniquely identifies the Futurecast UTB system within the ATSC network. The Futurecast UTB system is the terrestrial broadcast system whose input is one or more input streams (TS, IP, GS) and whose output is an RF signal. The Futurecast UTB system carries one or more PHY profiles and FEF, if any. The same Futurecast UTB system may carry different input streams and use different RF frequencies in different geographical areas, allowing local service insertion. The frame structure and scheduling is controlled in one place and is identical for all transmissions within a Futurecast UTB system. One or more Futurecast UTB systems may have the same SYSTEM_ID meaning that they all have the same physical layer structure and configuration.

The following loop consists of FRU_PHY_PROFILE, FRU_FRAME_LENGTH, FRU_GI_FRACTION, and RESERVED which are used to indicate the FRU configuration and the length of each frame type. The loop size is fixed so that four PHY profiles (including a FEF) are signaled within the FRU. If NUM_FRAME_FRU is less than 4, the unused fields are filled with zeros.

FRU_PHY_PROFILE: This 3-bit field indicates the PHY profile type of the $(i+1)^{th}$ (i is the loop index) frame of the associated FRU. This field uses the same signaling format as shown in the table 8.

FRU_FRAME_LENGTH: This 2-bit field indicates the length of the $(i+1)^{th}$ frame of the associated FRU. Using FRU_FRAME_LENGTH together with FRU_GI_FRACTION, the exact value of the frame duration can be obtained.

FRU_GI_FRACTION: This 3-bit field indicates the guard interval fraction value of the $(i+1)^{th}$ frame of the associated FRU. FRU_GI_FRACTION is signaled according to the table 7.

RESERVED: This 4-bit field is reserved for future use.

The following fields provide parameters for decoding the PLS2 data.

PLS2_FEC_TYPE: This 2-bit field indicates the FEC type used by the PLS2 protection. The FEC type is signaled according to table 10. The details of the LDPC codes will be described later.

TABLE 10

| Content | PLS2 FEC type |
|---|---|
| 00 | 4K-1/4 and 7K-3/10 LDPC codes |
| 01~11 | Reserved |

PLS2_MOD: This 3-bit field indicates the modulation type used by the PLS2. The modulation type is signaled according to table 11.

TABLE 11

| Value | PLS2_MODE |
|---|---|
| 000 | BPSK |
| 001 | QPSK |
| 010 | QAM-16 |
| 011 | NUQ-64 |
| 100~111 | Reserved |

PLS2_SIZE_CELL: This 15-bit field indicates $C_{total\_partial\_block}$, the size (specified as the number of QAM cells) of the collection of full coded blocks for PLS2 that is carried in the current frame-group. This value is constant during the entire duration of the current frame-group.

PLS2_STAT_SIZE_BIT: This 14-bit field indicates the size, in bits, of the PLS2-STAT for the current frame-group. This value is constant during the entire duration of the current frame-group.

PLS2_DYN_SIZE_BIT: This 14-bit field indicates the size, in bits, of the PLS2-DYN for the current frame-group. This value is constant during the entire duration of the current frame-group.

PLS2_REP_FLAG: This 1-bit flag indicates whether the PLS2 repetition mode is used in the current frame-group. When this field is set to value '1', the PLS2 repetition mode is activated. When this field is set to value '0', the PLS2 repetition mode is deactivated.

PLS2_REP_SIZE_CELL: This 15-bit field indicates $C_{total\_partial\_block}$, the size (specified as the number of QAM cells) of the collection of partial coded blocks for PLS2 carried in every frame of the current frame-group, when PLS2 repetition is used. If repetition is not used, the value of this field is equal to 0. This value is constant during the entire duration of the current frame-group.

PLS2 NEXT_FEC_TYPE: This 2-bit field indicates the FEC type used for PLS2 that is carried in every frame of the next frame-group. The FEC type is signaled according to the table 10.

PLS2 NEXT_MOD: This 3-bit field indicates the modulation type used for PLS2 that is carried in every frame of the next frame-group. The modulation type is signaled according to the table 11.

PLS2_NEXT_REP_FLAG: This 1-bit flag indicates whether the PLS2 repetition mode is used in the next frame-group. When this field is set to value '1', the PLS2 repetition mode is activated. When this field is set to value '0', the PLS2 repetition mode is deactivated.

PLS2_NEXT_REP_SIZE_CELL: This 15-bit field indicates $C_{total\_full\_block}$. The size (specified as the number of QAM cells) of the collection of full coded blocks for PLS2 that is carried in every frame of the next frame-group, when PLS2 repetition is used. If repetition is not used in the next frame-group, the value of this field is equal to 0. This value is constant during the entire duration of the current frame-group.

PLS2_NEXT_REP_STAT_SIZE_BIT: This 14-bit field indicates the size, in bits, of the PLS2-STAT for the next frame-group. This value is constant in the current frame-group.

PLS2_NEXT_REP_DYN_SIZE_BIT: This 14-bit field indicates the size, in bits, of the PLS2-DYN for the next frame-group. This value is constant in the current frame-group.

PLS2_AP_MODE: This 2-bit field indicates whether additional parity is provided for PLS2 In the current frame-group. This value is constant during the entire duration of the current frame-group. The below table 12 gives the values of this field. When this field is set to '00', additional parity is not used for the PLS2 in the current frame-group.

TABLE 12

| Value | PLS2-AP mode |
|---|---|
| 00 | AP is not provided |
| 01 | AP1 mode |
| 10~11 | Reserved |

PLS2_AP_SIZE_CELL: This 15-bit field indicates the size (specified as the number of QAM cells) of the additional parity bits of the PLS2. This value is constant during the entire duration of the current frame-group.

PLS2_NEXT_AP_MODE: This 2-bit field indicates whether additional parity is provided for PLS2 signaling in every frame of next frame-group. This value is constant during the entire duration of the current frame-group. The table 12 defines the values of this field PLS2_NEXT_AP_SIZE_CELL: This 15-bit field indicates the size (specified as the number of QAM cells) of the additional parity bits of the PLS2 in every frame of the next frame-group. This value is constant during the entire duration of the current frame-group.

RESERVED: This 32-bit field is reserved for future use.

CRC_32: A 32-bit error detection code, which is applied to the entire PLS1 signaling.

FIG. 14 illustrates PLS2 data according to an embodiment of the present invention.

FIG. 14 illustrates PLS2-STAT data of the PLS2 data. The PLS2-STAT data are the same within a frame-group, while the PLS2-DYN data provide information that is specific for the current frame.

The details of fields of the PLS2-STAT data are as follows:

FIC_FLAG: This 1-bit field indicates whether the FIC is used in the current frame-group. If this field is set to '1', the FIC is provided in the current frame. If this field set to '0', the FIC is not carried in the current frame. This value is constant during the entire duration of the current frame-group.

AUX_FLAG: This 1-bit field indicates whether the auxiliary stream(s) is used in the current frame-group. If this field is set to '1', the auxiliary stream is provided in the current frame. If this field set to '0', the auxiliary stream is not carried in the current frame. This value is constant during the entire duration of current frame-group.

NUM_DP: This 6-bit field indicates the number of DPs carried within the current frame. The value of this field ranges from 1 to 64, and the number of DPs is NUM_DP+1.

DP_ID: This 6-bit field identifies uniquely a DP within a PHY profile.

DP_TYPE: This 3-bit field indicates the type of the DP. This is signaled according to the below table 13.

TABLE 13

| Value | DP Type |
|---|---|
| 000 | DP Type 1 |
| 001 | DP Type 2 |
| 010~111 | reserved |

DP_GROUP_ID: This 8-bit field identifies the DP group with which the current DP is associated. This can be used by a receiver to access the DPs of the service components associated with a particular service, which will have the same DP_GROUP_ID.

BASE_DP_ID: This 6-bit field indicates the DP carrying service signaling data (such as PSI/SI) used in the Management layer. The DP indicated by BASE_DP_ID may be either a normal DP carrying the service signaling data along with the service data or a dedicated DP carrying only the service signaling data DP_FEC_TYPE: This 2-bit field indicates the FEC type used by the associated DP. The FEC type is signaled according to the below table 14.

TABLE 14

| Value | FEC_TYPE |
| --- | --- |
| 00 | 16K LDPC |
| 01 | 64K LDPC |
| 10~11 | Reserved |

DP_COD: This 4-bit field indicates the code rate used by the associated DP. The code rate is signaled according to the below table 15.

TABLE 15

| Value | Code rate |
| --- | --- |
| 0000 | 5/15 |
| 0001 | 6/15 |
| 0010 | 7/15 |
| 0011 | 8/15 |
| 0100 | 9/15 |
| 0101 | 10/15 |
| 0110 | 11/15 |
| 0111 | 12/15 |
| 1000 | 13/15 |
| 1001~1111 | Reserved |

DP_MOD: This 4-bit field indicates the modulation used by the associated DP. The modulation is signaled according to the below table 16.

TABLE 16

| Value | Modulation |
| --- | --- |
| 0000 | QPSK |
| 0001 | QAM-16 |
| 0010 | NUQ-64 |
| 0011 | NUQ-256 |
| 0100 | NUQ-1024 |
| 0101 | NUC-16 |
| 0110 | NUC-64 |
| 0111 | NUC-256 |
| 1000 | NUC-1024 |
| 1001~1111 | reserved |

DP_SSD_FLAG: This 1-bit field indicates whether the SSD mode is used in the associated DP. If this field is set to value '1', SSD is used. If this field is set to value '0', SSD is not used.

The following field appears only if PHY_PROFILE is equal to '010', which indicates the advanced profile:

DP_MIMO: This 3-bit field indicates which type of MIMO encoding process is applied to the associated DP. The type of MIMO encoding process is signaled according to the table 17.

TABLE 17

| Value | MIMO encoding |
| --- | --- |
| 000 | FR-SM |
| 001 | FRFD-SM |
| 010~111 | reserved |

DP_TI_TYPE: This 1-bit field indicates the type of time-interleaving. A value of '0' indicates that one TI group corresponds to one frame and contains one or more TI-blocks. A value of '1' indicates that one TI group is carried in more than one frame and contains only one TI-block.

DP_TI_LENGTH: The use of this 2-bit field (the allowed values are only 1, 2, 4, 8) is determined by the values set within the DP_TI_TYPE field as follows:

If the DP_TI_TYPE is set to the value '1', this field indicates $P_I$ the number of the frames to which each TI group is mapped, and there is one TI-block per TI group ($N_{TI}$=1). The allowed $P_I$ values with 2-bit field are defined in the below table 18.

If the DP_TI_TYPE is set to the value '0', this field indicates the number of TI-blocks $N_{TI}$ per TI group, and there is one TI group per frame ($P_I$=1). The allowed $P_I$ values with 2-bit field are defined in the below table 18.

TABLE 18

| 2-bit field | $P_I$ | $N_{TI}$ |
| --- | --- | --- |
| 00 | 1 | 1 |
| 01 | 2 | 2 |
| 10 | 4 | 3 |
| 11 | 8 | 4 |

DP_FRAME_INTERVAL: This 2-bit field indicates the frame interval ($I_{JUMP}$) within the frame-group for the associated DP and the allowed values are 1, 2, 4, 8 (the corresponding 2-bit field is '00', '01', '10', or '11', respectively). For DPs that do not appear every frame of the frame-group, the value of this field is equal to the interval between successive frames. For example, if a DP appears on the frames 1, 5, 9, 13, etc., this field is set to '4'. For DPs that appear in every frame, this field is set to '1'.

DP_TI_BYPASS: This 1-bit field determines the availability of time interleaver. If time interleaving is not used for a DP, it is set to '1'. Whereas if time interleaving is used it is set to '0'.

DP_FIRST_FRAME_IDX: This 5-bit field indicates the index of the first frame of the super-frame in which the current DP occurs. The value of DP_FIRST_FRAME_IDX ranges from 0 to 31

DP_NUM_BLOCK_MAX: This 10-bit field indicates the maximum value of DP_NUM_BLOCKS for this DP. The value of this field has the same range as DP_NUM_BLOCKS.

DP_PAYLOAD_TYPE: This 2-bit field indicates the type of the payload data carried by the given DP. DP_PAYLOAD_TYPE is signaled according to the below table 19.

TABLE 19

| Value | Payload Type |
| --- | --- |
| 00 | TS. |
| 01 | IP |
| 10 | GS |
| 11 | reserved |

DP_INBAND_MODE: This 2-bit field indicates whether the current DP carries in-band signaling information. The in-band signaling type is signaled according to the below table 20.

TABLE 20

| Value | In-band mode |
|---|---|
| 00 | In-band signaling is not carried. |
| 01 | INBAND-PLS is carried only |
| 10 | INBAND-ISSY is carried only |
| 11 | INBAND-PLS and INBAND-ISSY are carried |

DP_PROTOCOL_TYPE: This 2-bit field indicates the protocol type of the payload carried by the given DP. It is signaled according to the below table 21 when input payload types are selected.

TABLE 21

| Value | If DP_PAYLOAD_TYPE Is TS | If DP_PAYLOAD_TYPE Is IP | If DP_PAYLOAD_TYPE Is GS |
|---|---|---|---|
| 00 | MPEG2-TS | IPv4 | (Note) |
| 01 | Reserved | IPv6 | Reserved |
| 10 | Reserved | Reserved | Reserved |
| 11 | Reserved | Reserved | Reserved |

DP_CRC_MODE: This 2-bit field indicates whether CRC encoding is used in the Input Formatting block.

The CRC mode is signaled according to the below table 22.

TABLE 22

| Value | CRC mode |
|---|---|
| 00 | Not used |
| 01 | CRC-8 |
| 10 | CRC-16 |
| 11 | CRC-32 |

DNP_MODE: This 2-bit field indicates the null-packet deletion mode used by the associated DP when DP_PAYLOAD_TYPE is set to TS ('00'). DNP_MODE is signaled according to the below table 23. If DP_PAYLOAD_TYPE is not TS ('00'), DNP_MODE is set to the value '00'.

TABLE 23

| Value | Null-packet deletion mode |
|---|---|
| 00 | Not used |
| 01 | DNP-NORMAL |
| 10 | DNP-OFFSET |
| 11 | reserved |

ISSY_MODE: This 2-bit field indicates the ISSY mode used by the associated DP when DP_PAYLOAD_TYPE is set to TS ('00'). The ISSY_MODE is signaled according to the below table 24 If DP_PAYLOAD_TYPE is not TS ('00'), ISSY_MODE is set to the value '00'.

TABLE 24

| Value | ISSY mode |
|---|---|
| 00 | Not used |
| 01 | ISSY-UP |
| 10 | ISSY-BBF |
| 11 | reserved |

HC_MODE_TS: This 2-bit field indicates the TS header compression mode used by the associated DP when DP_PAYLOAD_TYPE is set to TS ('00'). The HC_MODE_TS is signaled according to the below table 25.

TABLE 25

| Value | Header compression mode |
|---|---|
| 00 | HC_MODE_TS 1 |
| 01 | HC_MODE_TS 2 |
| 10 | HC_MODE_TS 3 |
| 11 | HC_MODE_TS 4 |

HC_MODE_IP: This 2-bit field indicates the IP header compression mode when DP_PAYLOAD_TYPE is set to IP ('01'). The HC_MODE_IP is signaled according to the below table 26.

TABLE 26

| Value | Header compression mode |
|---|---|
| 00 | No compression |
| 01 | HC_MODE_IP 1 |
| 10~11 | reserved |

PID: This 13-bit field indicates the PID number for TS header compression when DP_PAYLOAD_TYPE is set to TS ('00') and HC_MODE_TS is set to '01' or '10'.

RESERVED: This 8-bit field is reserved for future use.

The following field appears only if FIC_FLAG is equal to '1':

FIC_VERSION: This 8-bit field indicates the version number of the FIC

FIC_LENGTH_BYTE: This 13-bit field indicates the length, in bytes, of the FIC RESERVED: This 8-bit field is reserved for future use.

The following field appears only if AUX_FLAG is equal to '1':

NUM_AUX: This 4-bit field indicates the number of auxiliary streams. Zero means no auxiliary streams are used.

AUX_CONFIG_RFU: This 8-bit field is reserved for future use.

AUX_STREAM_TYPE: This 4-bit is reserved for future use for indicating the type of the current auxiliary stream.

AUX_PRIVATE_CONFIG: This 28-bit field is reserved for future use for signaling auxiliary streams.

FIG. 15 illustrates PLS2 data according to another embodiment of the present invention.

FIG. 15 illustrates PLS2-DYN data of the PLS2 data. The values of the PLS2-DYN data may change during the duration of one frame-group, while the size of fields remains constant The details of fields of the PLS2-DYN data are as follows:

FRAME_INDEX: This 5-bit field indicates the frame index of the current frame within the super-frame. The index of the first frame of the super-frame is set to '0'.

PLS_CHANGE_COUNTER: This 4-bit field indicates the number of super-frames ahead where the configuration will change. The next super-frame with changes in the configuration is indicated by the value signaled within this field. If this field is set to the value '0000', it means that no scheduled change is foreseen: e.g., value '1' indicates that there is a change in the next super-frame.

FIC_CHANGE_COUNTER: This 4-bit field indicates the number of super-frames ahead where the configuration (i.e., the contents of the FIC) will change. The next super-frame with changes in the configuration is indicated by the value signaled within this field. If this field is set to the value '0000', it means that no scheduled change is foreseen: e.g. value '0001' indicates that there is a change in the next super-frame.

RESERVED: This 16-bit field is reserved for future use.

The following fields appear in the loop over NUM_DP, which describe the parameters associated with the DP carried in the current frame.

DP_ID: This 6-bit field indicates uniquely the DP within a PHY profile.

DP_START: This 15-bit (or 13-bit) field indicates the start position of the first of the DPs using the DPU addressing scheme. The DP_START field has differing length according to the PHY profile and FFT size as shown in the below table 27.

TABLE 27

| PHY profile | DP_START field size | |
|---|---|---|
| | 64K | 16K |
| Base | 13 bit | 15 bit |
| Handheld | — | 13 bit |
| Advanced | 13 bit | 15 bit |

DP_NUM_BLOCK: This 10-bit field indicates the number of FEC blocks in the current TI group for the current DP. The value of DP_NUM_BLOCK ranges from 0 to 1023

RESERVED: This 8-bit field is reserved for future use.

The following fields indicate the FIC parameters associated with the EAC.

EAC_FLAG: This 1-bit field indicates the existence of the EAC in the current frame. This bit is the same value as the EAC_FLAG in the preamble.

EAS_WAKE_UP_VERSION_NUM: This 8-bit field indicates the version number of a wake-up indication.

If the EAC_FLAG field is equal to '1', the following 12 bits are allocated for EAC_LENGTH_BYTE field. If the EAC_FLAG field is equal to '0', the following 12 bits are allocated for EAC_COUNTER.

EAC_LENGTH_BYTE: This 12-bit field indicates the length, in byte, of the EAC.

EAC_COUNTER: This 12-bit field indicates the number of the frames before the frame where the EAC arrives.

The following field appears only if the AUX_FLAG field is equal to '1':

AUX_PRIVATE_DYN: This 48-bit field is reserved for future use for signaling auxiliary streams. The meaning of this field depends on the value of AUX_STREAM_TYPE in the configurable PLS2-STAT.

CRC_32: A 32-bit error detection code, which is applied to the entire PLS2.

FIG. 16 illustrates a logical structure of a frame according to an embodiment of the present invention. As above mentioned, the PLS, EAC, FIC, DPs, auxiliary streams and dummy cells are mapped into the active carriers of the OFDM symbols in the frame. The PLS1 and PLS2 are first mapped into one or more FSS(s). After that, EAC cells, if any, are mapped immediately following the PLS field, followed next by FIC cells, if any. The DPs are mapped next after the PLS or EAC, FIC, if any. Type 1 DPs follows first, and Type 2 DPs next. The details of a type of the DP will be described later. In some case, DPs may carry some special data for EAS or service signaling data. The auxiliary stream or streams, if any, follow the DPs, which in turn are followed by dummy cells. Mapping them all together in the above mentioned order, i.e. PLS, EAC, FIC, DPs, auxiliary streams and dummy data cells exactly fill the cell capacity in the frame.

FIG. 17 illustrates PLS mapping according to an embodiment of the present invention.

PLS cells are mapped to the active carriers of FSS(s). Depending on the number of cells occupied by PLS, one or more symbols are designated as FSS(s), and the number of FSS(s) $N_{FSS}$ is signaled by NUM_FSS in PLS1. The FSS is a special symbol for carrying PLS cells. Since robustness and latency are critical issues in the PLS, the FSS(s) has higher density of pilots allowing fast synchronization and frequency-only interpolation within the FSS.

PLS cells are mapped to active carriers of the $N_{FSS}$ FSS(s) in a top-down manner as shown in an example in FIG. 17. The PLS1 cells are mapped first from the first cell of the first FSS in an increasing order of the cell index. The PLS2 cells follow immediately after the last cell of the PLS1 and mapping continues downward until the last cell index of the first FSS. If the total number of required PLS cells exceeds the number of active carriers of one FSS, mapping proceeds to the next FSS and continues in exactly the same manner as the first FSS.

After PLS mapping is completed, DPs are carried next. If EAC, FIC or both are present in the current frame, they are placed between PLS and "normal" DPs.

FIG. 18 illustrates EAC mapping according to an embodiment of the present invention.

EAC is a dedicated channel for carrying EAS messages and links to the DPs for EAS. EAS support is provided but EAC itself may or may not be present in every frame. EAC, if any, is mapped immediately after the PLS2 cells. EAC is not preceded by any of the FIC, DPs, auxiliary streams or dummy cells other than the PLS cells. The procedure of mapping the EAC cells is exactly the same as that of the PLS.

The EAC cells are mapped from the next cell of the PLS2 in increasing order of the cell index as shown in the example in FIG. 18. Depending on the EAS message size, EAC cells may occupy a few symbols, as shown in FIG. 18.

EAC cells follow immediately after the last cell of the PLS2, and mapping continues downward until the last cell index of the last FSS. If the total number of required EAC cells exceeds the number of remaining active carriers of the last FSS mapping proceeds to the next symbol and continues in exactly the same manner as FSS(s). The next symbol for mapping in this case is the normal data symbol, which has more active carriers than a FSS.

After EAC mapping is completed, the FIC is carried next, if any exists. If FIC is not transmitted (as signaled in the PLS2 field), DPs follow immediately after the last cell of the EAC.

Figure 19B:
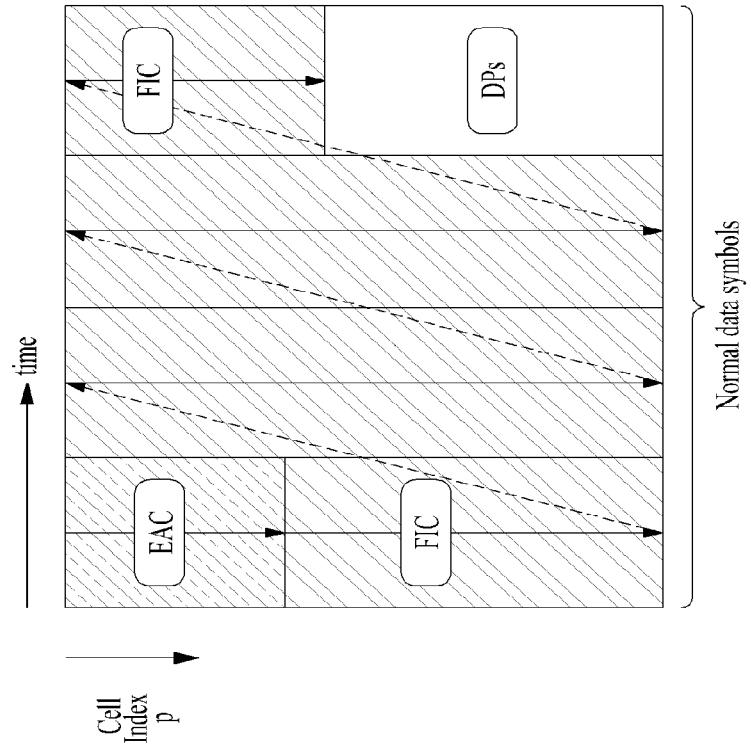
FIG. 19 illustrates FIC mapping according to an embodiment of the present invention.
Figure 19A:
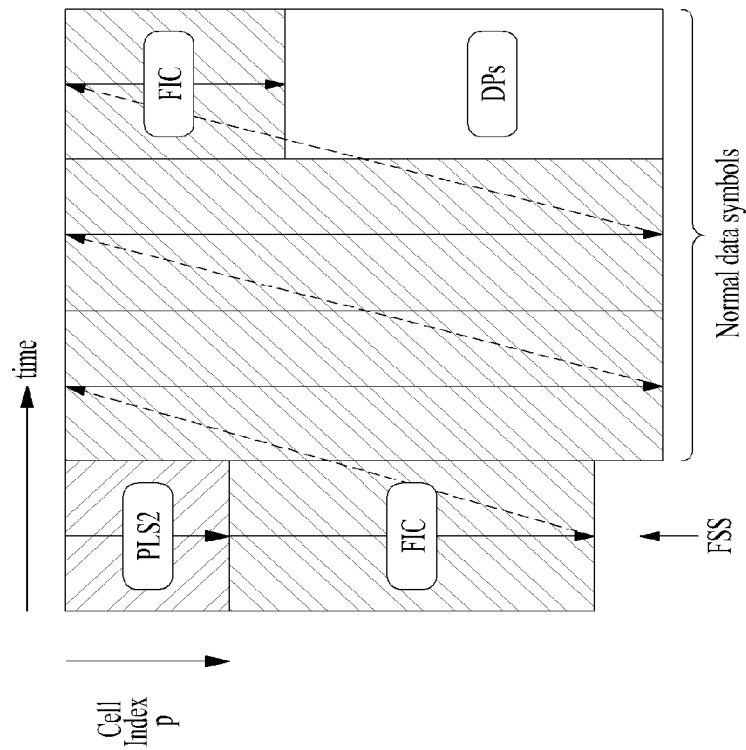

FIG. 19 illustrates FIC mapping according to an embodiment of the present invention.

(a) shows an example mapping of FIC cell without EAC and (b) shows an example mapping of FIC cell with EAC.

FIC is a dedicated channel for carrying cross-layer information to enable fast service acquisition and channel scanning. This information primarily includes channel binding information between DPs and the services of each broadcaster. For fast scan, a receiver can decode FIC and obtain information such as broadcaster ID, number of services, and BASE_DP_ID. For fast service acquisition, in addition to FIC, base DP can be decoded using BASE_DP_1D. Other than the content it carries, a base DP is encoded and mapped to a frame in exactly the same way as a normal DP. Therefore, no additional description is required for a base DP. The FIC data is generated and consumed in the Management Layer. The content of FIC data is as described in the Management Layer specification.

The FIC data is optional and the use of FIC is signaled by the FIC_FLAG parameter in the static part of the PLS2. If FIC is used, FIC_FLAG is set to '1' and the signaling field for FIC is defined in the static part of PLS2. Signaled in this field are FIC_VERSION, and FIC_LENGTH_BYTE. FIC uses the same modulation, coding and time interleaving parameters as PLS2. FIC shares the same signaling parameters such as PLS2_MOD and PLS2 FEC. FIC data, if any, is mapped immediately after PLS2 or EAC if any. FIC is not preceded by any normal DPs, auxiliary streams or dummy cells. The method of mapping FIC cells is exactly the same as that of EAC which is again the same as PLS.

Without EAC after PLS, FIC cells are mapped from the next cell of the PLS2 in an increasing order of the cell index as shown in an example in (a). Depending on the FIC data size, FIC cells may be mapped over a few symbols, as shown in (b).

FIC cells follow immediately after the last cell of the PLS2, and mapping continues downward until the last cell index of the last FSS. If the total number of required FIC cells exceeds the number of remaining active carriers of the last FSS, mapping proceeds to the next symbol and continues in exactly the same manner as FSS(s). The next symbol for mapping in this case is the normal data symbol which has more active carriers than a FSS.

If EAS messages are transmitted in the current frame, EAC precedes FIC, and FIC cells are mapped from the next cell of the EAC in an increasing order of the cell index as shown in (b).

After FIC mapping is completed, one or more DPs are mapped, followed by auxiliary streams, if any, and dummy cells.

Figure 20B:
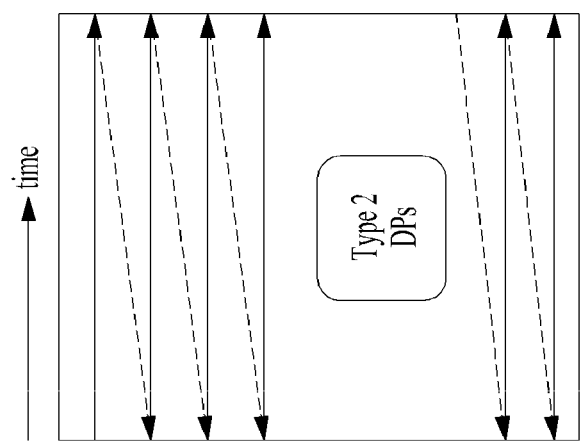
FIG. 20 illustrates a type of DP according to an embodiment of the present invention.
Figure 20A:
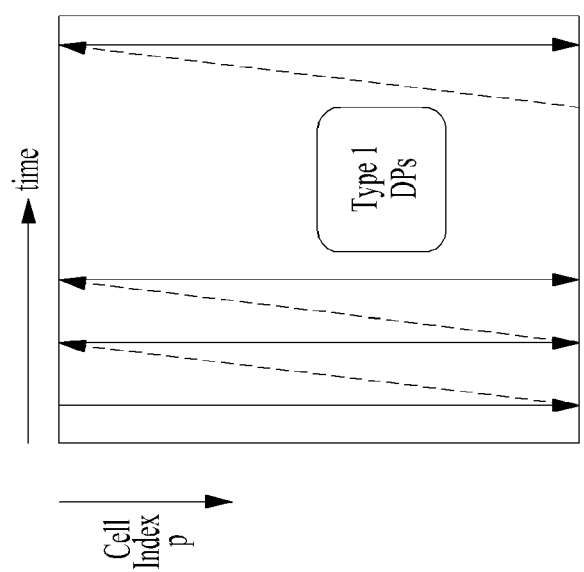

FIG. 20 illustrates a type of DP according to an embodiment of the present invention.

(a) shows type 1 DP and (b) shows type 2 DP.

After the preceding channels, i.e., PLS, EAC and FIC, are mapped, cells of the DPs are mapped. A DP is categorized into one of two types according to mapping method:

Type 1 DP: DP is mapped by TDM
Type 2 DP: DP is mapped by FDM

The type of DP is indicated by DP_TYPE field in the static part of PLS2. FIG. 20 illustrates the mapping orders of Type 1 DPs and Type 2 DPs. Type 1 DPs are first mapped in the increasing order of cell index, and then after reaching the last cell index, the symbol index is increased by one. Within the next symbol, the DP continues to be mapped in the increasing order of cell index starting from p=0. With a number of DPs mapped together in one frame, each of the Type 1 DPs are grouped in time, similar to TDM multiplexing of DPs.

Type 2 DPs are first mapped in the increasing order of symbol index, and then after reaching the last OFDM symbol of the frame, the cell index increases by one and the symbol index rolls back to the first available symbol and then increases from that symbol index. After mapping a number of DPs together in one frame, each of the Type 2 DPs are grouped in frequency together, similar to FDM multiplexing of DPs.

Type 1 DPs and Type 2 DPs can coexist in a frame if needed with one restriction; Type 1 DPs always precede Type 2 DPs. The total number of OFDM cells carrying Type 1 and Type 2 DPs cannot exceed the total number of OFDM cells available for transmission of DPs:

$$D_{DP1}+D_{DP2} \leq D_{OP}$$ [Math Figure 2]

where $D_{DP1}$ is the number of OFDM cells occupied by Type 1 DPs, $D_{DP2}$ is the number of cells occupied by Type 2 DPs. Since PLS, EAC, FIC are all mapped in the same way as Type 1 DP, they all follow "Type 1 mapping rule". Hence, overall, Type 1 mapping always precedes Type 2 mapping.

FIG. 21 illustrates DP mapping according to an embodiment of the present invention.

(a) shows an addressing of OFDM cells for mapping type 1 DPs and (b) shows an an addressing of OFDM cells for mapping for type 2 DPs.

Addressing of OFDM cells for mapping Type 1 DPs (0, . . . , $D_{DP1}$−1) is defined for the active data cells of Type 1 DPs. The addressing scheme defines the order in which the cells from the TIs for each of the Type 1 DPs are allocated to the active data cells. It is also used to signal the locations of the DPs in the dynamic part of the PLS2.

Without EAC and FIC, address 0 refers to the cell immediately following the last cell carrying PLS in the last FSS. If EAC is transmitted and FIC is not in the corresponding frame, address 0 refers to the cell immediately following the last cell carrying EAC. If FIC is transmitted in the corresponding frame, address 0 refers to the cell immediately following the last cell carrying FIC. Address 0 for Type 1 DPs can be calculated considering two different cases as shown in (a). In the example in (a), PLS, EAC and FIC are assumed to be all transmitted. Extension to the cases where either or both of EAC and FIC are omitted is straightforward. If there are remaining cells in the FSS after mapping all the cells up to FIC as shown on the left side of (a).

Addressing of OFDM cells for mapping Type 2 DPs (0, . . . , $D_{DP2}$−1) is defined for the active data cells of Type 2 DPs. The addressing scheme defines the order in which the cells from the TIs for each of the Type 2 DPs are allocated to the active data cells. It is also used to signal the locations of the DPs in the dynamic part of the PLS2.

Three slightly different cases are possible as shown in (b). For the first case shown on the left side of (b), cells in the last FSS are available for Type 2 DP mapping. For the second case shown in the middle, FIC occupies cells of a normal symbol, but the number of FIC cells on that symbol is not larger than $C_{FSS}$. The third case, shown on the right side in (b), is the same as the second case except that the number of FIC cells mapped on that symbol exceeds $C_{FSS}$.

The extension to the case where Type 1 DP(s) precede Type 2 DP(s) is straightforward since PLS, EAC and FIC follow the same "Type 1 mapping rule" as the Type 1 DP(s).

A data pipe unit (DPU) is a basic unit for allocating data cells to a DP in a frame.

A DPU is defined as a signaling unit for locating DPs in a frame. A Cell Mapper 7010 may map the cells produced by the TIs for each of the DPs. A Time interleaver 5050 outputs a series of TI-blocks and each TI-block comprises a variable number of XFECBLOCKs which is in turn composed of a set of cells. The number of cells in an XFECBLOCK, $N_{cells}$ is dependent on the FECBLOCK size, $N_{ldpc}$ and the number of transmitted bits per constellation symbol. A DPU is defined as the greatest common divisor of all possible values of the number of cells in a XFECBLOCK, $N_{cells}$, supported in a given PHY profile. The length of a DPU in cells is defined as $L_{DPU}$. Since each PHY profile supports different combinations of FECBLOCK size and a different number of bits per constellation symbol, $L_{DPU}$ is defined on a PHY profile basis.

FIG. 22 illustrates an FEC structure according to an embodiment of the present invention.

FIG. 22 illustrates an FEC structure according to an embodiment of the present invention before bit interleaving. As above mentioned, Data FEC encoder may perform the FEC encoding on the input BBF to generate FECBLOCK procedure using outer coding (BCH), and inner coding (LDPC). The illustrated FEC structure corresponds to the FECBLOCK. Also, the FECBLOCK and the FEC structure have same value corresponding to a length of LDPC codeword.

The BCH encoding is applied to each BBF ($K_{bch}$, bits), and then LDPC encoding is applied to BCH-encoded BBF ($K_{ldpc}$ bits=$N_{bch}$ bits) as illustrated in FIG. 22.

The value of $N_{ldpc}$ is either 64800 bits (long FECBLOCK) or 16200 bits (short FECBLOCK).

The below table 28 and table 29 show FEC encoding parameters for a long FECBLOCK and a short FECBLOCK, respectively.

TABLE 28

| LDPC Rate | $N_{ldpc}$ | $K_{ldpc}$ | $K_{bch}$ | BCH error correction capability | $N_{bch} - K_{bch}$ |
|---|---|---|---|---|---|
| 5/15 | 64800 | 21600 | 21408 | 12 | 192 |
| 6/15 | | 25920 | 25728 | | |
| 7/15 | | 30240 | 30048 | | |
| 8/15 | | 34560 | 34368 | | |
| 9/15 | | 38880 | 38688 | | |
| 10/15 | | 43200 | 43008 | | |
| 11/15 | | 47520 | 47328 | | |
| 12/15 | | 51840 | 51648 | | |
| 13/15 | | 56160 | 55968 | | |

TABLE 29

| LDPC Rate | $N_{ldpc}$ | $K_{ldpc}$ | $K_{bch}$ | BCH error correction capability | $N_{bch} - K_{bch}$ |
|---|---|---|---|---|---|
| 5/15 | 16200 | 5400 | 5232 | 12 | 168 |
| 6/15 | | 6480 | 6312 | | |
| 7/15 | | 7560 | 7392 | | |
| 8/15 | | 8640 | 8472 | | |
| 9/15 | | 9720 | 9552 | | |

TABLE 29-continued

| LDPC Rate | $N_{ldpc}$ | $K_{ldpc}$ | $K_{bch}$ | BCH error correction capability | $N_{bch} - K_{bch}$ |
|---|---|---|---|---|---|
| 10/15 | | 10800 | 10632 | | |
| 11/15 | | 11880 | 11712 | | |
| 12/15 | | 12960 | 12792 | | |
| 13/15 | | 14040 | 13872 | | |

The details of operations of the BCH encoding and LDPC encoding are as follows:

A 12-error correcting BCH code is used for outer encoding of the BBF. The BCH generator polynomial for short FECBLOCK and long FECBLOCK are obtained by multiplying together all polynomials.

LDPC code is used to encode the output of the outer BCH encoding. To generate a completed $B_{ldpc}$ (FECBLOCK), $P_{ldpc}$ (parity bits) is encoded systematically from each $I_{ldpc}$ (BCH-encoded BBF), and appended to $I_{ldpc}$. The completed $B_{ldpc}$ (FECBLOCK) are expressed as follow Math figure.

$$B_{ldpc} = [I_{ldpc} P_{ldpc}] = [i_0, i_1, \ldots, i_{K_{ldpc}-1}, p_0, p_1, \ldots, p_{N_{ldpc}-K_{ldpc}-1}] \quad \text{[Math Figure 3]}$$

The parameters for long FECBLOCK and short FEC-BLOCK are given in the above table 28 and 29, respectively.

The detailed procedure to calculate $N_{ldpc} - K_{ldpc}$ parity bits for long FECBLOCK, is as follows:

1) Initialize the parity bits, $$p_0 = p_1 = p_2 = \ldots = p_{N_{ldpc}-K_{ldpc}-1} = 0 \quad \text{[Math Figure 4]}$$

2) Accumulate the first information bit $-i_0$, at parity bit addresses specified in the first row of an addresses of parity check matrix. The details of addresses of parity check matrix will be described later. For example, for rate 13/15:

$$p_{983} = p_{983} \oplus i_0 \; p_{2815} = p_{2815} \oplus i_0$$

$$p_{4837} = p_{4837} \oplus i_0 \; p_{4989} = p_{4989} \oplus i_0$$

$$p_{6138} = p_{6138} \oplus i_0 \; p_{6458} = p_{6458} \oplus i_0$$

$$p_{6921} = p_{6921} \oplus i_0 \; p_{6974} = p_{6974} \oplus i_0$$

$$p_{7572} = p_{7572} \oplus i_0 \; p_{8260} = p_{8260} \oplus i_0$$

$$p_{8496} = p_{8496} \oplus i_0 \quad \text{[Math Figure 5]}$$

3) For the next 359 information bits, $i_s$, s=1, 2, ..., 359 accumulate is at parity bit addresses using following Math figure.

$$\{x + (s \bmod 360) \times Q_{ldpc}\} \bmod (N_{ldpc} - K_{ldpc}) \quad \text{[Math Figure 6]}$$

where x denotes the address of the parity bit accumulator corresponding to the first bit $i_0$, and $Q_{ldpc}$ is a code rate dependent constant specified in the addresses of parity check matrix. Continuing with the example, $Q_{ldpc} = 24$ for rate 13/15, so for information bit $i_1$, the following operations are performed:

$$p_{1007} = p_{1007} \oplus i_1 \; p_{2815} = p_{2815} \oplus i_1$$

$$p_{4861} = p_{4861} \oplus i_1 \; p_{5013} = p_{5013} \oplus i_1$$

$$p_{6162} = p_{6162} \oplus i_1 \; p_{6482} = p_{6482} \oplus i_1$$

$$p_{6945} = p_{6945} \oplus i_1 \; p_{6998} = p_{6998} \oplus i_1$$

$$p_{7596} = p_{7596} \oplus i_1 \; p_{8284} = p_{8284} \oplus i_1$$

$$p_{8520} = p_{8520} \oplus i_1 \quad \text{[Math Figure 7]}$$

4) For the 361$^{st}$ information bit $i_{360}$, the addresses of the parity bit accumulators are given in the second row of the addresses of parity check matrix. In a similar manner the addresses of the parity bit accumulators for the following 359 information bits $i_s$, s=361, 362, . . . , 719 are obtained using the Math Figure 6, where x denotes the address of the parity bit accumulator corresponding to the information bit $i_{360}$, i.e., the entries in the second row of the addresses of parity check matrix.

5) In a similar manner, for every group of 360 new information bits, a new row from addresses of parity check matrixes used to find the addresses of the parity bit accumulators.

After all of the information bits are exhausted, the final parity bits are obtained as follows:

6) Sequentially perform the following operations starting with i=1

$p_i = p_i \oplus p_{i-1}, i=1,2, \ldots, N_{ldpc} - K_{ldpc} - 1$      [Math Figure 8]

where final content of $p_i$, i=0, 1, . . . $N_{ldpc} - K_{ldpc} - 1$ is equal to the parity bit $p_i$.

TABLE 30

| Code Rate | $Q_{ldpc}$ |
|---|---|
| 5/15 | 120 |
| 6/15 | 108 |
| 7/15 | 96 |
| 8/15 | 84 |
| 9/15 | 72 |
| 10/15 | 60 |
| 11/15 | 48 |
| 12/15 | 36 |
| 13/15 | 24 |

This LDPC encoding procedure for a short FECBLOCK is in accordance with t LDPC encoding procedure for the long FECBLOCK, except replacing the table 30 with table 31, and replacing the addresses of parity check matrix for the long FECBLOCK with the addresses of parity check matrix for the short FECBLOCK.

TABLE 31

| Code Rate | $Q_{ldpc}$ |
|---|---|
| 5/15 | 30 |
| 6/15 | 27 |
| 7/15 | 24 |
| 8/15 | 21 |
| 9/15 | 18 |
| 10/15 | 15 |
| 11/15 | 12 |
| 12/15 | 9 |
| 13/15 | 6 |

Figure 23:
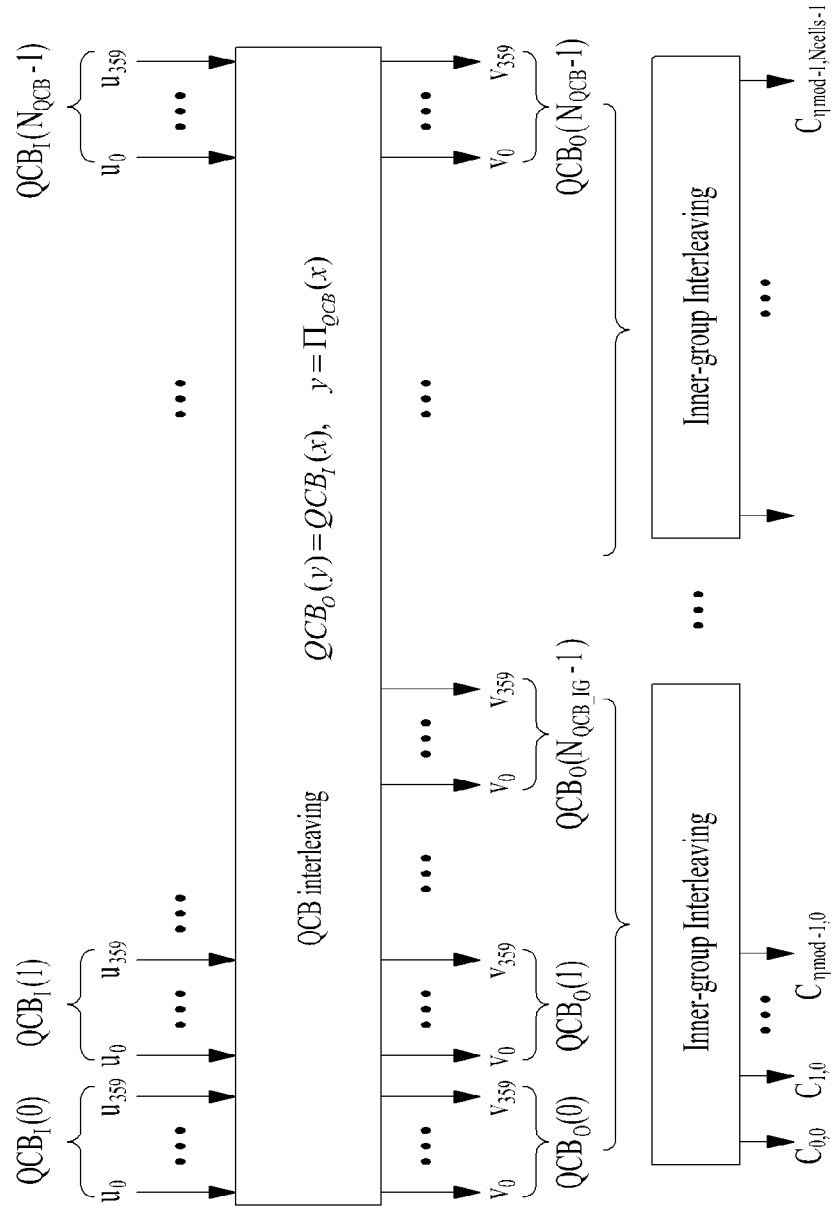
FIG. 23 illustrates a bit interleaving according to an embodiment of the present invention.

FIG. 23 illustrates a bit interleaving according to an embodiment of the present invention.

The outputs of the LDPC encoder are bit-interleaved, which consists of parity interleaving followed by Quasi-Cyclic Block (QCB) interleaving and Inner-group interleaving.

(a) shows Quasi-Cyclic Block (QCB) interleaving and (b) shows inner-group interleaving.

The FECBLOCK may be parity interleaved. At the output of the parity interleaving, the LDPC codeword consists of 180 adjacent QC blocks in a long FECBLOCK and 45 adjacent QC blocks in a short FECBLOCK. Each QC block in either a long or short FECBLOCK consists of 360 bits. The parity interleaved LDPC codeword is interleaved by QCB interleaving. The unit of QCB interleaving is a QC block. The QC blocks at the output of parity interleaving are permutated by QCB interleaving as illustrated in FIG. 23, where $N_{cells} = 64800/\eta_{mod}$ or $16200/\eta_{mod}$ according to the FECBLOCK length. The QCB interleaving pattern is unique to each combination of modulation type and LDPC code rate.

After QCB interleaving, inner-group interleaving is performed according to modulation type and order ($\eta_{mod}$), which is defined in the below table 32. The number of QC blocks for one inner-group, $N_{QCB\_IG}$, is also defined.

TABLE 32

| Modulation type | $\eta_{mod}$ | $N_{QCB\_IG}$ |
|---|---|---|
| QAM-16 | 4 | 2 |
| NUC-16 | 4 | 4 |
| NUQ-64 | 6 | 3 |
| NUC-64 | 6 | 6 |
| NUQ-256 | 8 | 4 |
| NUC-256 | 8 | 8 |
| NUQ-1024 | 10 | 5 |
| NUC-1024 | 10 | 10 |

Figure 24A:
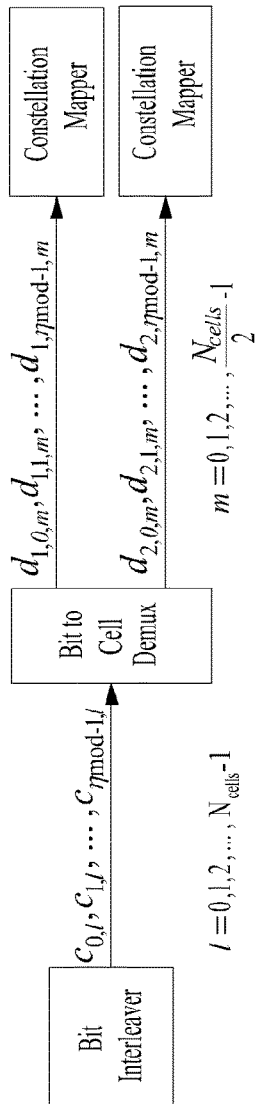
FIG. 24 illustrates a cell-word demultiplexing according to an embodiment of the present invention.
Figure 24B:
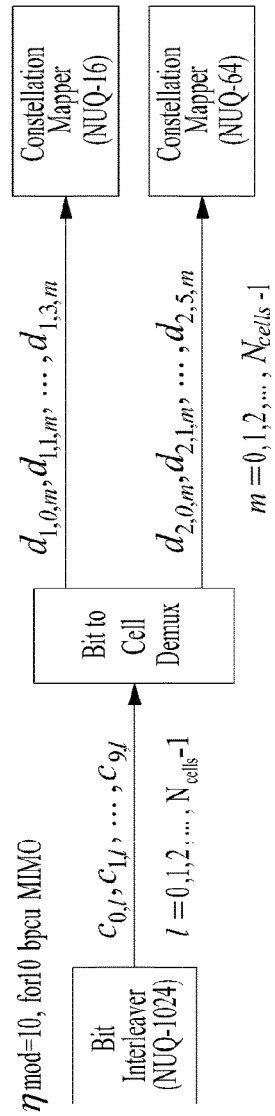

The inner-group interleaving process is performed with $N_{QCB\_IG}$ blocks of the QCB interleaving output. Inner-group interleaving has a process of writing and reading the bits of the inner-group using 360 columns and $N_{QCB\_IG}$ rows. In the write operation, the bits from the QCB interleaving output are written row-wise. The read operation is performed column-wise to read out m bits from each row, where m is equal to 1 for NUC and 2 for NUQ FIG. 24 illustrates a cell-word demultiplexing according to an embodiment of the present invention. (a) shows a cell-word demultiplexing for 8 and 12 bpcu MIMO and (b) shows a cell-word demultiplexing for 10 bpcu MIMO.

Each cell word ($c_{0,l}, c_{1,l}, \ldots, c_{\eta_{mod}-1,l}$) of the bit interleaving output is demultiplexed into ($d_{1,0,m}, d_{1,1,m}, \ldots, d_{1,\eta_{mod}-1,m}$) and ($d_{2,0,m}, d_{2,1,m}, \ldots, d_{2,\eta_{mod}-1,m}$) as shown in (a), which describes the cell-word demultiplexing process for one XFECBLOCK.

For the 10 bpcu MIMO case using different types of NUQ for MIMO encoding, the Bit Interleaver for NUQ-1024 is re-used. Each cell word ($c_{0,l}, c_{1,l}, \ldots, c_{9,l}$) of the Bit Interleaver output is demultiplexed into ($d_{1,0,m}, d_{1,1,m}, \ldots, d_{1,3,m}$) and ($d_{2,0,m}, d_{2,1,m}, \ldots, d_{2,5,m}$), as shown in (b).

Figure 25A:
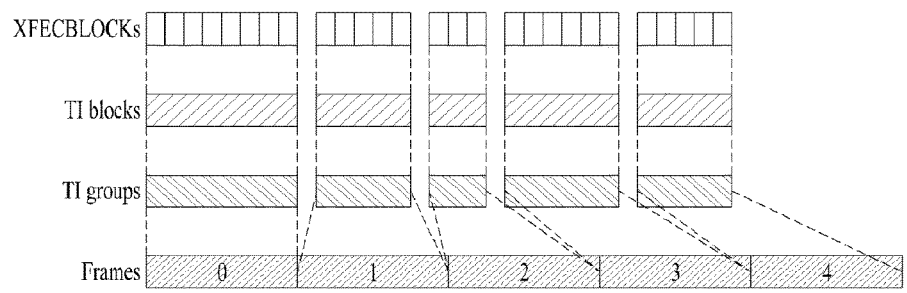
FIG. 25 illustrates a time interleaving according to an embodiment of the present invention.
Figure 25B:
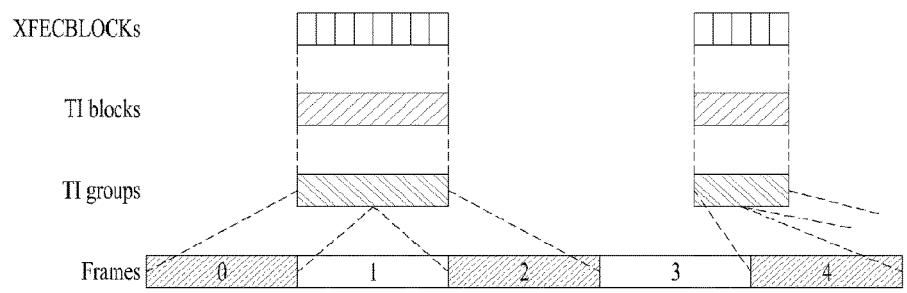
Figure 25C:
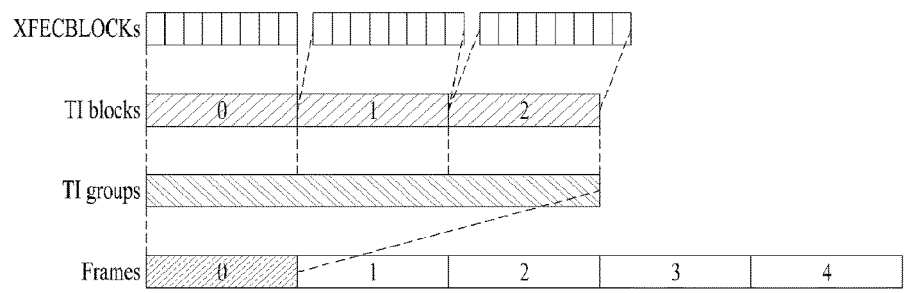

FIG. 25 illustrates a time interleaving according to an embodiment of the present invention. (a) to (c) show examples of TI mode.

The time interleaver operates at the DP level. The parameters of time interleaving (TI) may be set differently for each DP.

The following parameters, which appear in part of the PLS2-STAT data, configure the TI:

DP_TI_TYPE (allowed values: 0 or 1): Represents the TI mode; '0' indicates the mode with multiple TI blocks (more than one TI block) per TI group. In this case, one TI group is directly mapped to one frame (no inter-frame interleaving). '1' indicates the mode with only one TI block per TI group. In this case, the TI block may be spread over more than one frame (Inter-frame interleaving).

DP_TI_LENGTH: If DP_TI_TYPE='0', this parameter is the number of TI blocks $N_{TI}$ per TI group. For DP_TI_TYPE='1', this parameter is the number of frames $P_I$ spread from one TI group.

DP_NUM_BLOCK_MAX (allowed values: 0 to 1023): Represents the maximum number of XFECBLOCKs per TI group.

DP_FRAME_INTERVAL (allowed values: 1, 2, 4, 8): Represents the number of the frames $I_{JUMP}$ between two successive frames carrying the same DP of a given PHY profile.

DP_TI_BYPASS (allowed values: 0 or 1): If time interleaving is not used for a DP, this parameter is set to '1'. It is set to '0' if time interleaving is used.

Additionally, the parameter DP_NUM_BLOCK from the PLS2-DYN data is used to represent the number of XFECBLOCKs carried by one TI group of the DP.

When time interleaving is not used for a DP, the following TI group, time interleaving operation, and TI mode are not considered. However, the Delay Compensation block for the dynamic configuration information from the scheduler will still be required. In each DP, the XFECBLOCKs received from the SSD/MIMO encoding are grouped into TI groups. That is, each TI group is a set of an integer number of XFECBLOCKs and will contain a dynamically variable number of XFECBLOCKs. The number of XFECBLOCKs in the TI group of index n is denoted by $N_{xBLOCK\_Group}(n)$ and is signaled as DP_NUM_BLOCK in the PLS2-DYN data. Note that $N_{xBLOCK\_Group}(n)$ may vary from the minimum value of 0 to the maximum value $N_{xBLOCK\_Group\_Max}$ (corresponding to DP_NUM_BLOCK_MAX) of which the largest value is 1023.

Each TI group is either mapped directly onto one frame or spread over $P_I$ frames. Each TI group is also divided into more than one TI blocks($N_{TI}$), where each TI block corresponds to one usage of time interleaver memory. The TI blocks within the TI group may contain slightly different numbers of XFECBLOCKs. If the TI group is divided into multiple TI blocks, it is directly mapped to only one frame. There are three options for time interleaving (except the extra option of skipping the time interleaving) as shown in the below table 33.

mation part and a parity part. The information part may include a matrix having a horizontal size of Q×K and a vertical size of Q×M and the parity part may include a matrix having a horizontal size of Q×M and a vertical size of Q×M. In this case, an LDPC code rate corresponds to K/(K+M).

The parity check matrix according to an embodiment of the present invention may include randomly distributed 1s and 0s and 1 may be referred to as an "edge". The position of 1 in the parity check matrix, that is, the position of each edge may be represented in the form of a circulant shifted identity matrix per submatrix having a horizontal size of Q and a vertical size of Q. That is, a submatrix can be represented as a Q×Q circulant-shifted identity matrix including only 1 and 0. Specifically, the submatrix according to an embodiment of the present invention is represented as identity matrices $I_x$ including $I_0, I_1, I_2, I_1, \ldots$, which have different positions of Is according to the number of circulant shifts. The number of submatrices according to an embodiment of the present invention may be (K+M)×M.

(b) shows the circulant-shifted identity matrices $I_x$ which represent submatrices according to an embodiment of the present invention.

The subscript x of $I_x$ indicates the number of left-circulant shifts of columns of a circulant-shifted identity matrix. That is, $I_1$ represents an Identify matrix in which columns are circulant-shifted to the left once and $I_2$ represents an identity matrix in which columns are circulant-shifted to the left twice. $I_Q$ which is an identity matrix circulant-shifted Q times corresponding to the total number of columns, Q may be the same matrix as $I_0$ due to circulant characteristic thereof.

$I_{0+2}$ represents a submatrix corresponding to a combination of two circulant-shifted identity matrices. In this case, the submatrix corresponds to a combination of the identity matrix $I_0$ and an identity matrix circulant-shifted twice. $'I_1$ represents a circulant-shifted identity matrix in which the

TABLE 33

| Modes | Descriptions |
| --- | --- |
| Option-1 | Each TI group contains one TI block and is mapped directly to one frame as shown in (a). This option is signaled in the PLS2-STAT by DP_TI_TYPE = '0' and DP_TI_LENGTH = '1'($N_{TI}$ = 1). |
| Option-2 | Each TI group contains one TI block and is mapped to more than one frame. (b) shows an example, where one TI group is mapped to two frames, i.e., DP_TI_LENGTH = '2' ($P_I$ = 2) and DP_FRAME_INTERVAL ($I_{JUMP}$ = 2). This provides greater time diversity for low data-rate services. This option is signaled in the PLS2-STAT by DP_TI_TYPE = '1'. |
| Option-3 | Each TI group is divided into multiple TI blocks and is mapped directly to one frame as shown in (c). Each TI block may use full TI memory, so as to provide the maximum bit-rate for a DP. This option is signaled in the PLS2-STAT signaling by DP_TI_TYPE = '0' and DP_TI_LENGTH = $N_{TI}$, while $P_I$ = 1. |

Figures 26A, 26B, 26C:
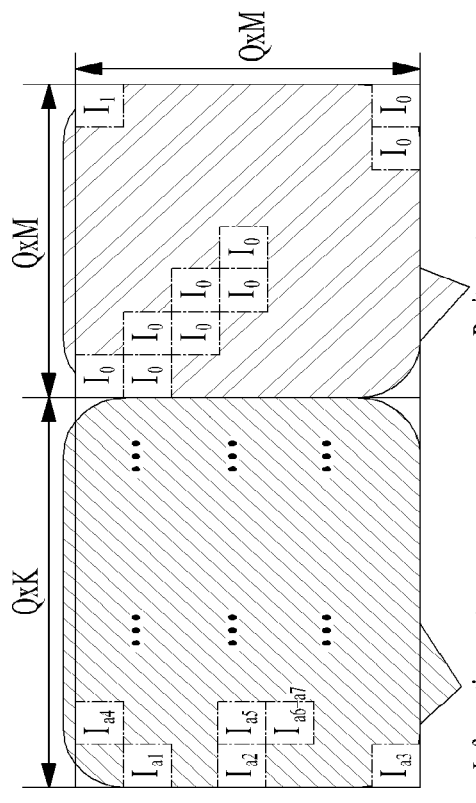
FIG. 26 shows a parity check matrix of a QC-IRA (quasi-cyclic irregular repeat accumulate) LDPC code.

FIG. 26 shows a parity check matrix of a QC-IRA (quasi-cyclic irregular repeat accumulate) LDPC code. The above-described LDPC encoder may encode a parity of an LDPC encoding block using the parity check matrix.

The parity check matrix according to the present invention is a parity check matrix of the QC-IRA LDPC code and may have the form of a quasi-cyclic matrix called an H matrix and be represented as $H_{qc}$.

(a) shows a parity check matrix according to an embodiment of the present invention. As shown in (a), the parity check matrix is a matrix having a horizontal size of Q×(K+M) and a vertical size of Q×M and may include an inforedge of the last column of the corresponding submatrix, that is, 1 has been removed while corresponding to the submatrix $I_1$.

The parity part of the parity check matrix of the QC-IRA LDPC code may include only submatrices $I_0$ and $'I_1$ and the position of submatrices $I_0$ may be fixed. As shown in (a), submatrices $I_0$ may be distributed in a diagonal direction in the parity part.

An edge in the parity check matrix represents that the corresponding row (checksum node) and the corresponding column (variable node) are physically connected. In this case, the number of is included in each column (variable node) may be referred to as a degree and columns may have the same degree or different degrees. Accordingly, the number, positions and value x of identity matrices $I_x$ that represent edges grouped per submatrix are important factors in determining QC-IRA LDPC encoding performance and unique values may be determined per code rate.

(c) shows a base matrix of the parity check matrix according to an embodiment of the present invention. The base matrix represents only the number and positions of identity matrices $I_x$ as specific numbers, ignoring the value x of $I_x$. As shown in (c), a base matrix may have a horizontal size of K+M and a vertical size of M and be represented as $H_{base}$. When $I_x$ is not a matrix corresponding to a combination of submatrices, the position of the corresponding submatrix may be represented as 1. When a submatrix Is represented as $I_{0+2}$, this submatrix is a matrix corresponding to a combination of two circulant-shifted identity matrices and thus the submatrix needs to be discriminated from a submatrix represented as one circulant-shifted identity matrix. In this case, the position of the submatrix may be represented as 2 which is the number of the combined circulant-shifted identity matrices. In the same manner, the position of a submatrix corresponding to a combination of N circulant-shifted identity matrices can be represented as N.

Figures 27A, 27B:
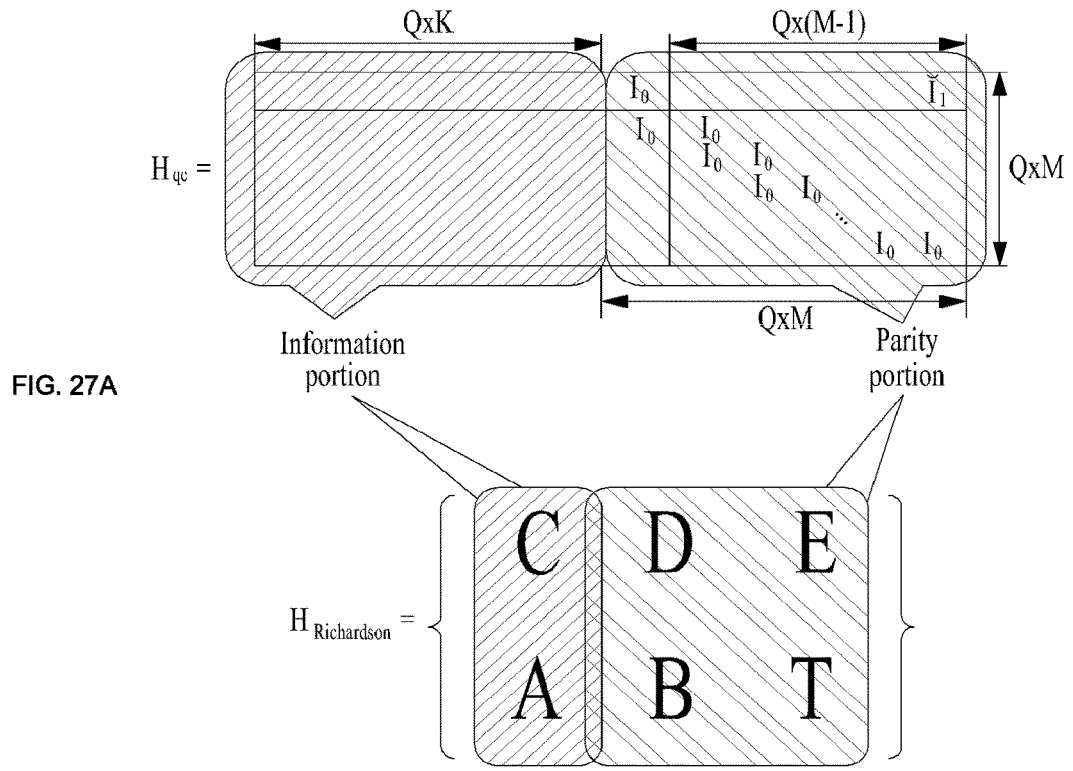
FIG. 27 shows a process of encoding the QC-IRA LDPC code according to an embodiment of the present invention.

FIG. 27 shows a process of encoding the QC-IRA LDPC code according to an embodiment of the present invention.

The QC-IRA LDPC code may be encoded per submatrix, distinguished from conventional sequential encoding, to reduce processing complexity.

(a) shows arrangement of a QC-IRA parity check matrix in a QC form. The QC-IRA parity check matrix may be divided into 6 regions A, B, C, D, E and T when arranged in the QC form. When a Q×K information vector s, a parity vector p1 having a length of Q and a parity vector p2 having a length of Q×(M−1) are used, a codeword x can be represented as x=(s, p1, p2).

When the efficient encoding equation of Richardson is used, the codeword x can be obtained by directly acquiring p1 and p2 from the parity check matrix arranged in the QC form. The efficient encoding equation of Richardson is as follows.

$$\varphi = -ET^{-1}B + D$$

$$p_1^T = -\varphi^{-1}(-ET^{-1}A + C)s^T$$

$$p_2^T = -T^{-1}(As^T + Bp_1^T) \qquad \text{[Math Figure 9]}$$

(b) shows matrices $\varphi$ and $\varphi^{-1}$ derived according to the efficient encoding equation.

As shown in (b), $\varphi^{-1}$ can be represented as a left low triangular (sub) matrix. The parity vector p2 can be obtained by calculating s and p1 according to the above-described equation. When the QC-IRA parity check matrix is encoded according to the efficient encoding equation of Richardson, at least Q parity nodes can be simultaneously processed in parallel according to characteristics of a Q×Q submatrix.

FIGS. 28 to 31 illustrate a process of sequentially encoding the QC-IRA LDPC code according to an embodiment of the present invention. This sequentially encoding may correspond to the above mentioned LDPC encoding.

Figure 28A:
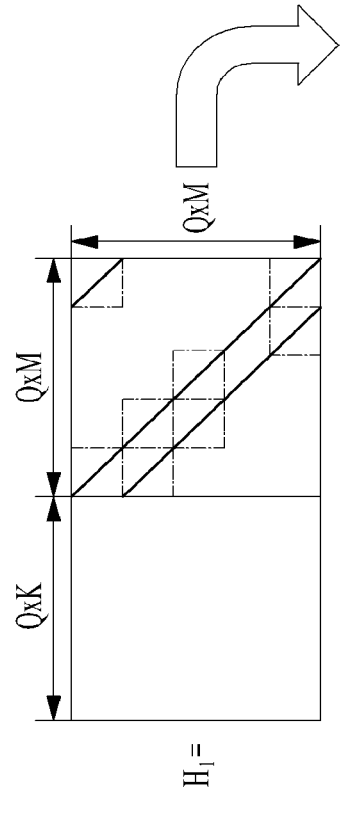
FIG. 28 illustrates a parity check matrix permutation process according to an embodiment of the present invention.
Figure 28B:
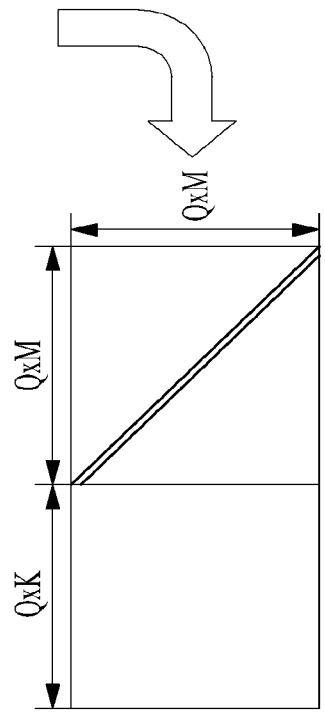

FIG. 28 illustrates a parity check matrix permutation process according to an embodiment of the present invention.

(a) shows a QC-IRA LDPC parity check matrix $H_1$ arranged in QC form. As shown in (a), a parity part of the matrix $H_1$ may include submatrices distributed in a stepped form, which corresponds to the above-described QC-IRA LDPC parity check matrix. To easily perform sequential encoding, rows and columns of the matrix $H_1$ are moved such that the matrix $H_1$ is modified into a matrix $H_2$ according to an embodiment of the present invention.

(b) shows the modified matrix $H_2$. As shown in (b), a parity part of the matrix $H_2$ may include a dual diagonal matrix. In this case, an applied row and column permutation equation is as follows.

$$r_y = (r_x \bmod Q)M + \lfloor r_x/Q \rfloor \text{ where } r_x = 0,1,2,\ldots,QM-1$$

$$c_y = \{((c_x - QK) \bmod Q\}M + \lfloor (c_x - QK)/Q \rfloor + QK \text{ where } c_x = QK, QK+1, \ldots, (K+M)-1 \qquad \text{[Math Figure 10]}$$

According to the above permutation equation, the $r_x$-th row of the matrix $H_1$ can be moved to the $r_y$-th row of the matrix $H_2$ and the $c_x$-th column of the matrix $H_1$ can be moved to the $c_y$-th column of the matrix $H_2$. In this case, column permutation can be applied only to a parity processing period (QK≤$c_x$≤Q(K+M)−1) and LDPC code characteristics can be maintained even if permutation is applied.

FIG. 29 is a table showing addresses of parity check matrix according to an embodiment of the present invention.

The table shown in the FIG. 28 represents a parity check matrix (or matrix H) having a codeword length of 16200 and a code rate of 5/15. The table represents addresses of 1 in the parity check matrix. In this case, the table according to an embodiment of the present invention can be referred to as addresses of a parity check matrix.

In the table of (a), i indicates the blocks generated when the length of the matrix H or codeword by the length of a submatrix. A submatrix according to an embodiment of the present invention is a 360×360 matrix having a codeword length of 16200, and thus the number of blocks can be 45 obtained by dividing 16200 by 360. The each block can be sequentially indicated from 0. Accordingly, i can have a value in the range of 0 to 44. Also, i can indicate information bit corresponding to first column in each block.

(b) shows the positions (or addresses) of is (or edges) in the first column in each block.

The matrix H can be represented as H(r,c) using all rows and columns thereof. The following equation 11 is used to derive H(r,c).

$$r = \lfloor x(i,j)/Q \rfloor \times Q + (x(i,j) + m) \bmod Q, \qquad \text{[Math Figure 11]}$$

$$H(r,c) = \begin{cases} 0, & \text{if } r = 0 \text{ and } c = 16199 \\ 1, & \text{else} \end{cases}$$

$$c = i \times Q + m$$

$\lfloor x \rfloor$ the largest integer less than or equal to $x$ $j = 0, \ldots,$ length of $x(i)$ $m = 0, \ldots, Q - 1$ $Q = 360$ In the equation, X(i,j) represents the J-th value of the I-th line in the table. Specifically, x(0,0)=116, x(0,1)=381 and x(1,0)=266, which correspond to the positions of rows having 1 (or addresses of 1) corresponding to i-th line of the matrix H. In this case, maximum values of r and c can be 10799 and 16199, respectively.

The performance of the LDPC code may depend on distribution of degrees of nodes of the parity check matrix, the girth according to the positions of 1s or edges of the parity check matrix, cycle characteristic, connection between check nodes and variable nodes, etc. The matrix H shown optimizes node degree distribution in the case of the codeword of 16200, Q=360 and code rate=5/15 and optimizes the positions of is or edges under the condition of optimized degree distribution, Q and code rate.

The matrix H configured according to the table has the above-described QC-IRA LDPC structure. $H_{qc}$ can be obtained using H(r,c) derived using the equation and a base matrix $H_{base}$ can be derived from $H_{qc}$.

In addition, the matrix H according to an embodiment of the present invention may include a matrix H in a different from, which has the same degree distribution as the lengths of x(i) (or degrees of corresponding variable nodes) of the table shown in FIG. 4. Furthermore, when a transmitter performs encoding using the corresponding matrix H, the above-described efficient encoding for QC-IRA LDPC can be employed.

Accordingly, a transmitting side can implement an encoder having high encoding performance, low complexity and high throughput and a receiving side can perform parallel decoding up to 360 level using Q and effectively design a receiver with high throughput using the proposed matrix H.

The following table shows degree distribution.

TABLE 34

| | Variable node degree | | | |
|---|---|---|---|---|
| | 30 | 4 | 3 | 2 |
| (# of variable node)/Q | 3 | 8 | 4 | 30 |

When i is 0, 1 and 2, the numbers of is in the 0-th block to 2nd block are all 30. Accordingly, when the variable node degree is 30, the number of blocks having the same degree is represented as 3. When i corresponds to 15 to 44, the numbers of is in the fifteenth to forty-fourth block are 2. Accordingly, when the variable node degree is 2, the number of blocks having the same degree is 30. As described above, since the parity part of the matrix H includes only submatrices represented as $I_0$ diagonally distributed in a stepped form, the variable node degree is always 2. Hence, blocks having a variable node degree of 2 can be regarded as blocks corresponding to the parity part. The number of actual variable nodes corresponding to each variable node degree can be obtained by multiplying the number of blocks shown in the table by Q of the submatrix.

FIG. 30 is a table showing addresses of parity check matrix according to another embodiment of the present invention.

The table shown in FIG. 30 shows the matrix $H_2$ obtained by modifying the matrix $H_1$.

In sequential encoding, edges used in a parity processing period are typically represented by an equation and thus the edges can be omitted from the table. That is, 30 blocks having a degree of 2 corresponding to the parity part are not represented in the table.

Since the property of the matrix is maintained even if the matrix is modified, as described above, node degree characteristic, cycle, girth, connection between check nodes and variable nodes, etc. are maintained. Accordingly, the equal encoding performance can be obtained and sequential encoding can be performed using the matrix $H_2$ according to the table.

FIG. 31 illustrates a method for sequentially encoding the QC-IRA LDPC code according to an embodiment of the present invention.

When the parity check matrix is modified into the matrix $H_2$ through the above-described permutation process, sequential encoding can be performed through updating of each parity checksum using information bits of a codeword and checksum updating between parity checksums.

As shown in FIG. 31, the codeword can be represented using QK information bits and QM parity checksums. The information bits can be represented as $i_z$ according to position and parity checksums can be represented as $p_s$.

A parity checksum update process through the information bits can be represented by the following equation 12.

[Math Figure 12]

$$p_w = p_w \oplus i_z \quad (1)$$

$$w = \{v + (z \bmod Q)M\} \bmod(QM) \text{ where } z = 0,1,2,\ldots,QK-1 \quad (2)$$

Here, $i_z$ represents a z-th information bit and $p_w$ denotes a parity checksum that needs to be updated using $i_z$. Equation (1) represents that parity checksum $p_w$ corresponding to the w-th row is updated through an XOR operation performed on the z-th information and parity checksum $p_w$. According to equation (2), the position of w is calculated using the above-described table representing the matrix $H_2$. Here, v denotes a number corresponding to each row in the table representing the matrix $H_2$. As described above, a row in the table representing the matrix $H_2$ corresponds to the position of a block generated when the length of the matrix H or codeword is divided by the submatrix length. Accordingly, the information processing period shown in FIG. 6 is divided by the submatrix length Q and then the numbers of rows corresponding to every Q-th $i_z$ are read. Upon completion of checksum update using the information bits of the information processing period, checksum update of the parity processing period can be performed. Checksum update of the parity processing period may be represented by the following equation 13.

$$p_s = p_s \oplus p_{s-1} \text{ where } s=1,2,\ldots,QM-1 \quad \text{[Math Figure 13]}$$

When S is 0, parity checksum corresponds to parity $p_0$ and parity values from $p_1$ to $p_{QM-1}$ can be sequentially derived through XOR operations performed on the parity values and parity values immediately prior thereto.

FIG. 32 illustrates an LDPC decoder according to an embodiment of the present invention.

The LDPC decoder 700 according to an embodiment of the present invention may include a variable node update block 710, a check node update block 720, a barrel shift block 730 and a check sum block 740. Each block will now be described.

The variable node block 710 may update each variable node of the matrix H using an input of the LDPC decoder and a message delivered through edges from the check node block.

The check node block 720 may update a check node of the matrix H using a message transmitted through edges from a variable node. A node update algorithm according to an embodiment of the present invention may include sum product algorithm, belief-propagation algorithm, min-sum algorithm, modified min-sum algorithm, etc. and may be changed according to designer. In addition, since connection between variable nodes and check nodes is represented in the form of a Q×Q circulant identity matrix due to characteristics of QC-IRA LDPC, Q messages between variable nodes and the check node block can be simultaneously processed in parallel. The barrel shift block 730 may control circulant connection.

The check sum block 740 is an optional block which hard-decides a decoding message for each variable node update and performs parity checksum operation to reduce the number of decoding iterations necessary for error correction. In this case, the LDPC decoder 700 according to an embodiment of the present invention can output a final LDPC decoding output through soft decision even if the check sum block 740 hard-decides the decoding message.

FIG. 33 illustrates time-domain structure of the normal preamble according to an embodiment of the present invention.

The present invention uses the preamble symbol for many purposes. Four main purposes are as follows.
1) System signal discovery
2) Transmission of basic system parameters
3) Initial acquisition of synchronization offset in the receiver
4) Signaling of Emergency Alert System events There are two types of preamble having different level of robustness—a normal and a robust preamble. The normal preamble can be used in both the base profile and the advanced profile. The robust preamble can be used in the handheld profile.

The normal preamble includes the OFDM symbol A of length N=1024, for example, and the scrambled version SA of the symbol A for the guard interval.

Figure 34:
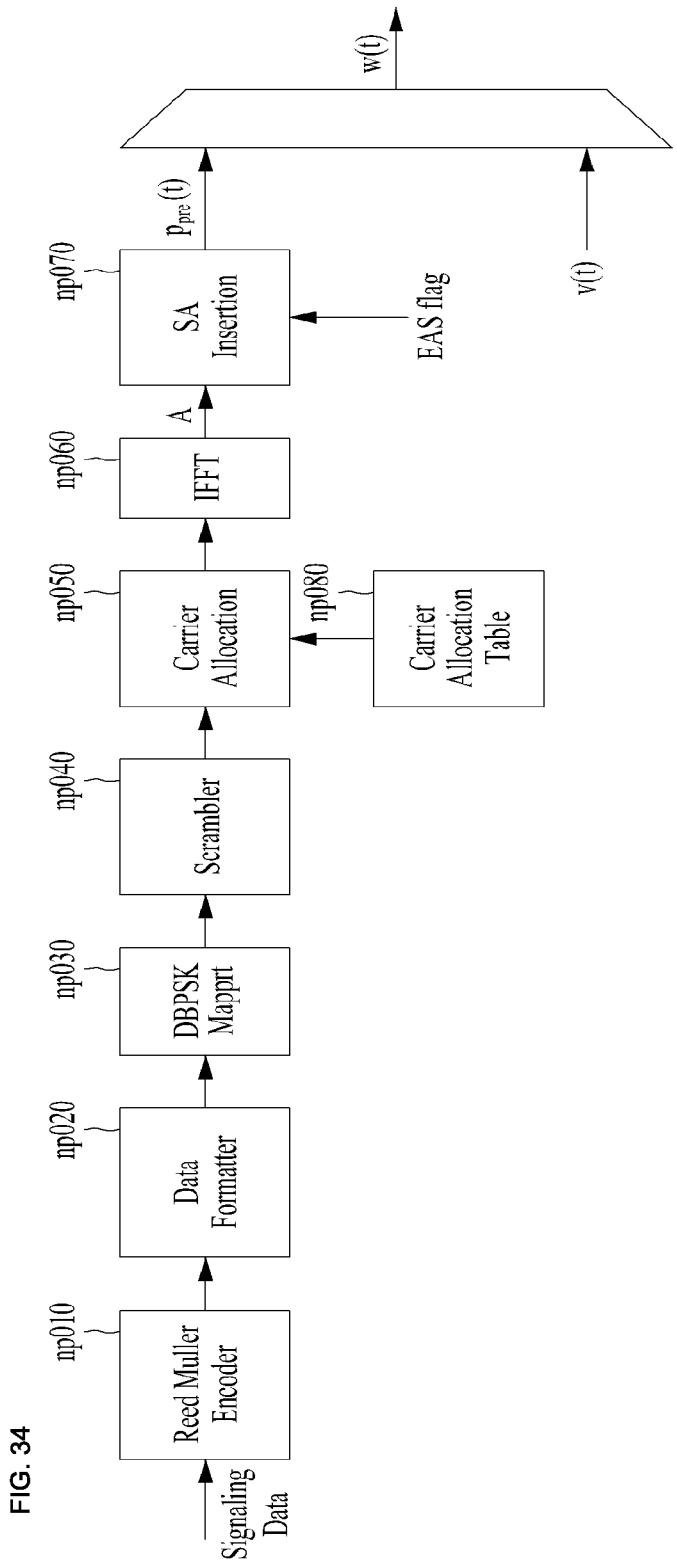
FIG. 34 illustrates block diagram of the normal preamble symbol insertion according to an embodiment of the present invention.

FIG. 34 illustrates block diagram of the normal preamble symbol insertion according to an embodiment of the present invention.

The generation process of the normal preamble is shown in the illustrated block diagram. The block diagram of the normal preamble symbol insertion includes Reed Muller Encoder(np010), Data Formatter(np020), DBPSK Mapper (np030), Scrambler(np040), Carrier Allocation(np050), IFFT(np060), SA Insertion(np070) and/or Carrier Allocation Table(np080).

The preamble data can be composed of 3 signaling fields, namely S1, S2 and S3. Each signaling field can includes 7 signaling bits, and the preamble carries 21 signaling bits in total.

Each signaling field is encoded with a first-order Reed Muller (64, 7) code. The Reed Muller generator matrix G is of dimension (7×64), which can be divided into 8 sub-matrixes ($G_1 \sim G_8$) of size (7×8).

The Reed Muller generator matrix G can be expressed as follows.

$$G = [G_1\ G_2\ G_3\ G_4\ G_5\ G_6\ G_7\ G_8] \quad \text{[Math Figure 14]}$$

Each field $S_i$ (i=0, 1, 2) is encoded into Reed Muller codeword $C_i$ (i=0, 1, 2) as follows.

$$C_i = m_i \times G = \{C_{i,0}, C_{i,1}, \ldots, C_{i,63}\} \quad \text{[Math Figure 15]}$$

The $m_i$ is the 7-bit signaling bit vector representing the field $S_i$.

The data formatter(np020) repeats and uniformly shuffles each Reed Muller codeword to generate the resulting modulation sequence MS. The MS can be expressed as follows.

[Math Figure 16]

$$MS = \{MS_0, MS_1, MS_2, \ldots MS_{383}\}$$
$$= \{C_{1,0}, C_{2,0}, C_{3,0}, C_{1,1}, C_{2,1}, C_{3,1}, \ldots, C_{1,63}, C_{2,53}, C_{3,63},$$
$$C_{1,0}, C_{2,0}, C_{3,0}, C_{1,1}, C_{2,1}, C_{3,1}, \ldots, C_{1,63}, C_{2,63}, C_{3,63}\}$$

The shuffling enables each codeword to get maximum frequency diversity.

After shuffling, the modulation sequence is modulated by differential BPSK:

$$MS\_DIFF = DBPSK(MS) \quad \text{[Math Figure 17]}$$

The following rule applies to the differential modulation of the element $MS_i$:

$$MS\_DIFF_i = \begin{cases} MS\_DIFF_{i-1} & \text{if } MS_i = 0 \\ -MS\_DIFF_{i-1} & \text{if } MS_i = 1 \end{cases} (i = 0 \sim 383) \quad \text{[Math Figure 18]}$$

where $MS\_DIFF_{-1} = 1$ by definition.

The differential modulation enables the non-coherent detection of the signaling fields so that the channel estimation is not necessary at the receiver side.

The sequence MS_DIFF is scrambled by a signaling scrambler sequence (SSS).

$$MS\_SCR\_A = SCRAMBLING_A(MS\_DIFF) \quad \text{[Math Figure 19]}$$

The scrambled modulation sequence, MS_SC_A, is allocated to the active carriers of the normal preamble symbol. The allocation can be made by using the carrier allocation table.

To match the power of the preamble symbol to the power of a data symbol, the boosting applied to the active carriers of the preamble is the amplitude ratio of certain value. The value of the amplitude ratio can be as follows.

$$\sqrt{(6785/(384*8))} \text{ or } 3.44 \text{ dB} \quad \text{[Math Figure 20]}$$

The data OFDM symbol A of the normal preamble is generated by modulating each carrier according to the following expression:

$$p_A(t) = \frac{1}{\sqrt{384}} \sum_{i=0}^{383} MS\_SCR\_A_i X e^{j2\pi \frac{k_p(i)-512}{1024T} t} \quad \text{[Math Figure 21]}$$

where $k_p(i)$ for i=0,1, . . . , 383 are the Indices of the 384 active carriers, in an increasing order. $MS\_SC\_A_i$ for i= 0,1, . . . ,383 are the modulation values for the active carriers, and T is the elementary time period. For the reliable detection of the preamble, the data OFDM symbol $p_A(t)$ is copied to the guard interval position and scrambled with the guard interval scrambler sequence (GSS) gss(t):

$$p_{SA}(t) = p_A(t) * gss(t) \quad \text{[Math Figure 22]}$$

The sequence gss(t) is defined as follows:

$$gss(t) = s_{EAS}(t) \quad \text{if } EAS \text{ event occurs} \quad \text{[Math Figure 23]}$$
$$= s_{Normal}(t) \quad \text{otherwise.}$$

The sequence $s_{Normal}(t)$ is defined as below.

$$s_{Normal}(t) = s_{Normal\_I}(t) + js_{Normal\_Q}(t), \text{ where } j = \sqrt{-1} \quad \text{[Math Figure 24]}$$

$$s_{Normal\_I}(t) = \begin{cases} 1/\sqrt{2} & t = 0 \sim 20T \\ -1/\sqrt{2} & t = 21T \sim 60T \\ 1/\sqrt{2} & t = 61T \sim 116T \\ -1/\sqrt{2} & t = 117T \sim 188T \\ 1/\sqrt{2} & t = 189T \sim 292T \\ -1/\sqrt{2} & t = 293T \sim 428T \\ 1/\sqrt{2} & t = 429T \sim 628T \\ -1/\sqrt{2} & t = 629T \sim 892T \\ 1/\sqrt{2} & t = 893T \sim 1023T \end{cases} \quad \text{[Math Figure 25]}$$

$$s_{Normal\_Q}(t) = \begin{cases} 1/\sqrt{2} & t = 0 \sim 40T \\ -1/\sqrt{2} & t = 41T \sim 79T \\ 1/\sqrt{2} & t = 80T \sim 152T \\ -1/\sqrt{2} & t = 153T \sim 223T \\ 1/\sqrt{2} & t = 224T \sim 360T \\ -1/\sqrt{2} & t = 361T \sim 495T \\ 1/\sqrt{2} & t = 496T \sim 760T \\ -1/\sqrt{2} & t = 761T \sim 1023T \end{cases} \quad \text{[Math Figure 26]}$$

The sequence $s_{EAS}(t)$ is defined as follows.

$$s_{EAS}(t) = s_{EAS\_I}(t) + js_{EAS\_Q}(t), \text{ where } j = \sqrt{-1} \quad \text{[Math Figure 27]}$$

$$s_{EAS\_I}(t) = \begin{cases} 1/\sqrt{2} & t = 0 \sim 20T \\ -1/\sqrt{2} & t = 21T \sim 60T \\ 1/\sqrt{2} & t = 61T \sim 116T \\ -1/\sqrt{2} & t = 117T \sim 188T \\ 1/\sqrt{2} & t = 189T \sim 292T \\ -1/\sqrt{2} & t = 293T \sim 428T \\ 1/\sqrt{2} & t = 429T \sim 511T \\ -1/\sqrt{2} & t = 512T \sim 628T \\ 1/\sqrt{2} & t = 629T \sim 892T \\ -1/\sqrt{2} & t = 893T \sim 1023T \end{cases} \quad \text{[Math Figure 28]}$$

$$s_{EAS\_Q}(t) = \begin{cases} 1/\sqrt{2} & t = 0 \sim 40T \\ -1/\sqrt{2} & t = 41T \sim 79T \\ 1/\sqrt{2} & t = 80T \sim 152T \\ -1/\sqrt{2} & t = 153T \sim 223T \\ 1/\sqrt{2} & t = 224T \sim 360T \\ -1/\sqrt{2} & t = 361T \sim 495T \\ 1/\sqrt{2} & t = 496T \sim 511T \\ -1/\sqrt{2} & t = 512T \sim 760T \\ 1/\sqrt{2} & t = 761T \sim 1023T \end{cases} \quad \text{[Math Figure 29]}$$

The time-domain baseband waveform $p_{pre}(t)$ of the normal preamble symbol is therefore defined as follows:

$$p_{pre}(t) = \begin{cases} p_{SA}(t) & 0 \le t < 1024T \\ p_A(t) & 1024T \le t < 2048T \\ 0 & \text{otherwise} \end{cases} \quad \text{[Math Figure 30]}$$

$p_{pre}(t)$ is multiplexed with the input v(t) of the preamble insertion block to produce the final output w(t) as shown in the illustration.

Figure 35:
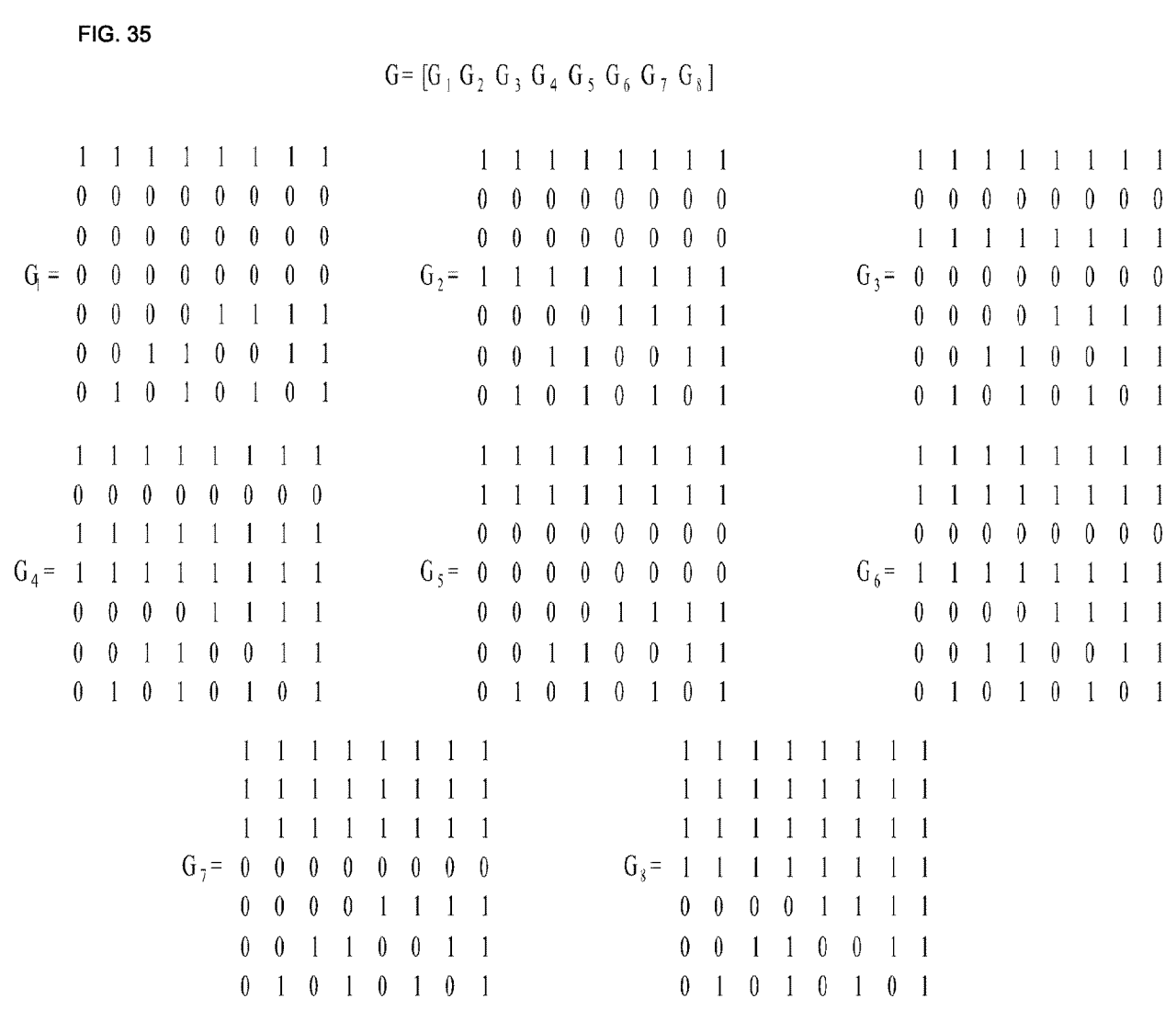

FIG. 35 illustrates sub-matrixes of Reed Muller generator matrix G according to an embodiment of the present invention.

The Reed Muller generator matrix G is of dimension (7×64), which can be divided into 8 sub-matrixes ($G_1 \sim G_8$) of size (7×8). The illustration describes embodiments of each sub-matrixes.

FIG. 36 illustrates a Signaling Scrambler Sequence (SSS) generator according to an embodiment of the present invention.

As described above, the sequence MS_DIFF is scrambled by a signaling scrambler sequence (SSS).

The generator polynomial of the sequence SSS is as follows.

$$1+X^{14}+X^{15} \quad \text{[Math Figure 31]}$$

For the normal preamble, the initial value of the shift register can be set to ($R_{14}$ $R_{13}$ $R_{12}$ $R_{11}$ $R_{10}$ $R_9$ $R_8$ $R_7$ $R_6$ $R_5$ $R_4$ $R_3$ $R_2$ $R_1$ $R_0$)=(101110110110000). The shift register is re-initialized at every preamble symbol. The initial value is optimized to minimize PAPR of the preamble symbol.

Before scrambling, each bit of the sequence SSS having value '0' is converted into '+1' and each bit having value '1' is converted into '−1':

$$\text{MS\_SCR\_A}_i = \text{MS\_DIFF}_i \times 2\left(\frac{1}{2} - \text{SSS\_A}_i\right) \quad \text{[Math Figure 32]}$$

where SSS_$A_i$ is the $i^{th}$ element of the SSS_A and MS_SCR_$A_i$ is the $i^{th}$ element of the scrambled modulation sequence MS_SCR_$A_i$ which is allocated to the active carriers of the normal preamble symbol.

FIG. 37 illustrates distribution of the active carriers according to an embodiment of the present invention.

Figure 38:
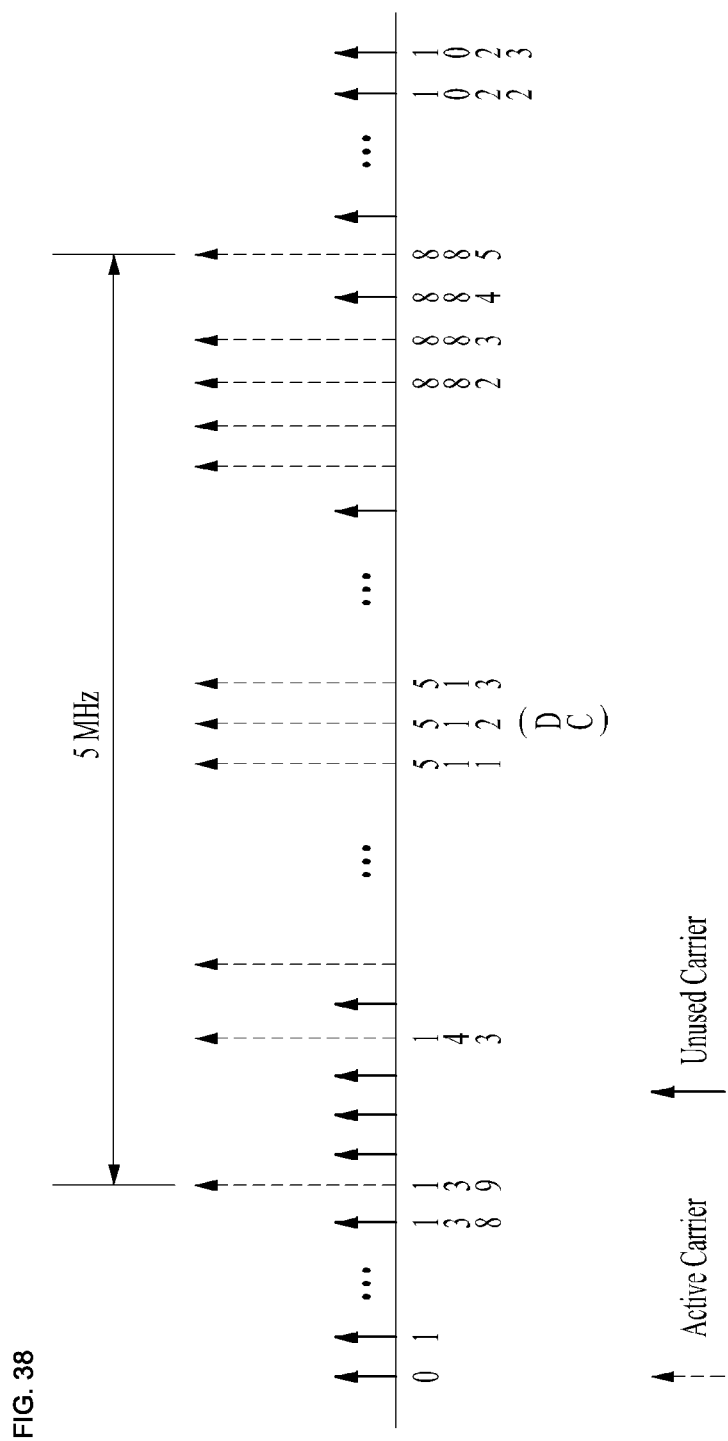
FIG. 38 illustrates location of the active carriers according to an embodiment of the present invention.

In the preamble symbol, there are 384 active carriers. Locations of the active carriers in the preamble, kp(0)~kp (383), are listed in the illustration. There are 1024 carriers including active carriers and unused carriers in the preamble symbol(0~1023). Each number in the illustration represents location where the active carriers are distributed in the preamble symbol. FIG. 38 illustrates location of the active carriers according to an embodiment of the present invention.

The illustration shows the active carriers, black arrows, and the unused carriers, gray arrows. In this embodiment, first active carrier is located in $140^{th}$ carrier (139), and last active carrier is located in $886^{th}$ carrier (885). The occupied bandwidth of the preamble symbol is 5 MHz as depicted in the illustration.

The randomly distributed active carriers enable the receiver to estimate the integral carrier frequency offset. The guard band at both spectrum ends ensures the preamble is undistorted even with the existence of a carrier frequency offset up to +/−500 kHz.

Figure 39:
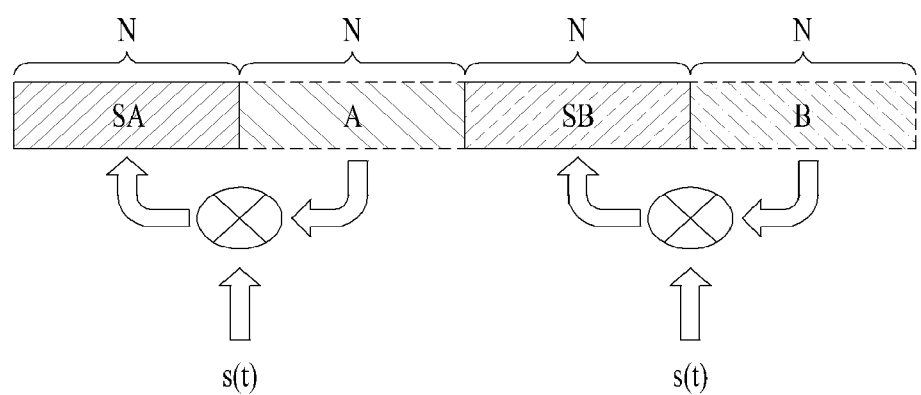
FIG. 39 illustrates time-domain structure of the robust preamble according to an embodiment of the present invention.

FIG. 39 illustrates time-domain structure of the robust preamble according to an embodiment of the present invention.

The robust preamble is designed to detect and decode the preamble symbol under harsh channel conditions like mobile reception. The robust preamble is a kind of repetition of the normal preamble, and carries the same signaling fields S1, S2 and S3 with a different signaling scrambler sequence (SSS).

The first half of the robust preamble is exactly the same as the normal preamble. The second half of the robust preamble is a simple variation of the normal preamble where the difference arises from the sequence SSS applied in the frequency domain. The doubled length of the robust preamble improves the detection performance in the time domain, and the repetition of the signaling fields improves the decoding performance for the preamble signaling data.

Figure 40:
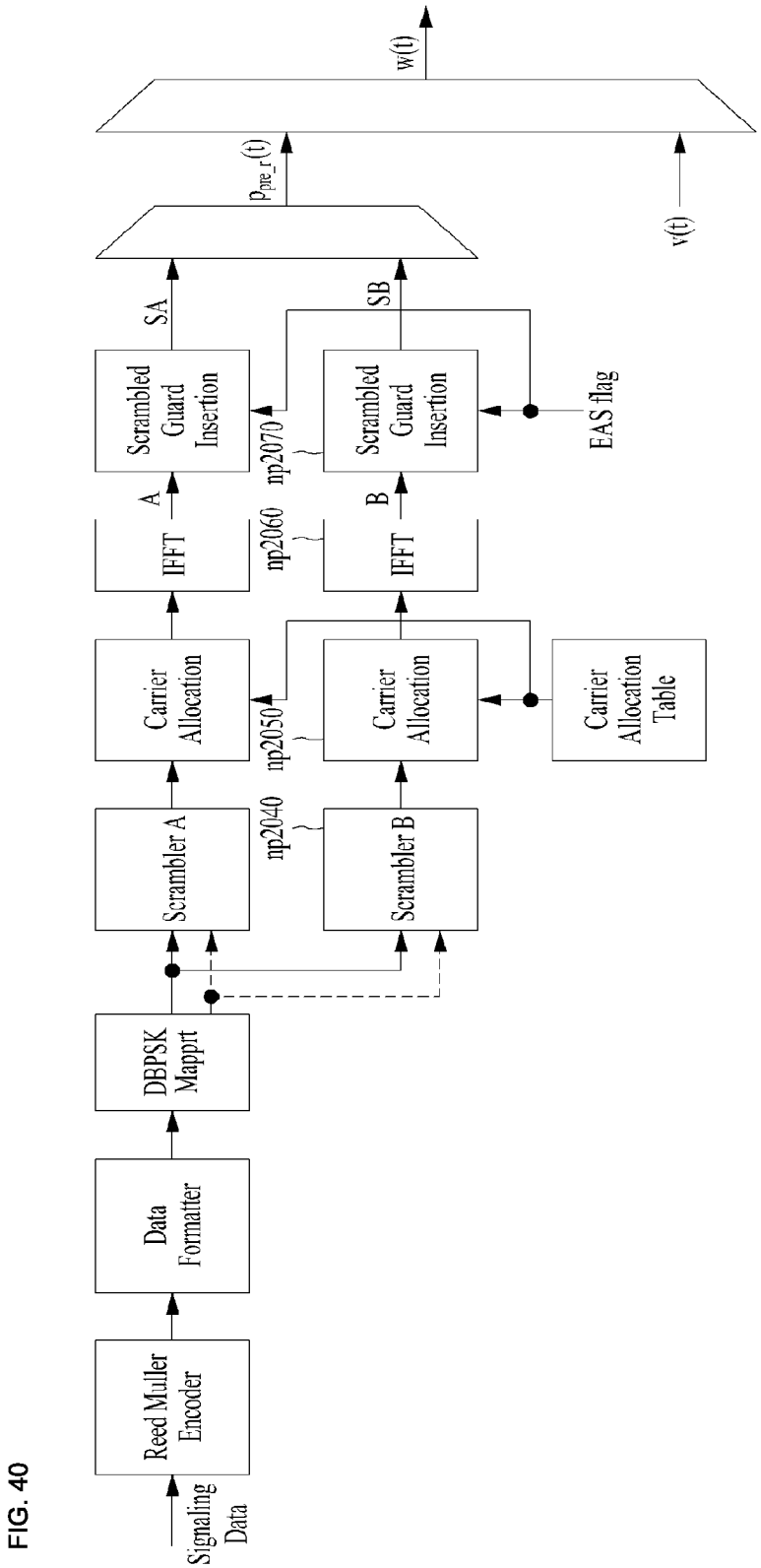
FIG. 40 illustrates block diagram of the robust preamble symbol insertion according to an embodiment of the present invention.

FIG. 40 illustrates block diagram of the robust preamble symbol insertion according to an embodiment of the present invention.

The generation process of the robust preamble symbol is shown in the illustration. The detailed functional steps are described below.

The robust preamble generation differs from the normal preamble by applying the sequence SSS in the frequency domain as described above. Consequently, the Reed Muller encoder, the data formatter and the DBPSK mapper blocks in the illustration are shared with the normal preamble generation.

In the illustration, the non-shaded blocks are exactly the same as those in the block diagram of the normal preamble symbol insertion. Scrambler B(np2040), Carrier Allocation (np2050), IFFT(np2060) and/or Scrambled Guard Insertion (np2070) are added to the block diagram.

For the symbol B, the initial value of the shift register is set by $(R_{14} R_{13} R_{12} R_{11} R_{10} R_9 R_8 R_7 R_6 R_5 R_4 R_3 R_2 R_1 R_0)=(100001000111000)$ to generate the sequence SSS_B. The scrambled modulation of the symbol B is given by:

$$MS\_SCR\_B = SCRAMBLING_B(MS\_DIFF) \quad \text{[Math Figure 33]}$$

$$MS\_SCR\_B_i = MS\_DIFF_i X2\left(\frac{1}{2} - SSS\_B_i\right) \quad \text{[Math Figure 34]}$$

The sequence MS_SCR_B is applied to the active carriers of the symbol B.

The distribution of the active carriers of symbol B is the same as that of symbol A of the normal preamble.

The symbol B is generated by modulating each carrier according to the following expression:

$$p_B(t) = \frac{1}{\sqrt{384}} \sum_{i=0}^{383} MS\_SCR\_B_i X e^{j2\pi \frac{k_p(i)-512}{1024T}t} \quad \text{[Math Figure 35]}$$

where MS_SCR_B$_i$ for i=0,1, . . . ,383 are the modulation values for the active carriers.

The signal $p_{SB}(t)$ of part SB is given by scrambling A(i) with the sequence gss(t), which is same as that used in the normal preamble:

$$p_{SB}(t)=p_B(t)*gss(t) \quad \text{[Math Figure 36]}$$

The time-domain baseband waveform $p_{pre\_r}(t)$ of the robust preamble symbol is therefore defined as follows:

$$p_{pre\_i}(t) = \begin{cases} p_{SA}(t) & 0 \le t < 1024T \\ p_A(t) & 1024T \le t < 2048T \\ p_{SB}(t) & 2048T \le t < 3072T \\ p_B(t) & 3072T \le t < 4096T \\ 0 & \text{otherwise} \end{cases} \quad \text{[Math Figure 37]}$$

$p_{pre\_r}(i)$ is multiplexed with the input v(t) of the preamble insertion block, to produce the final output t) as shown in the illustration.

FIG. 41 illustrates a method of transmitting broadcast signal according to an embodiment of the present invention.

The method includes encoding DP data, building at least one signal frame and/or modulating data by an OFDM method & transmitting broadcast signals.

In step of encoding DP data, the above-described BICM module may encode each data pipe (DP) according to a code rate. The step of encoding DP data can include LDPC encoding, Bit interleaving and/or mapping onto constellations.

The step of LDPC (Low-Density Parity-Check) encoding corresponds to above-described LDPC encoding. The LDPC encoding is performed on the DP data by using addresses of a parity check matrix and length of a LDPC codeword. The addresses of the parity check matrix indicates addresses of parity bits to be calculated, and the addresses of the parity check matrix is defined according to the code rate.

The step of Bit interleaving corresponds to above-described Bit interleaving by the Bit interleaver. The Bit interleaving is performed on the LDPC encoded DP data.

The step of mapping onto constellations corresponds to above-described constellation mapping by the constellation mapper. The mapping onto constellation is performed on the bit interleaved DP data.

The step of building at least one signal frame corresponds to above-described frame building. The building signal frame is performed on the encoded DP data.

The step of modulating data by an OFDM method & transmitting broadcast signals corresponds to above-described OFDM generation process. The built signal frame is being modulated by OFDM method, and the broadcast signals having the modulated data are being transmitted.

In this embodiment, the signal frame includes a preamble, and the preamble includes guard interval.

In a method of transmitting broadcast signal according to other embodiment of the present invention, the code rate is 5/15, and the length of the LDPC codeword is 16200 bits.

In a method of transmitting broadcast signal according to another embodiment of the present invention, the parity check matrix includes an information part corresponding to information bits of the LDPC codeword and a parity part corresponding to the parity bits of the LDPC codeword. The addresses of the parity check matrix is expressed as follows.

TABLE 35

148 405 572 631 716 1011 1986 2082 2224 2411 2479 2637 2722 3335
3480 3766 4300 4790 6257 7854 8288 8748 8999 9309 9643 9683 10105
10424 10683 10777 214 235 381 1767 2687 2906 3131 4065 4180 4802
4882 4968 5178 5285 5924 6129 6518 6538 6673 6863 7049 7392 7413
7741 7910 7980 8256 8874 9967 10279 554 1116 1325 1384 1667 1695
1979 1987 2673 3655 3798 4373 5386 6084 6090 6101 6118 6589 6643
7482 7501 7556 7660 7850 7892 9309 9322 9681 10287 10508
2514 4003 8048 8566
1509 1692 7607 10372
1965 2750 8336 10086
4775 8026 8518 10330

TABLE 35-continued

```
1238 2374 3882 7500
1289 2390 3624 5591
991 1362 3116 3828
2370 6079 6614 10227
7193 7622 8895
3073 9275 9951
2688 3419 7057
1451 3535 8523
```

In the above expression, each row represents a first information bit in each group of 360 information bits, and each value corresponding to the each row represents the addresses of the parity bits to be calculated.

In a method of transmitting broadcast signal according to another embodiment of the present invention, each of first to third rows has 30 addresses of the parity bits, each of fourth to eleventh rows has 4 addresses of the parity bits, and each of twelfth to fifteenth rows has 3 addresses of the parity bits.

In a method of transmitting broadcast signal according to another embodiment of the present invention, the method further includes a step of generating a preamble symbol. The step of generating a preamble symbol corresponds to above-described preamble symbol generating process. The preamble symbol is generated by repeating at least one signaling information. The above-described preamble includes the generated preamble symbol In a method of transmitting broadcast signal according to another embodiment of the present invention, the method further includes steps of generating the guard interval and generating the preamble. The step of generating the guard interval corresponds to above-described guard interval generating process. The guard interval is generated by using at least one sequence and the preamble symbol. The sequence may correspond to above-described scrambling sequence. The step of generating the preamble corresponds to above-described preamble generating process. The preamble is generated by combining the generated guard interval and the preamble symbol.

The method of transmitting broadcast signal according to an embodiment of the present invention can be implemented in an apparatus.

The apparatus includes an encoding module, a frame building module, a modulating module and/or a transmitting module.

The encoding module is configured to encode Data Pipe, DP, data according to a code rate. The encoding module corresponds to above-described BICM module. The encoding may represents the encoding by the above-described BICM module. The encoding module can include a LDPC encoding module, a Bit interleaving module and/or a mapping module.

The LDPC (Low-Density Parity-Check) encoding module is configured to LDPC encode the DP data using addresses of a parity check matrix and length of a LDPC codeword. The LDPC encoding corresponds to above-described LDPC encoding. The addresses of the parity check matrix indicates addresses of parity bits to be calculated, and the addresses of the parity check matrix is defined according to the code rate.

The Bit interleaving module is configured to bit interleave the LDPC encoded DP data. The Bit interleaving corresponds to above-described Bit interleaving by the Bit interleaver.

The mapping module is configured to map the bit interleaved DP data onto constellations. The mapping onto constellations corresponds to above-described constellation mapping by the constellation mapper.

The frame building module is configured to build at least one signal frame by mapping the encoded DP data. The building at least one signal frame corresponds to above-described frame building.

The modulating module is configured to modulate data in the built signal frame by an Orthogonal Frequency Division Multiplexing, OFDM, method. The modulating data corresponds to above-described OFDM generation process.

The transmitting module is configured to transmit the broadcast signals having the modulated data. The transmitting broadcast signals corresponds to above-described OFDM generation process.

In this embodiment, the signal frame includes a preamble, and the preamble includes guard interval. In an apparatus for transmitting broadcast signal according to other embodiment of the present invention, the code rate is 5/15, and the length of the LDPC codeword is 16200 bits.

In an apparatus for transmitting broadcast signal according to another embodiment of the present invention, the parity check matrix includes an information part corresponding to information bits of the LDPC codeword and a parity part corresponding to the parity bits of the LDPC codeword. The addresses of the parity check matrix is expressed as follows.

TABLE 36

```
148 405 572 631 716 1011 1986 2082 2224 2411 2479 2637 2722 3335
3480 3766 4300 4790 6257 7854 8288 8748 8999 9309 9643 9683 10105
10424 10683 10777 214 235 381 1767 2687 2906 3131 4065 4180 4802
4882 4968 5178 5285 5924 6129 6518 6538 6873 6803 7049 7392 7413
7741 7910 7980 8256 8874 9967 10279 554 1116 1325 1384 1667 1695
1979 1987 2673 3655 3798 4373 5386 6084 6090 6101 6118 6589 6643
7482 7501 7556 7660 7850 7892 9309 9322 9681 10287 10508
2514 4003 8048 8566
1509 1592 7607 10372
1965 2750 8336 10066
4775 9026 8518 10330
1238 2374 3862 7500
1289 2390 3624 5591
991 1362 3116 3826
2370 6079 6614 10227
7193 7822 8895
3073 9275 9951
2688 3419 7057
1451 3535 8523
```

In the above expression, each row represents a first information bit in each group of 360 Information bits, and each value corresponding to the each row represents the addresses of the parity bits to be calculated.

In an apparatus for transmitting broadcast signal according to another embodiment of the present invention, each of first to third rows has 30 addresses of the parity bits, each of fourth to eleventh rows has 4 addresses of the parity bits, and each of twelfth to fifteenth rows has 3 addresses of the parity bits.

In an apparatus for transmitting broadcast signal according to another embodiment of the present invention, the apparatus further includes a preamble generating module configured to repeat at least one signaling information to generate a preamble symbol. The above-described preamble includes the generated preamble symbol.

In an apparatus for transmitting broadcast signal according to another embodiment of the present invention, the preamble generating module is further configured to generate the guard interval using at least one sequence and the preamble symbol, and to generate the preamble by combining the guard interval and the preamble symbol. The generating the guard interval corresponds to above-described guard interval generating process. The sequence may correspond to above-described scrambling sequence. The generating the preamble corresponds to above-described preamble generating process.

In each DP, the TI memory stores the input XFEC-BLOCKs (output XFECBLOCKs from the SSD/MIMO encoding block). Assume that input XFECBLOCKs are defined as $$(d_{n,s,0,0}, d_{n,s,0,1}, \ldots, d_{n,s,0,N_{cells}-1}, d_{n,s,1,0}, \ldots, d_{n,s,1,N_{cells}-1},$$
$$\ldots, d_{n,s,N_{xBLOCK\_TI}(n,s)-1,0}, \ldots, d_{n,s,N_{xBLOCK\_TI}(n,s)-1,N_{cells}-1}),$$

where $d_{n,s,r,q}$ is the qth cell of the rth XFECBLOCK in the sth TI block of the nth TI group and represents the outputs of SSD and MIMO encodings as follows.

$$d_{n,s,r,q} = \begin{cases} f_{n,s,r,q}, & \text{the output of SSD ... encoding} \\ g_{n,s,r,q}, & \text{the output of MIMO encoding} \end{cases}.$$

In addition, assume that output XFECBLOCKs from the time interleaver are defined as $$(h_{n,s,0}, h_{n,s,1}, \ldots, h_{n,s,i}, \ldots, h_{n,s,N_{xBLOCK\_TI}(n,s) \times N_{cells}-1}),$$

where $h_{n,s,i}$ is the ith output cell (for $i=0, \ldots, N_{xBLOCK\_TI}(n,s) \times N_{cells}-1$) in the sth TI block of the nth TI group.

Typically, the time interleaver will also act as a buffer for DP data prior to the process of frame building. This is achieved by means of two memory banks for each DP. The first TI-block is written to the first bank. The second TI-block is written to the second bank while the first bank is being read from and so on.

The TI is a twisted row-column block interleaver. For the sth TI block of the nth TI group, the number of rows $N_r$ of a TI memory is equal to the number of cells $N_{cells}$, i.e., $N_r = N_{cells}$ while the number of columns $N_c$ is equal to the number $N_{xBLOCK\_TI}(n,s)$.

FIG. 42 illustrates the basic operation of a twisted row-column block interleaver according to an embodiment of the present invention.

shows a writing operation in the time interleaver and (b) shows a reading operation in the time interleaver The first XFECBLOCK is written column-wise into the first column of the TI memory, and the second XFECBLOCK is written into the next column, and so on as shown in (a). Then, in the interleaving array, cells are read out diagonal-wise. During diagonal-wise reading from the first row (rightwards along the row beginning with the left-most column) to the last row, $N_r$ cells are read out as shown in (b). In detail, assuming $z_{n,s,i}(i=0, \ldots, N_rN_c)$ as the TI memory cell position to be read sequentially, the reading process in such an interleaving array is performed by calculating the row index $R_{n,s,i}$, the column index $C_{n,s,i}$ and the associated twisting parameter $T_{n,s,i}$ as follows expression.

$$\text{GENERATE } (R_{n,s,i}, C_{n,s,i}) = \qquad \text{[Math Figure 38]}$$
$$\{$$
$$R_{n,s,i} = \text{mod}(i, N_r),$$
$$T_{n,s,i} = \text{mod}(S_{shift} \times R_{n,s,i}, N_c),$$
$$C_{n,s,i} = \text{mod}\left(T_{n,s,i} + \left\lfloor \frac{i}{N_r} \right\rfloor, N_c\right)$$
$$\}$$

where $S_{shift}$ is a common shift value for the diagonal-wise reading process regardless of $N_{xBLOCK\_TI}(n,s)$, and it is determined by $N_{xBLOCK\_TI\_MAX}$ given in the PLS2-STAT as follows expression.

[Math Figure 39]

for
$$\begin{cases} N'_{xBLOCK\_TI\_MAX} = N_{xBLOCK\_TI\_MAX} + 1, & \text{if } N_{xBLOCK\_TI\_MAX} \bmod 2 = 0 \\ N'_{xBLOCK\_TI\_MAX} = N_{xBLOCK\_TI\_MAX}, & \text{if } N_{xBLOCK\_TI\_MAX} \bmod 2 = 1 \end{cases},$$

$$S_{shift} = \frac{N'_{xBLOCK\_TI\_MAX} - 1}{2}$$

As a result, the cell positions to be read are calculated by a coordinate as $z_{n,s,i} = N_r C_{n,s,i} + R_{n,s,i}$.

Figure 43:
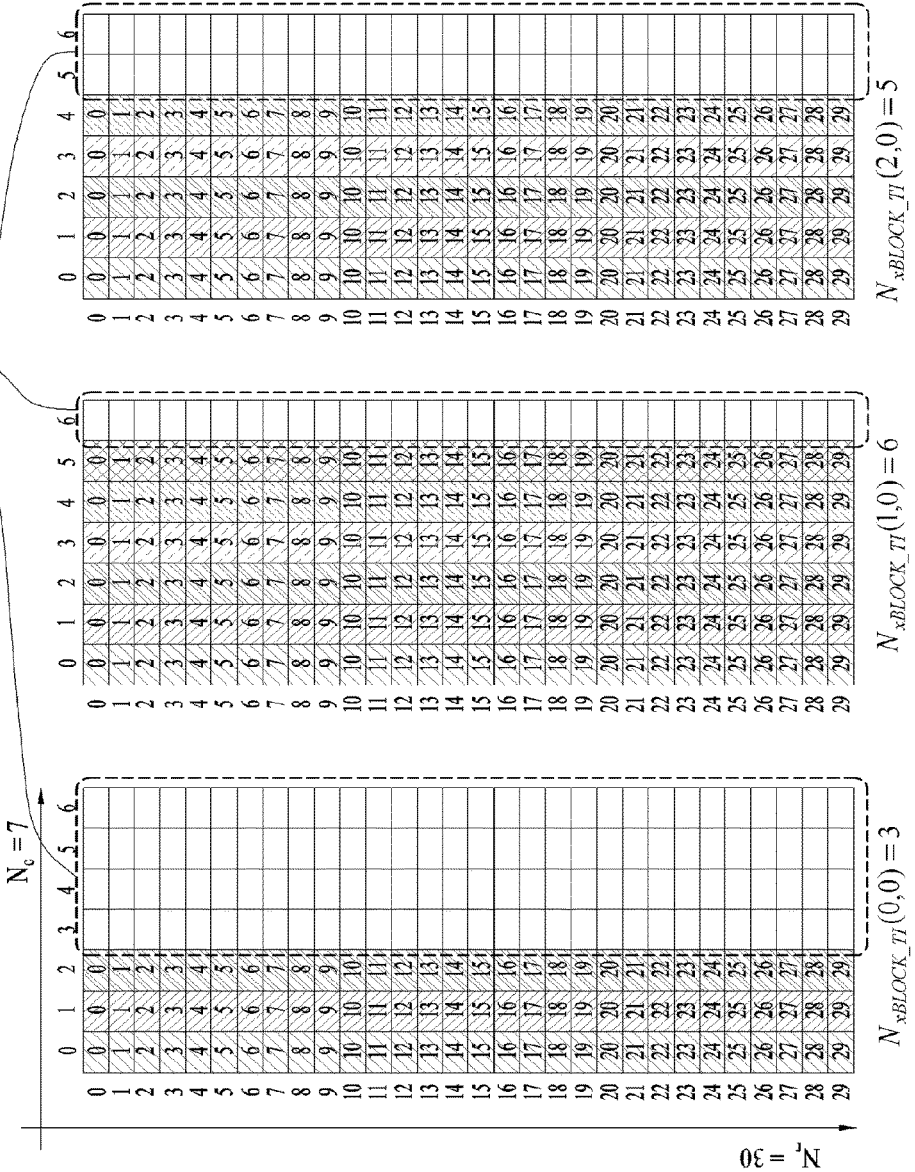
FIG. 43 illustrates an operation of a twisted row-column block interleaver according to another embodiment of the present invention.

FIG. 43 illustrates an operation of a twisted row-column block interleaver according to another embodiment of the present invention.

More specifically, FIG. 43 illustrates the interleaving array in the TI memory for each TI group, including virtual XFECBLOCKs when $N_{xBLOCK\_TI}(0,0)=3$, $N_{xBLOCK\_TI}(1,0)=6$, $N_{xBLOCK\_TI}(2,0)=5$ The variable number $N_{xBLOCK\_TI}(n,s)=N_r$ will be less than or equal to $N'_{xBLOCK\_TI\_MAX}$. Thus, in order to achieve a single-memory delnterleaving at the receiver side, regardless of $N_{xBLOCK\_TI}(n,s)$, the interleaving array for use in a twisted row-column block interleaver is set to the size of $N_r \times N_c = N_{cells} \times N'_{xBLOCK\_TI\_MAX}$ by inserting the virtual XFECBLOCKs into the TI memory and the reading process is accomplished as follow expression.

[Math FIG. 40]

```
p = 0;
for i = 0; i < N_cells N'_xBLOCK_TI_MAX; i = i + 1
{GENERATE (R_n,s,i, C_n,s,i);
V_i = N_r C_n,s,j + R_n,s,j
  if V_i < N_cells N_xBLOCK_TI(n,s)
  {
    Z_n,s,p = V_i; p = p + 1;
  }
}
```

The number of TI groups is set to 3. The option of time interleaver is signaled in the PLS2-STAT data by DP_TI_TYPE='0', DP_FRAME_INTERVAL='1', and DP_TI_LENGTH='1', i.e., $N_{TI}=1$, $I_{JUMP}=1$, and $P_I=1$. The number of XFECBLOCKs, each of which has $N_{cells}=30$ cells, per TI group is signaled in the PLS2-DYN data by $N_{xBLOCK\_TI}(0,0)=3$, $N_{xBLOCK\_TI}(1,0)=6$, and $N_{xBLOCK\_TI}(2,0)=5$, respectively. The maximum number of XFECBLOCK is signaled in the PLS2-STAT data by $N_{xBLOCK\_Group\_MAX}$, which leads to $\lfloor N_{xBLOCK\_Group\_MAX}/N_{TI} \rfloor = N_{xBLOCK\_TI\_MAX}=6$.

Figure 44:
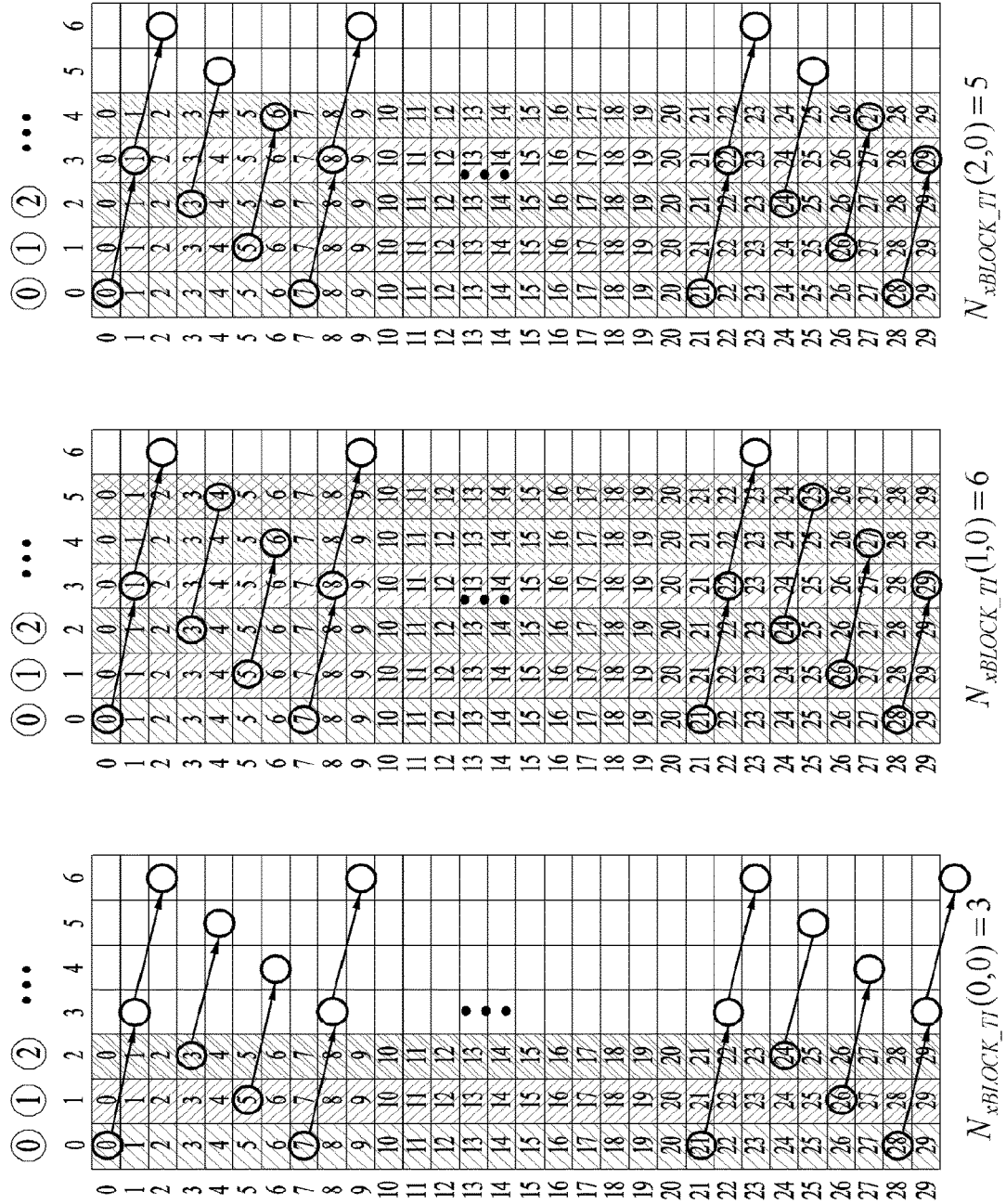
FIG. 44 illustrates a diagonal-wise reading pattern of a twisted row-column block interleaver according to an embodiment of the present invention.

FIG. 44 illustrates a diagonal-wise reading pattern of a twisted row-column block interleaver according to an embodiment of the present invention.

More specifically FIG. 44 shows a diagonal-wise reading pattern from each interleaving array with parameters of $N'_{xBLOCK\_TI\_MAX}=7$ and $S_{shift}=(7-1)/2=3$. Note that in the reading process shown as pseudocode above, if $V_i \geq N_{cells} N_{xBLOCK\_TI}(n,s)$, the value of $V_i$ is skipped and the next calculated value of $V_i$ is used.

FIG. 45 illustrates interleaved XFECBLOCKs from each interleaving array according to an embodiment of the present invention.

FIG. 45 illustrates the Interleaved XFECBLOCKs from each interleaving array with parameters of $N'_{xBLOCK\_TI\_MAX}=7$ and $S_{shift}=3$.

Another embodiments of the present invention will be described below. These embodiments are based on each code rate. Each embodiments are based on a codeword length of 16200. For each embodiments, the $H_1$ matrixes, $H_2$ matrixes and degree distribution tables will be described. Each of the $H_1$ matrixes, $H_2$ matrixes and degree distribution tables have different values depends on each code rates. But the structures and descriptions are the same as the $H_1$ matrix, $H_2$ matrix and degree distribution table, described above.

One of the embodiments according to a code rate of 5/15 will be described below.

FIG. 46 illustrates one of the embodiments of the $H_1$ matrix according to a code rate of 5/15.

Figure 47:
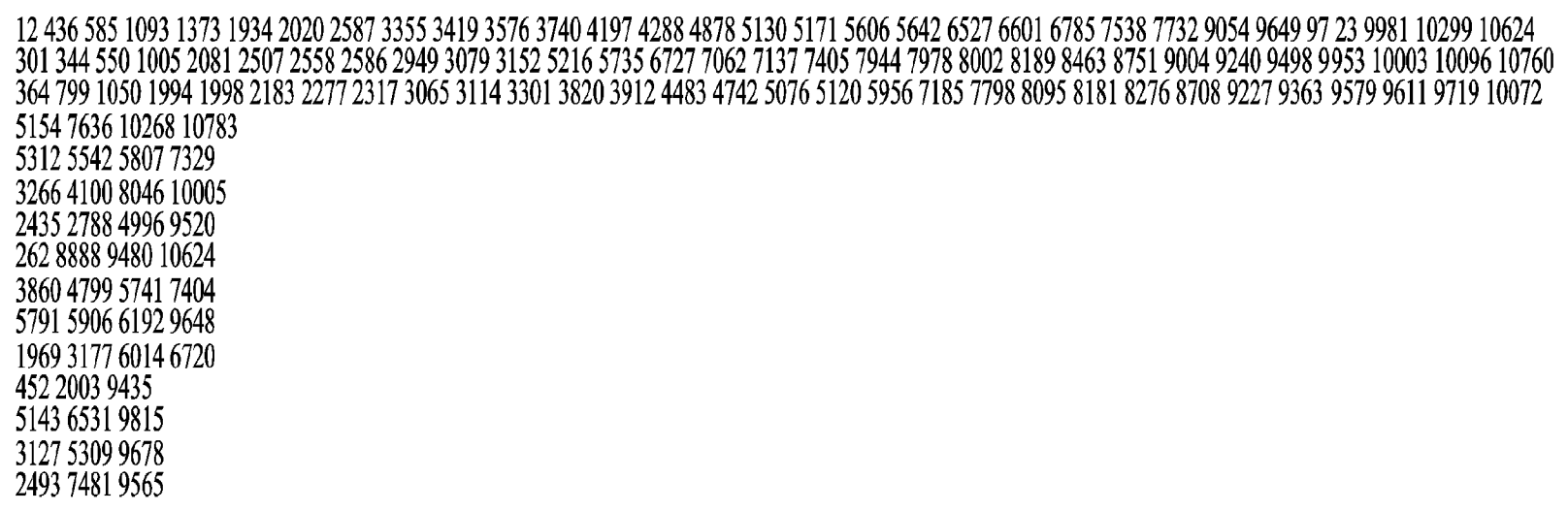

FIG. 47 illustrates one of the embodiments of the $H_2$ matrix according to a code rate of 5/15.

Figures 48, 49:
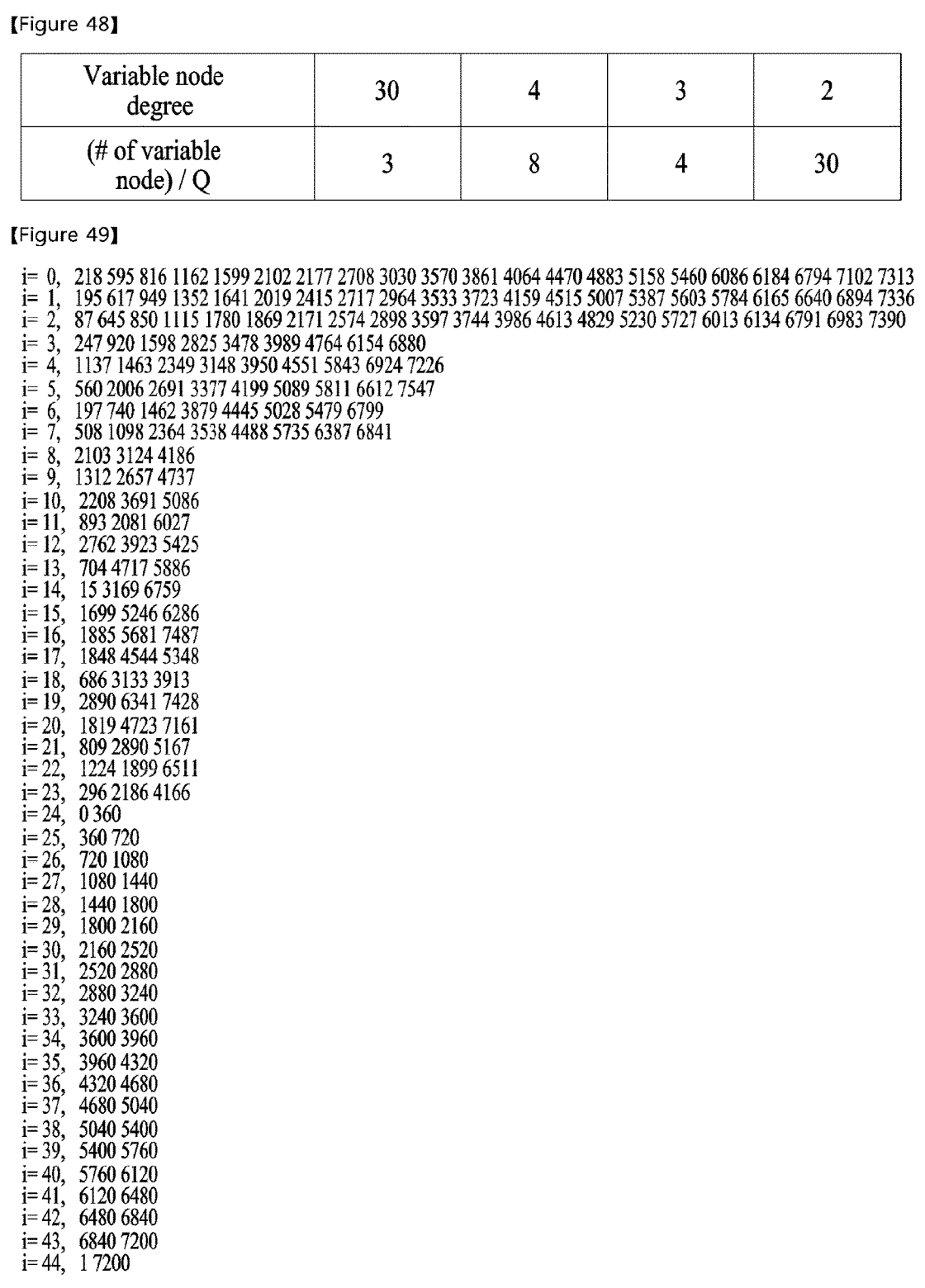

FIG. 48 illustrates one of the embodiments of the degree distribution table according to a code rate of 5/15.

One of the embodiments according to a code rate of 8/15 will be described below.

FIG. 49 illustrates one of the embodiments of the $H_1$ matrix according to a code rate of 8/15.

Figures 50, 51:
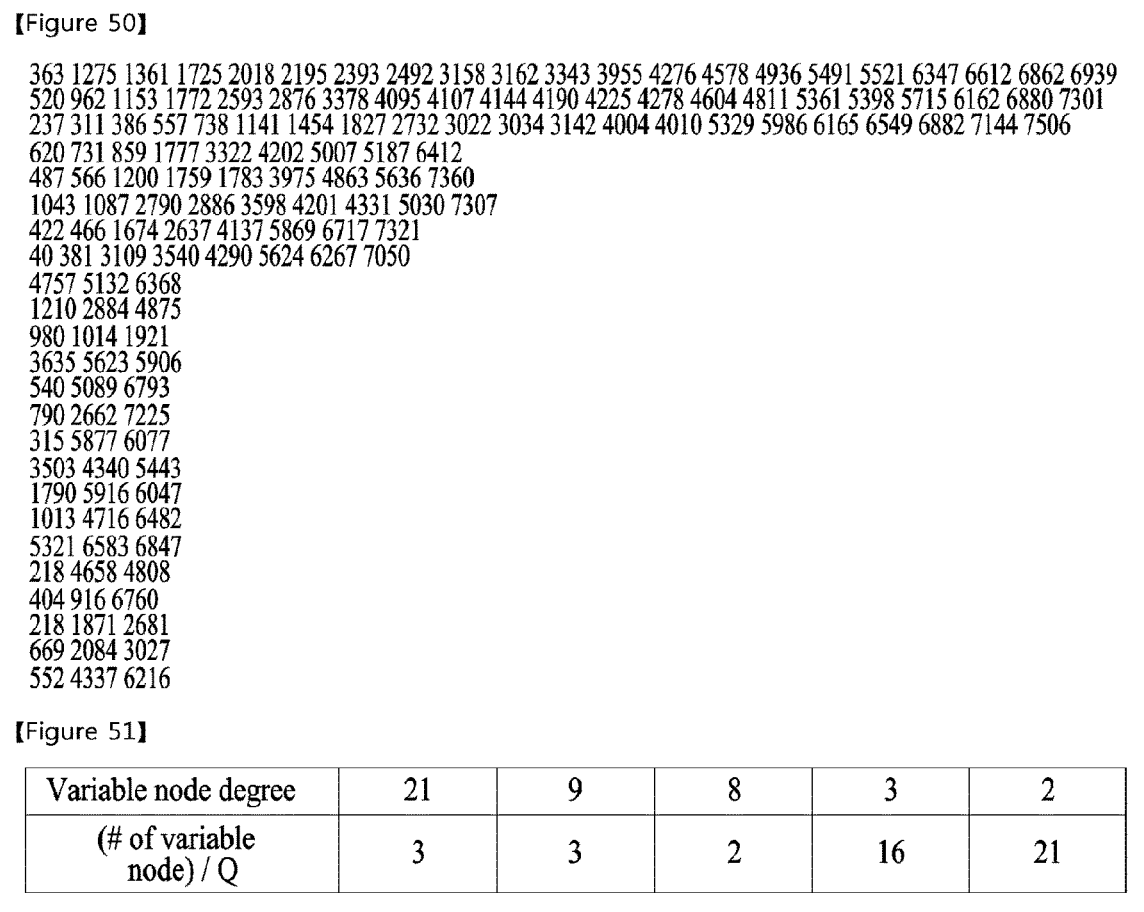

FIG. 50 illustrates one of the embodiments of the $H_2$ matrix according to a code rate of 8/15.

FIG. 51 illustrates one of the embodiments of the degree distribution table according to a code rate of 8/15.

One of the embodiments according to a code rate of 10/15 will be described below.

Figure 52:
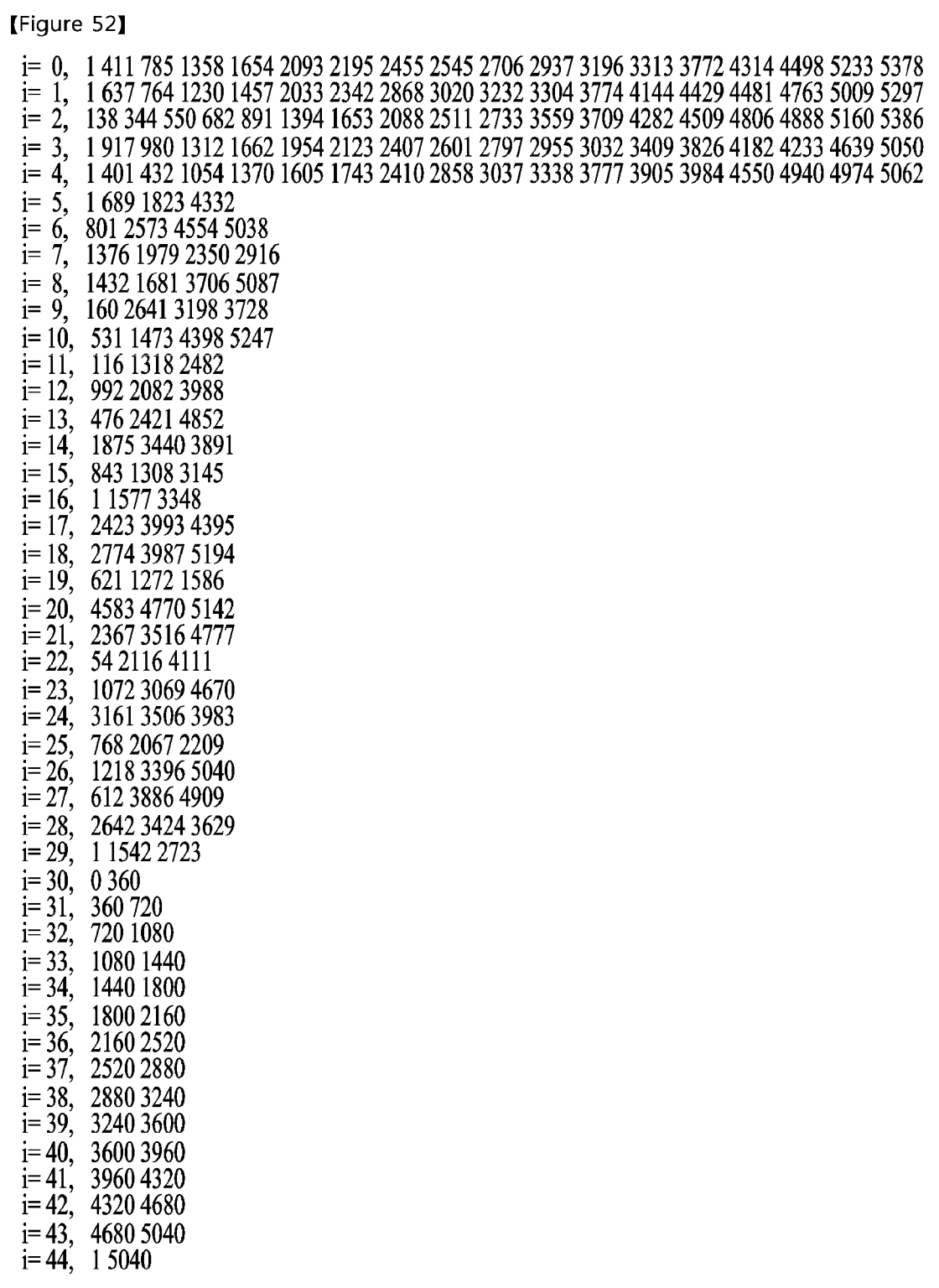

FIG. 52 illustrates one of the embodiments of the $H_1$ matrix according to a code rate of 10/15.

Figures 53, 54:
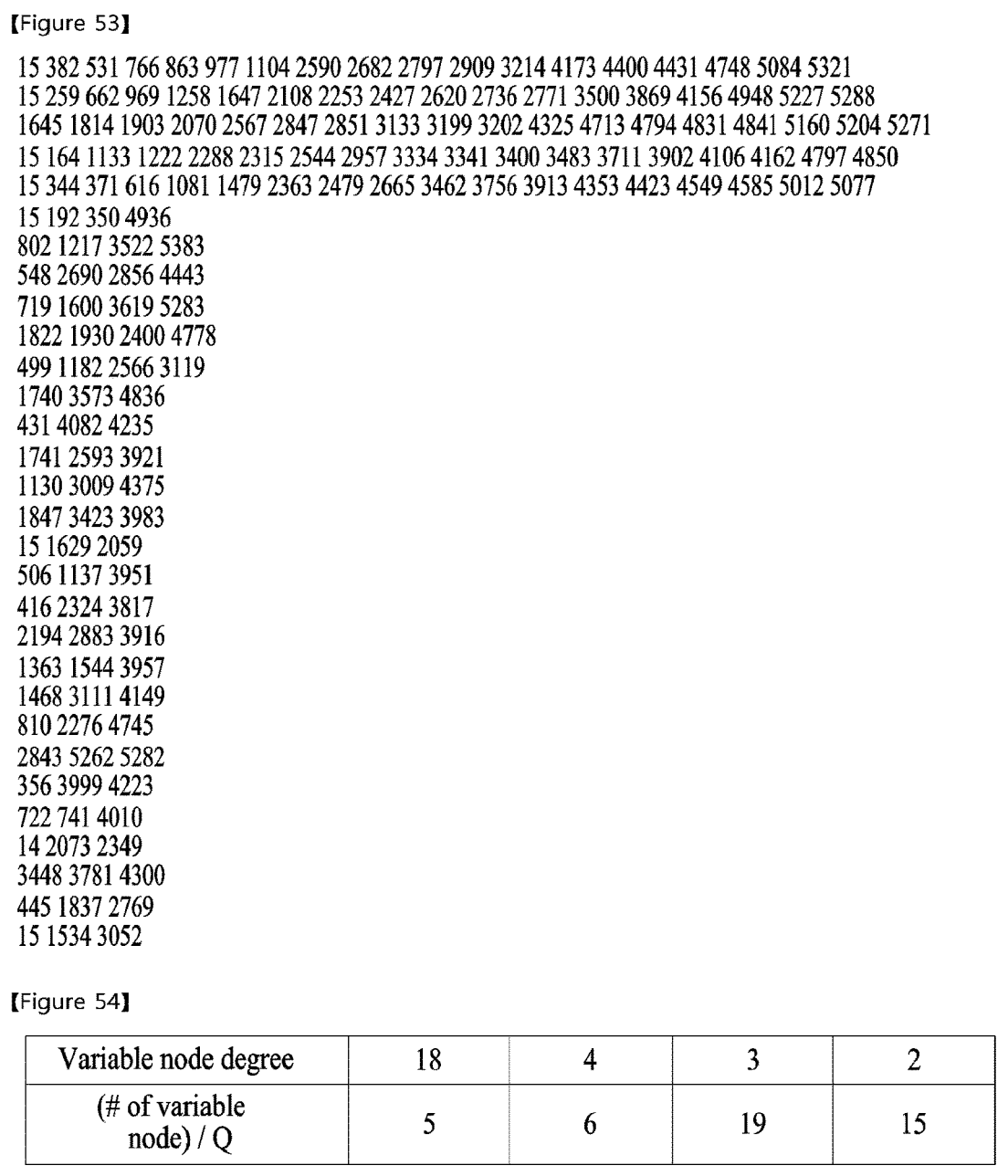

FIG. 53 illustrates one of the embodiments of the $H_2$ matrix according to a code rate of 10/15.

FIG. 54 illustrates one of the embodiments of the degree distribution table according to a code rate of 10/15.

One of the embodiments according to a code rate of 12/15 will be described below.

Figure 55:
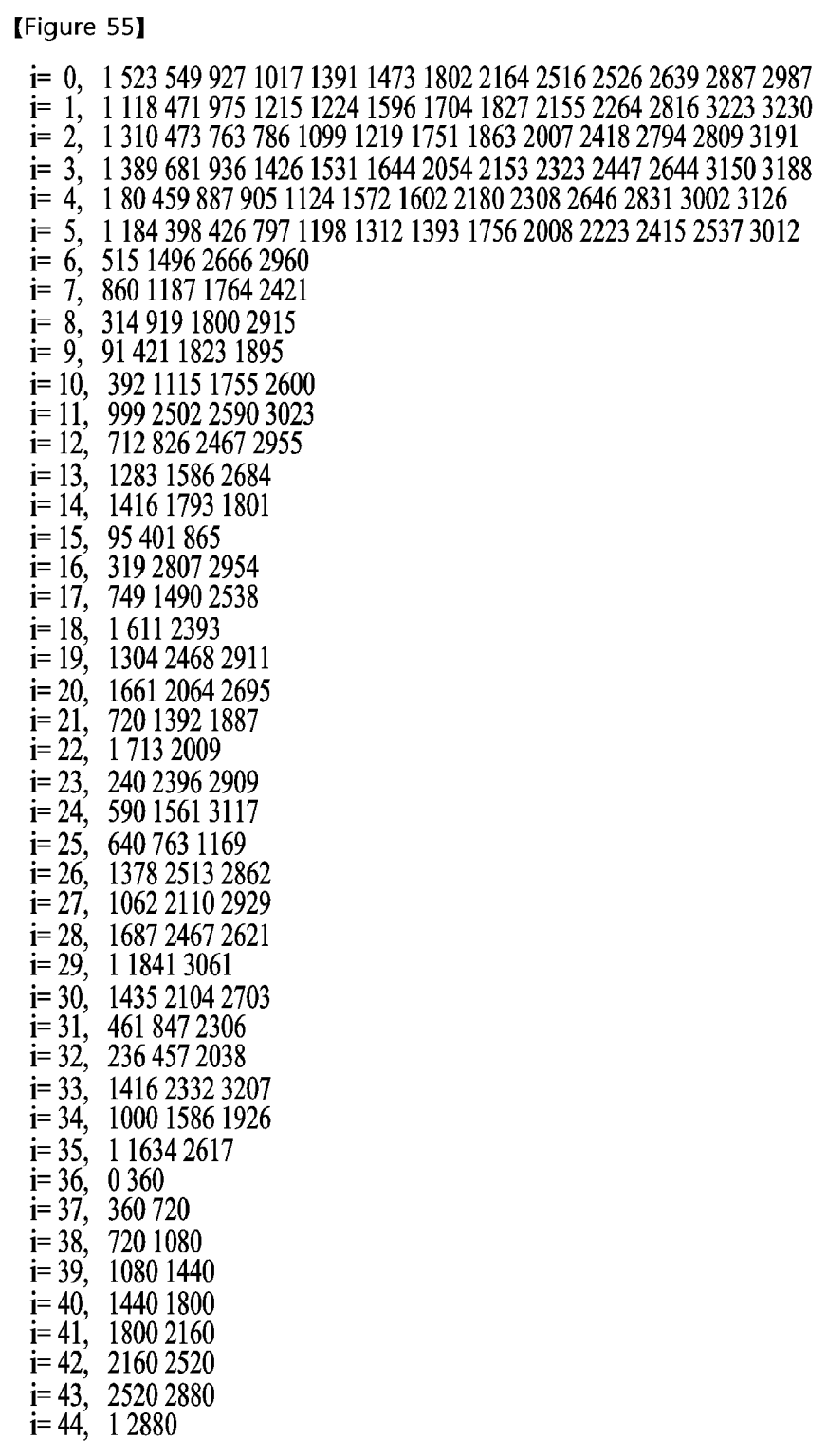

FIG. 55 illustrates one of the embodiments of the $H_1$ matrix according to a code rate of 12/15.

Figures 56, 57:
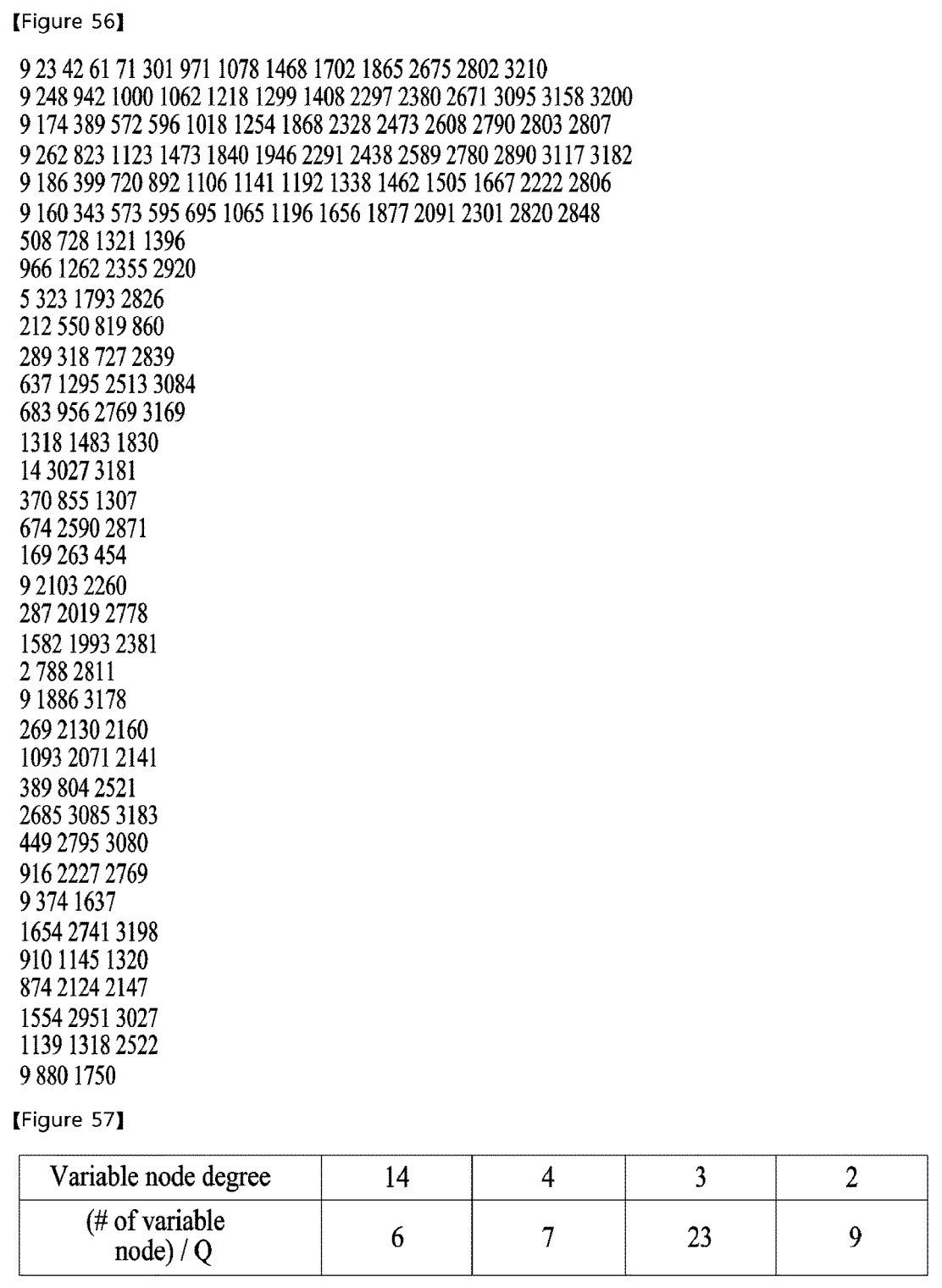

FIG. 56 illustrates one of the embodiments of the $H_2$ matrix according to a code rate of 12/15.

FIG. 57 illustrates one of the embodiments of the degree distribution table according to a code rate of 12/15.

One of the embodiments according to a code rate of 10/15 will be described below.

Figure 58:
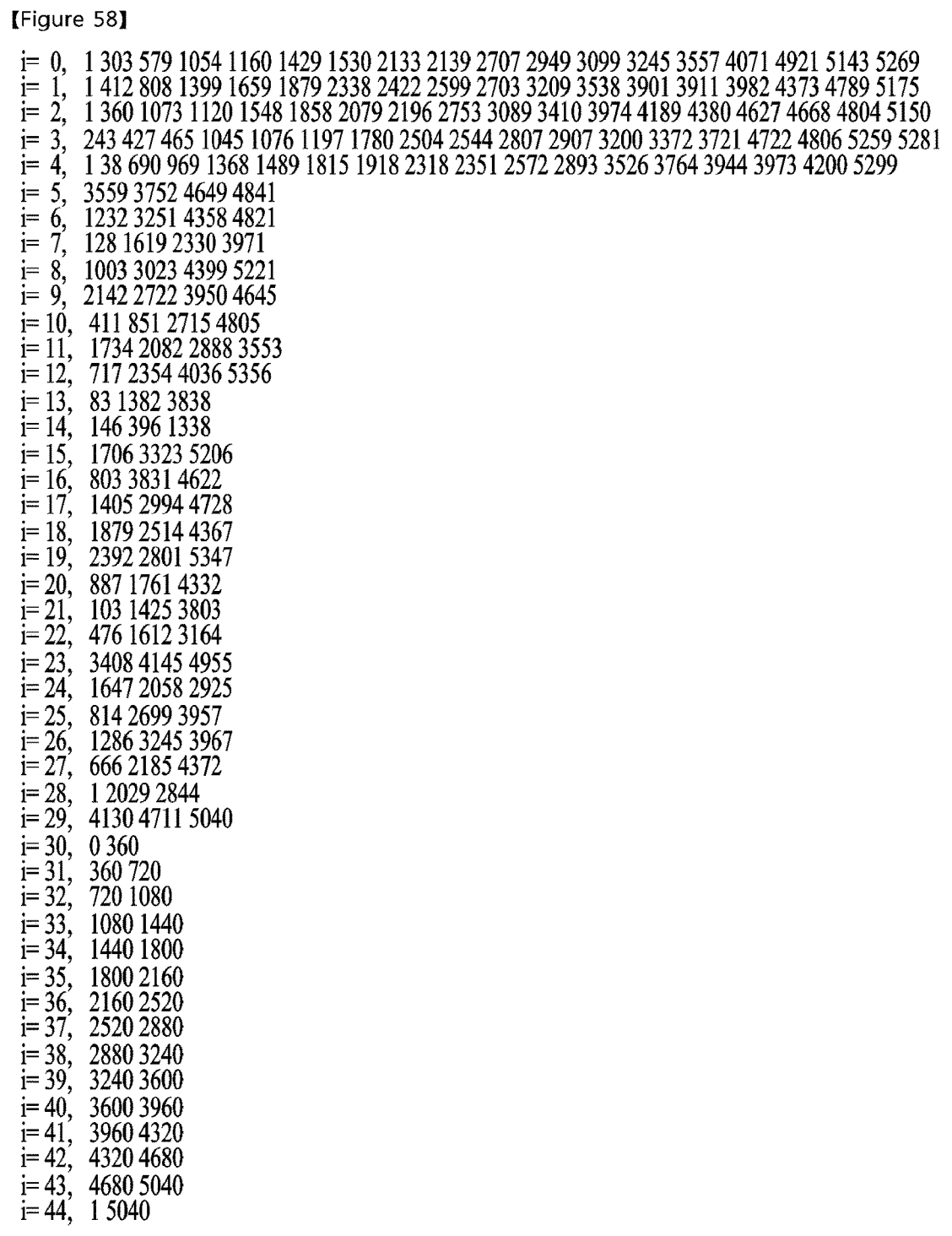

FIG. 58 illustrates one of the embodiments of the $H_1$ matrix according to a code rate of 10/15.

Figures 59, 60:
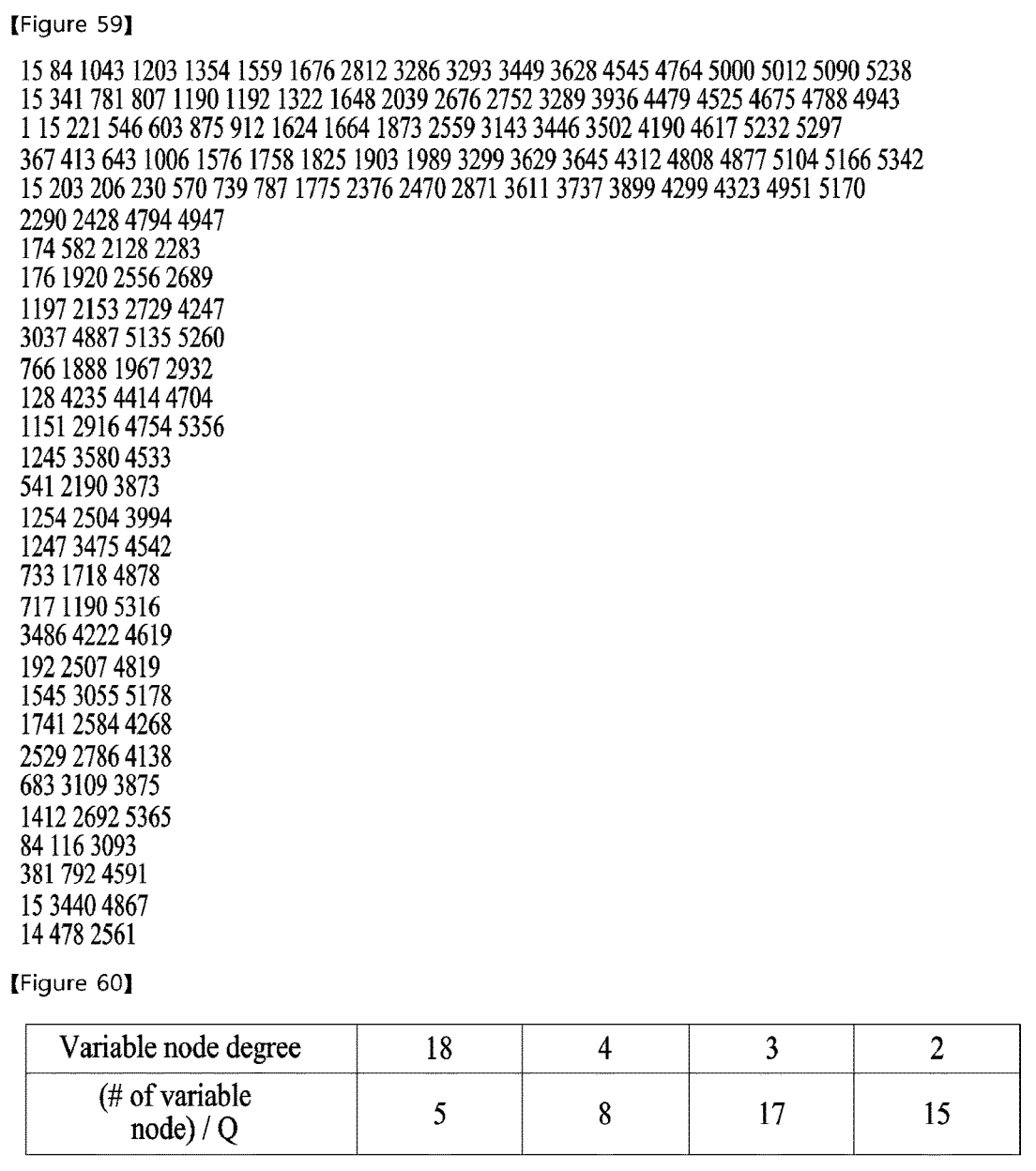

FIG. 59 illustrates one of the embodiments of the $H_2$ matrix according to a code rate of 10/15.

FIG. 60 illustrates one of the embodiments of the degree distribution table according to a code rate of 10/15.

One of the embodiments according to a code rate of 12/15 will be described below.

Figure 61:
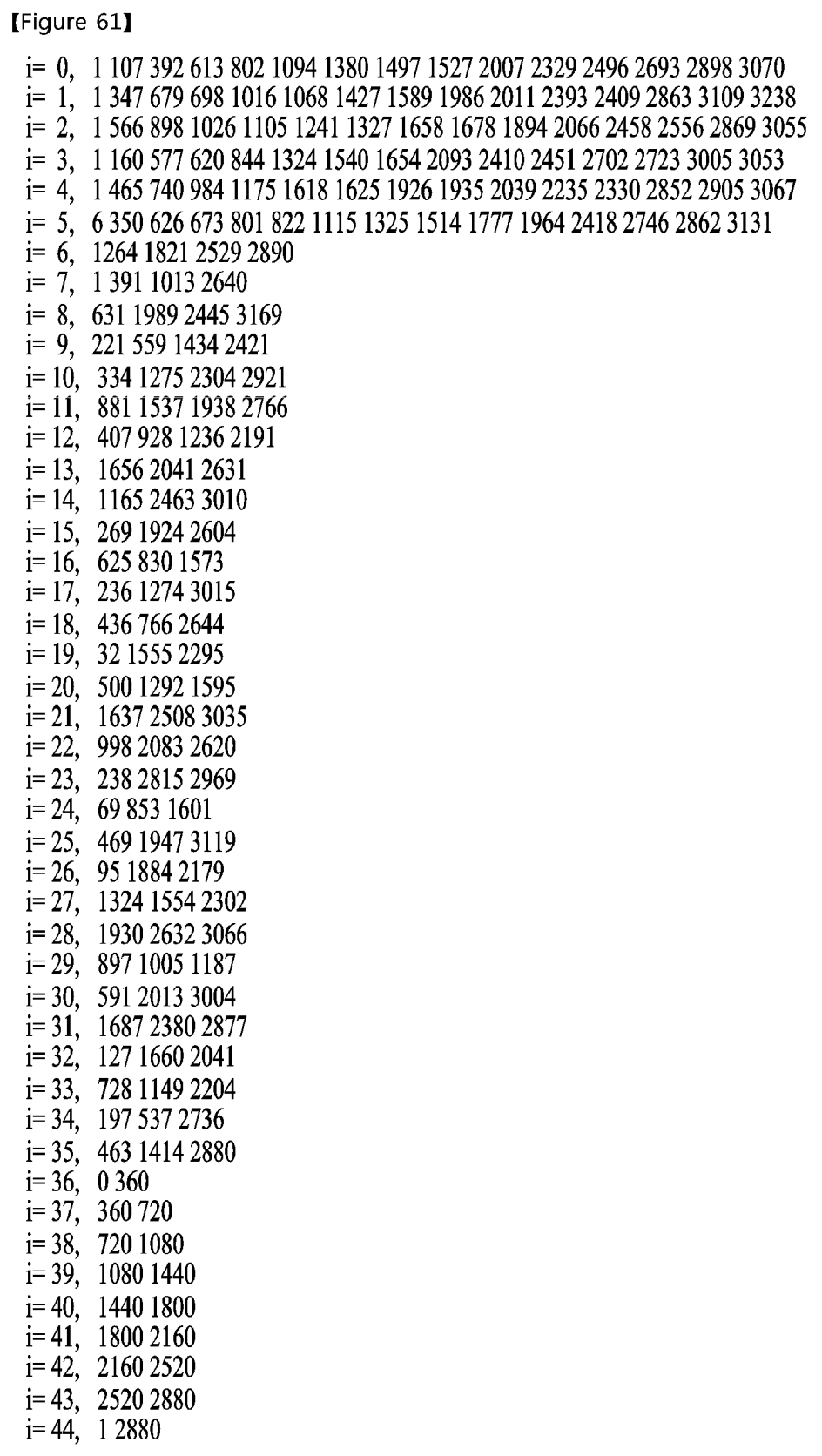

FIG. 61 illustrates one of the embodiments of the $H_1$ matrix according to a code rate of 12/15.

Figures 62, 63:
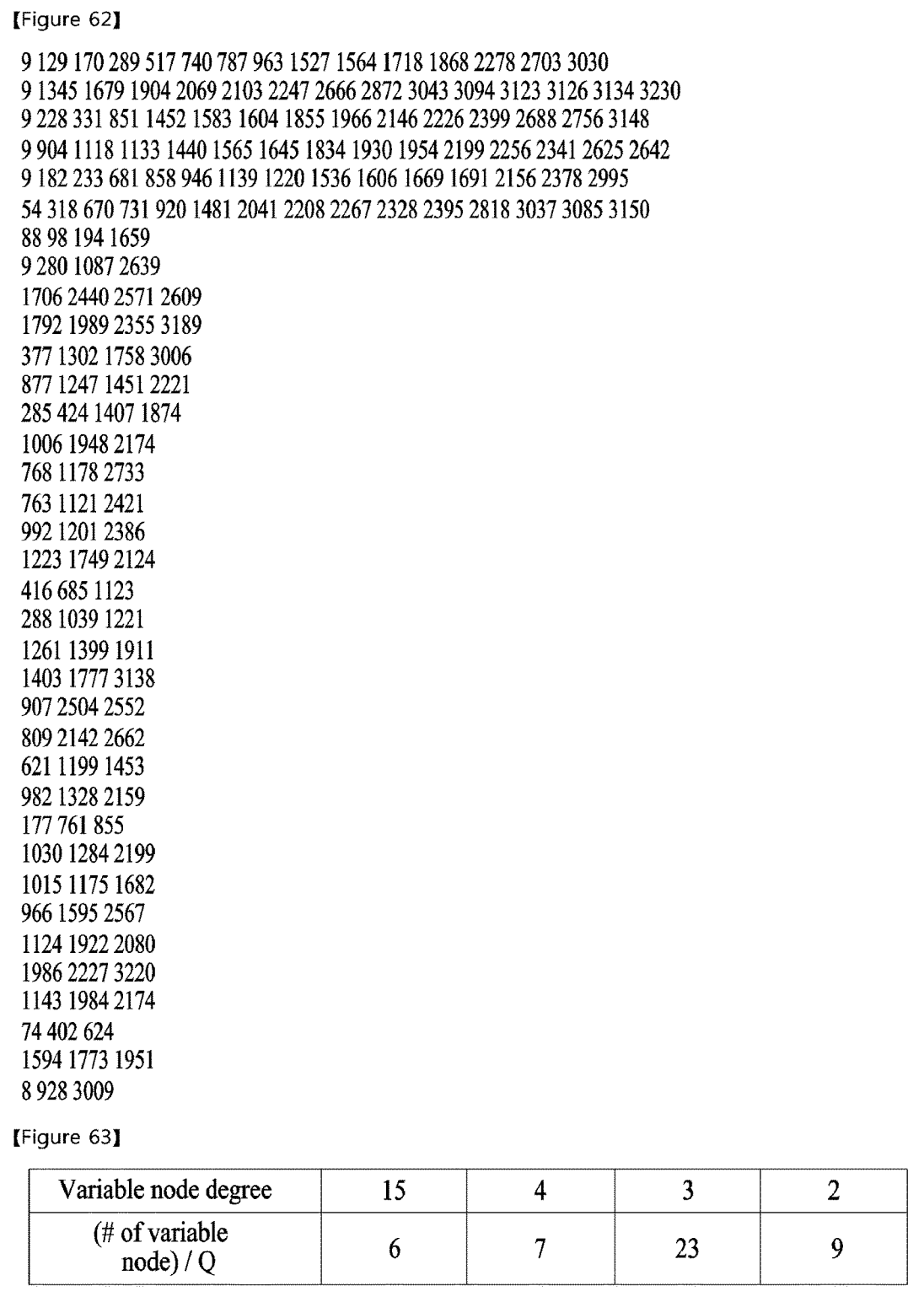

FIG. 62 illustrates one of the embodiments of the $H_2$ matrix according to a code rate of 12/15.

FIG. 63 illustrates one of the embodiments of the degree distribution table according to a code rate of 12/15.

Although the description of the present invention is explained with reference to each of the accompanying drawings for clarity, it is possible to design new embodiment(s) by merging the embodiments shown in the accompanying drawings with each other. And, if a recording medium readable by a computer, in which programs for executing the embodiments mentioned in the foregoing description are recorded, is designed in necessity of those skilled in the art, it may belong to the scope of the appended claims and their equivalents.

An apparatus and method according to the present invention may be non-limited by the configurations and methods of the embodiments mentioned in the foregoing description. And, the embodiments mentioned in the foregoing description can be configured in a manner of being selectively combined with one another entirely or in part to enable various modifications.

In addition, a method according to the present invention can be implemented with processor-readable codes in a processor-readable recording medium provided to a network device. The processor-readable medium may include all kinds of recording devices capable of storing data readable by a processor. The processor-readable medium may include one of ROM, RAM, CD-ROM, magnetic tapes, floppy discs, optical data storage devices, and the like for example and also include such a carrier-wave type implementation as a transmission via Internet. Furthermore, as the processor-readable recording medium is distributed to a computer system connected via network, processor-readable codes can be saved and executed according to a distributive system.

It will be appreciated by those skilled in the art that various modifications and variations can be made in the present invention without departing from the spirit or scope of the inventions. Thus, it is intended that the present invention covers the modifications and variations of this invention provided they come within the scope of the appended claims and their equivalents.

Both apparatus and method inventions are mentioned in this specification and descriptions of both of the apparatus and method inventions may be complementarily applicable to each other.

MODE FOR INVENTION

Various embodiments have been described in the best mode for carrying out the invention.

INDUSTRIAL APPLICABILITY

The present invention is available in a series of broadcast signal provision fields.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A method for transmitting broadcast signals, the method comprising:
   encoding service data corresponding to a plurality of Physical Layer Pipes;
   encoding signaling data;
   interleaving the encoded signaling data;

demultiplexing the interleaved signaling data by a cyclical shifting scheme according to bit group index, wherein the cyclical shifting scheme is performed based on a modulation order;

mapping the demultiplexed signaling data to constellations;

building at least one signal frame including the encoded service data and the mapped signaling data;

modulating data of the at least one signal frame by an Orthogonal Frequency Division Multiplex (OFDM) scheme; and transmitting the broadcast signals carrying the modulated data of the at least one signal frame.

2. The method of claim 1, wherein the encoding step for the signaling data includes:

first encoding the signaling data;

zero padding the first encoded signaling data; and second encoding the zero padded signaling data.

3. An apparatus for transmitting broadcast signals, the apparatus comprising:

a first encoder to encode service data corresponding to a plurality of Physical Layer Pipes;

a second encoder to encode signaling data;

an interleaver to interleave the encoded signaling data;

a demultiplexer to demultiplex the interleaved signaling data by a cyclical shifting scheme according to bit group index, wherein the cyclical shifting scheme is performed based on a modulation order;

a mapper to map the demultiplexed signaling data to constellations;

a frame builder to build at least one signal frame including the encoded service data and the mapped signaling data;

a modulator to modulate data of the at least one signal frame by an Orthogonal Frequency Division Multiplex (OFDM) scheme; and a transmitter to transmit the broadcast signals carrying the modulated data of the at least one signal frame.

4. The apparatus of claim 3, further comprising:

a zero inserter to zero pad the encoded signaling data; and a third encoder to encode the zero padded signaling data.

5. An apparatus for receiving broadcast signals, the apparatus comprising:

a tuner to receive the broadcast signals;

a demodulator to demodulate the received broadcast signals;

a frame parser to parse at least one signal frame in the demodulated broadcast signals, wherein the at least one signal frame includes signaling data and service data;

a demapper to demap the signaling data including bits being demultiplexed by a cyclical shifting scheme according to bit group index and mapped, wherein the cyclical shifting scheme is performed based on a modulation order;

a first decoder to decode the demapped signaling data; and a second decoder to decode the service data.

6. A method for receiving broadcast signals, the method comprising:

receiving the broadcast signals;

demodulating the received broadcast signals;

parsing at least one signal frame in the demodulated broadcast signals, wherein the at least one signal frame includes signaling data and service data;

demapping the signaling data including bits being demultiplexed by a cyclical shifting scheme according to bit group index and mapped, wherein the cyclical shifting scheme is performed based on a modulation order;

decoding the demapped signaling data; and decoding the service data.

* * * * *